United States Patent
Namiki

(10) Patent No.: US 10,547,186 B2
(45) Date of Patent: Jan. 28, 2020

(54) CHARGING APPARATUS

(71) Applicant: Hitachi Koki Co., Ltd., Tokyo (JP)

(72) Inventor: Masaki Namiki, Ibaraki (JP)

(73) Assignee: Koki Holdings Co., Ltd., Tokyo (JP)

( * ) Notice: Subject to any disclaimer, the term of this patent is extended or adjusted under 35 U.S.C. 154(b) by 0 days.

(21) Appl. No.: 15/740,455

(22) PCT Filed: Jun. 2, 2016

(86) PCT No.: PCT/JP2016/066415
§ 371 (c)(1),
(2) Date: Dec. 28, 2017

(87) PCT Pub. No.: WO2017/002519
PCT Pub. Date: Jan. 5, 2017

(65) Prior Publication Data
US 2018/0191183 A1    Jul. 5, 2018

(30) Foreign Application Priority Data

Jun. 30, 2015  (JP) ................ 2015-132218
Jun. 30, 2015  (JP) ................ 2015-132219

(51) Int. Cl.
*H02J 7/04*   (2006.01)
*H02J 7/16*   (2006.01)
(Continued)

(52) U.S. Cl.
CPC .......... *H02J 7/0042* (2013.01); *H02J 7/0013* (2013.01); *H02J 7/0052* (2013.01);
(Continued)

(58) Field of Classification Search
CPC ..................................................... H02J 7/0091
(Continued)

(56) References Cited

U.S. PATENT DOCUMENTS 6,188,202 B1 *  2/2001  Yagi ................. H02J 7/0081
                                                     320/150
6,949,309 B2 *  9/2005  Moores, Jr. ........... B25F 5/008
                                                     320/113
(Continued)

FOREIGN PATENT DOCUMENTS

JP    10-075079 A    3/1998
JP   2002-233063 A   8/2002
(Continued)

OTHER PUBLICATIONS

International Search Report for international application PCT/JP2016/066415 (dated Aug. 16, 2016) 10 pages with translation.
(Continued)

*Primary Examiner* — Yalkew Fantu
(74) *Attorney, Agent, or Firm* — Kilpatrick Townsend & Stockton LLP

(57) ABSTRACT

In order to provide a charging apparatus for efficiently cooling a battery pack, the charging apparatus comprises: a case 2 having a bottom portion, an upper portion opposite to the bottom portion, and a side portion coupling the bottom portion and the upper portion; a plurality of fans 5 and 6 provided in the case, the plurality of fans being arranged along the side portion; and a charging circuit portion 4 provided in the case and configured to charge a battery pack, the charging circuit having a heat-producing element that produces heat in connection with charging of the battery pack 3.

18 Claims, 33 Drawing Sheets

(51) Int. Cl.
  *H02J 7/00*    (2006.01)
  *H05K 7/20*    (2006.01)
  *H01M 10/613*  (2014.01)
  *H01M 10/46*   (2006.01)

(52) U.S. Cl.
  CPC ......... *H05K 7/20145* (2013.01); *H01M 10/46* (2013.01); *H01M 10/613* (2015.04); *H02J 7/0003* (2013.01)

(58) Field of Classification Search
  USPC .......................................................... 320/150
  See application file for complete search history.

(56) References Cited

U.S. PATENT DOCUMENTS

| | | | | |
|---|---|---|---|---|
| 7,733,065 | B2 * | 6/2010 | Yoon ................... | H01M 10/625 |
| | | | | 320/150 |
| 7,884,577 | B2 * | 2/2011 | Tsutsumi ............ | H01M 10/425 |
| | | | | 320/150 |
| 2002/0079866 | A1 * | 6/2002 | Odaohhara ............... | G06F 1/26 |
| | | | | 320/150 |
| 2002/0121880 | A1 | 9/2002 | Yamanaka et al. | |
| 2006/0266510 | A1 | 11/2006 | Nobashi | |
| 2014/0159920 | A1 * | 6/2014 | Furui ........................ | B25F 5/02 |
| | | | | 340/870.07 |
| 2015/0084591 | A1 | 3/2015 | Kishima et al. | |

FOREIGN PATENT DOCUMENTS

| | | | |
|---|---|---|---|
| JP | 2006-330913 | A * | 7/2006 |
| JP | 2006330913 | A | 12/2006 |
| JP | 2008-125249 | A | 5/2008 |
| JP | 2012-074161 | A | 4/2012 |
| JP | 2014-038935 | A | 2/2014 |
| JP | 2015-019535 | A | 1/2015 |

OTHER PUBLICATIONS

International Report on Patentability for application PCT/JP2016/066415 (dated Jan. 2, 2018), 9 pages.
"Hitachi Multifunction Charger Instruction Manual ET 14DM2," pp. 7-8 (no date).
"Complete introduction to thermal design," pp. 154-155 (1997).

* cited by examiner (a)

(b)

| BATTERY TEMPERATURE | CHARGING CURRENT |
|---|---|
| LESS THAN T1 | I1 |
| T1~T2 | I2 |
| T2~T3 | I3 |
| T3~T4 | I4 |
| MORE THAN OR EQUAL TO T4 | I5 |

CHARGING APPARATUS

TECHNICAL FIELD

The present invention relates to a charging apparatus that charges a battery pack constituted by secondary batteries, such as nickel cadmium batteries, nickel metal hydride batteries, or lithium ion batteries.

BACKGROUND ART

Conventionally, battery packs have been used as power supplies for, for example, electric tools. The battery packs are charged by a dedicated charging apparatus. The battery packs used for electric tools have a large battery capacity and a high discharge voltage. In addition, the capacity of the battery packs has been increasing in recent years. To charge the battery packs having a large battery capacity and a high discharge voltage in a short time, high-output charging apparatuses are generally used.

The high-output charging apparatuses can shorten the charge time, but increase the temperature of electric components of the charging apparatuses. In addition, the high-output charging apparatuses cause the battery packs themselves to produce a large amount of heat. Moreover, when a battery pack is tried to be charged immediately after the battery pack is used in a high-output electric tool, the battery pack cannot be charged because the battery pack itself has a high temperature.

As countermeasures to these problems, there is proposed a charging apparatus which uses a cooling fan and forcefully cools the interior of the charging apparatus and a battery pack (for example, Patent Literature 1). This charging apparatus sends an airflow generated by the cooling fan to the interior of the battery pack and the interior of the charging apparatus, and thereby cooling heat-producing components of the battery pack and of the charging apparatus to suppress heat production.

CITATION LIST

Patent Literature

Patent Literature 1: Japanese Patent Application Publication 2015-019535

SUMMARY OF INVENTION

Technical Problem

In view of such a situation, an object of the present invention is to provide a charging apparatus which can efficiently cool the interior of a charging apparatus.

Solution to Problem

A charging apparatus according to the present invention comprises: a case having a bottom portion, an upper portion opposite to the bottom portion, and a side portion coupling the bottom portion and the upper portion; a plurality of fans provided in the case, the plurality of fans being arranged along the side portion; and a charging circuit portion provided in the case and configured to charge a battery pack, the charging circuit having a heat-producing element that produces heat in connection with charging of the battery pack.

With the above configuration, the cooing efficiency for the heat-producing element by the plurality of fans can be improved. Further, the space for the charging circuit portion can be made larger in the case.

Preferably, the case has a substantially cuboidal shape, the plurality of fans comprise a first fan and a second fan, the first fan and the second fan being positioned in proximity to a corner portion of the side portion.

With the above configuration, a passage area for the cooling air generated by the first fan and the second fan in the case can be made larger. Further, a space for the charging circuit portion can be made larger in the case.

Preferably, the first fan is positioned along a first side portion, and the second fan is positioned along a second side portion, the second side portion being connected to the first side portion through the corner portion.

With the above configuration, a passage area for the cooling air generated by the first fan and the second fan in the case can be made larger. Further, a space for the charging circuit portion can be made larger in the case.

Preferably, the first fan and the second fan are positioned along a same side portion.

With the above configuration, a cross sectional area of the air passage crossing the traveling direction of the cooling air passing therethough can be made larger, so that the charging circuit portion can be efficiently cooled. Therefore, increase in temperature of the charging apparatus can be prevented.

Preferably, the first fan is positioned along the first side portion, and the second fan is positioned along a third side portion opposed to the first portion.

Preferably, the case has an inlet through which air is introduced into the case, and an outlet through which the air is exhausted outside the case, wherein the first fan and the second fan are positioned in proximity to the outlet, and wherein the heat-producing element is positioned in proximity to the inlet.

With the above configuration, air introduced in the case firstly passes beside the heat-producing element to cool the heat-producing element. Then, the air is exhausted from the outlet out of the case by the first fan and the second fan. That is, the heat-producing element is cooled by the air which has been introduced into the case and which is not heated by the exhausted heat yet. The air has the temperature which is not increased by the exhausted heat. The heat-producing element is efficiently cooled to prevent the temperature of the charging apparatus from being increased.

Preferably, the inlet and the outlet are provided at the side portion.

Further, a charging apparatus according to the present invention comprises: a case; a first fan configured to generate a first cooling airflow in the case; a second fan configured to generate a second cooling airflow in the case; and a charging circuit portion configured to charge a battery pack to be attached to the case, the charging circuit portion having a heat-producing element that produces heat in connection with charging of the battery pack, wherein the case comprises an inlet through which air is introduced into the case, and an outlet through which the first cooling airflow and the second cooling airflow are exhausted outside the case, and the first fan and the second fan are positioned in proximity to the outlet, and wherein the heat-producing element is positioned in proximity to the inlet and is cooled by at least one of the first cooling airflow and the second cooling airflow.

With the above configuration, the air introduced in the case through the inlet by driving the first fan and the second fan firstly passes beside the heat-producing element to cool the heat-producing element, and is then exhausted from the outlet out of the case by the first fan and the second fan. That is, the heat-producing element is cooled by the air which has been introduced into the case and which is not heated by the exhausted heat yet. The air has the temperature which is not increased by the exhausted heat. The heat-producing element is efficiently cooled to prevent the temperature of the charging apparatus from being increased.

Preferably, the case has a bottom portion, an upper portion opposite to the bottom portion, and a side portion coupling the bottom portion and the upper portion, and wherein the outlet is provided at the side portion and is close to the first fan and the second fan.

With the above configuration, a large amount of air per unit time can be introduced through the inlet into the case. Further, the first cooling airflow and the second cooling airflow having a higher temperature due to the exhausted heat can be efficiently exhausted. Accordingly, increase in temperature of the charging apparatus can be prevented.

Preferably, the case has a substantially cuboidal shape. The first fan and the second fan are positioned in proximity to a corner portion of the side portion.

With the above configuration, the air passage for the first cooling airflow and the second cooling airflow can be made larger in the case. The space for the charging circuit portion can be made larger in the case.

Preferably, the charging circuit portion further comprises a radiation member attached to the heat-producing member, the radiation member defining a part of an air passage along which the first airflow and the second airflow pass.

With the above configuration, the radiation member as well as the heat-producing element can be cooled by the first cooling airflow and the second cooling airflow, so that the heat-producing element can be more efficiently cooled. Accordingly, rise in temperature of the charging apparatus can be prevented.

Preferably, the first fan has a first rotational axis, the second fan has a second rotational axis, and the first fan and the second fan are positioned close to each other in order that an extending line of the first rotational axis and an extending line of the second rotational axis are crossed.

With the above configuration, the passage area through which the first cooling airflow and the second cooling airflow travel in the case can be made larger. Accordingly, the charging circuit portion can be efficiently cooled to prevent the temperature of the charging apparatus from being increased.

the case comprises an opening allowing air to be passed therethrough to cool the battery pack during a charging operation, and the first fan and the second fan are positioned in proximity to the opening.

With the above configuration, the air passing beside the battery pack can be introduced into the case through the opening, so that the battery pack in the charging process can be efficiently cooled. The temperature of the battery pack can be prevented from being increased.

A charging apparatus according to the present invention comprises: a case; a first fan provided in the case; a second fan provided in the case; and a charging circuit portion configured to charge a battery pack to be attached to the case, wherein the case comprises a vent allowing air to pass therethrough, and an outlet through which the air is exhausted outside the case, wherein the vent comprises a first vent to which the first fan is positioned in proximity and a second vent to which the second fan is positioned in proximity, wherein by setting a number of rotations of the first fan larger than a number of rotations of the second fan, a first ventilation is performed in which a part of air introduced through the first vent is exhausted outside the case through the second vent, and wherein the first fan and the second fan are configured to introduce air through the first vent and the second vent into the case during a charging operation by the charging circuit portion.

With the above configuration, by the first ventilation, part of the air introduced through the first vent is exhausted out of the case through the second vent. Therefore, the direction of the airflow passing through the second vent is inverted to the direction of the airflow during the charging operation. Accordingly, clogging of the second vent by dust and generated during the charging operation can be solved.

The present invention provides a charging apparatus for selectively charging a plurality of battery packs having different battery voltages and different rated capacities, comprising: a case to which the battery pack is attachable; a fan provided in the case; and a charging circuit portion provided in the case and configured to charge the battery pack, the charging circuit portion having a heat-producing element that produces heat in connection with charging of the battery pack, wherein the battery pack is able to be charged with a charging current which is larger than or equal to 10 A, and an air volume of the fan or an air volume generated by the fan in the case is larger than or equal to 13 m^3/hr.

With the above configuration, even if the battery pack is charged with the charging current which is equal to or more than 10 A, the heat-producing element can be efficiently cooled.

A charging apparatus according to the present invention comprises: a case having an inlet for introducing air in the case and an outlet for exhausting cooling air outside the case, the case having a bottom portion, and an upper portion opposed to the bottom portion, a battery pack being attached with the case; a fan configured to generate a cooling airflow in the case; a charging circuit portion provided in the case and configured to charge the battery pack, the charging circuit having a heat-producing element that produces heat in connection with charging of the battery pack; and an air passage defining member defining a cooling air passage in the case, the cooling airflow passing through the cooling air passage, the air passage defining member comprising a plate-like portion extending in a space between the upper portion and the heat-producing element.

With the above configuration, the heat-producing element can be efficiently cooled by the air passage defining member, so that the temperature of the charging apparatus can be prevented from being increased.

Preferably, the heat-producing element comprises a plurality of heat-producing elements, wherein the air passage defining member comprising: a first defining portion extending in a first direction crossing the upper portion, and a second defining portion extending from the first defining portion in a second direction crossing the first direction, the second defining portion being positioned between the upper portion and at least one of the plurality of heat-producing elements in the first direction, and wherein driving the fan causes the cooling airflow to be guided to the heat-producing element, thereby cooling the heat-producing element.

With the above configuration, the air introduced through the inlet by driving the fan, as cooling air, can be prevented from deviating from the cooling air passage defined by the air passage defining member including the second defining portion. Further, the cooling airflow is passed along the cooling air passage therein. Therefore, the heat-producing element positioned in the cooling air passage is cooled by the cooling air. Accordingly, heat generation of the charging apparatus as whole can be prevented. The heat-producing element can be protected from rise of the temperature thereof.

Preferably, the air passage defining member comprises a radiation member for dissipating heat of at least one of the plurality of heat-producing elements. Further, it is preferable that the radiation member has a substantial L-shape of cross-section which crosses a traveling direction of the cooling airflow.

With the above configuration, the radiation member as well as the heat-producing element are cooled, so that the heat-producing element can be efficiently cooled. Further, because the radiation member has a substantial L-shape of cross-section, the cooling air is not deviated from the cooling air passage. Accordingly, the heat-producing element can be efficiently cooled. And, a rise of the temperature of the charging apparatus can be prevented.

Preferably, the charging circuit portion comprises a circuit board on which the plurality of heat-producing elements are mounted. The first defining portion stands from one of the circuit board and the upper portion to the other of the circuit board and the upper portion. The cooling air passage is defined by the circuit board and the passage defining member.

With the above configuration, the air introduced through the inlet by driving the fan, as the cooling air, passes through the cooling air passage defined by the passage defining member. Accordingly, the heat-producing element positioned in the cooling air passage can be efficiently cooled. And, the rise of the temperature of the charging apparatus can be prevented.

Preferably, at least one of the plurality of heat-producing elements is positioned in the vicinity of the inlet. With this configuration, the heat-producing element is cooled by the air which has been just introduced through the inlet to the case. Accordingly, the heat-producing element can be efficiently cooled.

Preferably, the heat-producing element comprises at least one of a diode, a field-effect transistor, a transformer, and a coil.

Preferably, the plate-like member comprises: an opening formed on a corresponding position to the heat-producing element, the opening having a shape corresponding to an outer shape of the heat-producing element; and a guide piece portion extending from the vicinity of a periphery of the opening in a direction opposite to the upper portion to define a part of the cooling air passage with the heat-producing element, wherein the cooling air passage is provided to communicate from the inlet to the outlet through a space between the heat-producing element and the guide piece portion and the opening.

With the above configuration, the air introduced through the inlet by driving the fan, as the cooling air, passes through the air passage defined by the guide piece portion of the air passage defining member and the heat-producing element, and the opening to the outlet. Accordingly, the heat-producing element is cooled by the cooling air, and then heat generation of the charging apparatus as whole can be prevented. The heat-producing element is protected from the rise of the temperature thereof.

Preferably, the heat-producing element is positioned in proximity to the inlet. With this configuration, the heat-producing element is cooled with the air immediately after being introduced through the inlet. Accordingly, the heat-producing element can be efficiently cooled.

Preferably, the heat-producing element comprises at least one of a diode, a field-effect transistor, a transformer, and a coil.

A charging apparatus according to the present invention comprises: a case having an inlet for introducing air into the case and an outlet for exhausting a cooling airflow outside the case, the case having a bottom portion, and an upper portion opposed to the bottom portion, a battery pack being attachable to the case; a fan configured to generate a cooling airflow in the case; and a charging circuit portion provided in the case and configured to charge the battery pack, the charging circuit portion comprising a plurality of heat-producing elements that produce heat in connection with charging of the battery pack, wherein the heat-producing element includes a transformer, the transformer being positioned in proximity to the inlet.

Preferably, the case comprises an air passage defining member configured to define an air passage through which the cooling airflow passes. The air passage defining member comprises: a first defining portion extending in a first direction crossing the upper portion, and a second defining portion extending from the first defining portion in a second direction crossing the first direction, the second defining portion being positioned between the upper portion and at least one of the plurality of heat-producing elements in the first direction. The transformer is positioned in the air passage defined by the air passage defining member. With this configuration, the transformer which is one of the heat-producing elements can be efficiently cooled.

Preferably, the air passage defining member is a radiation member attached to the heat-producing element, and driving the fan causes the cooling airflow to be guided along the radiation member. With this configuration, the heat-producing element attached with the radiation member in addition to the transformer can be efficiently cooled. With this structure, the heat-producing element can be efficiently cooled.

A charging apparatus according to the present invention comprises: a case having an inlet for introducing air into the case and an outlet for exhausting a cooling airflow outside the case, a battery pack being attachable to the case; a fan configured to generate a cooling airflow in the case; a charging circuit portion provided in the case and configured to charge the battery pack, the charging circuit having a plurality of heat-producing elements that produce heat in connection with charging of the battery pack; and an air passage defining member defining a cooling air passage in the case, the cooling airflow passing through the cooling air passage, wherein the plurality of heat-producing elements are positioned in the cooling air passage defined by the air passage defining member.

A charging apparatus according to the present invention comprises: a case having an inlet for introducing air into the case and an outlet for exhausting a cooling airflow outside the case, a battery pack being attachable to the case; a fan configured to generate a cooling airflow in the case; a charging circuit portion provided in the case and configured to charge the battery pack, the charging circuit portion having a plurality of heat-producing elements that produce heat in connection with charging of the battery pack; and an air passage defining member defining a cooling air passage in the case, the cooling airflow passing through the cooling air passage, wherein the air passage defining member is configured to surround the plurality of heat-producing elements.

Effects of Invention

According to the present invention, when a battery pack is charged with a large amount of current flow during a short time period, a heat-producing element in a charging circuit portion is efficiently cooled so that heat generation of the heat-producing element can be prevented. Further, according to the present invention, the air introduced through an inlet to a case, as a cooling air, can be passed along the cooling air passage with preventing from being deviated from the cooling air passage defined by the air passage defining member. Accordingly, when the battery pack is charged rapidly with the large amount of current flow, the heat-producing element is efficiently cooled so that rise of temperature of the charging apparatus can be prevented, which are advantages of the present invention.

DESCRIPTION OF EMBODIMENTS

Figure 1:
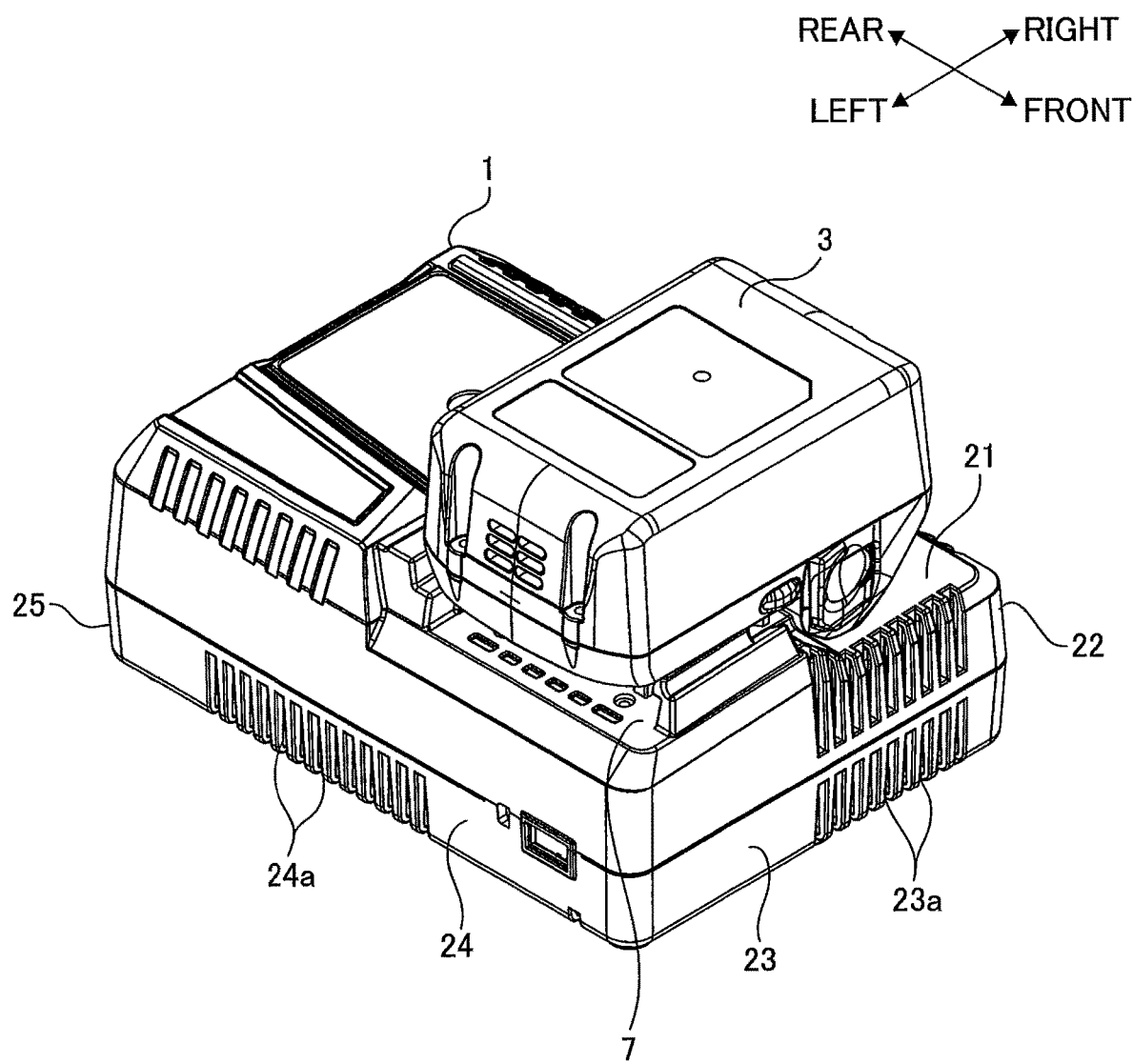
FIG. 1 Appearance view of a charging apparatus according to a first embodiment of the present invention.
Figure 2:
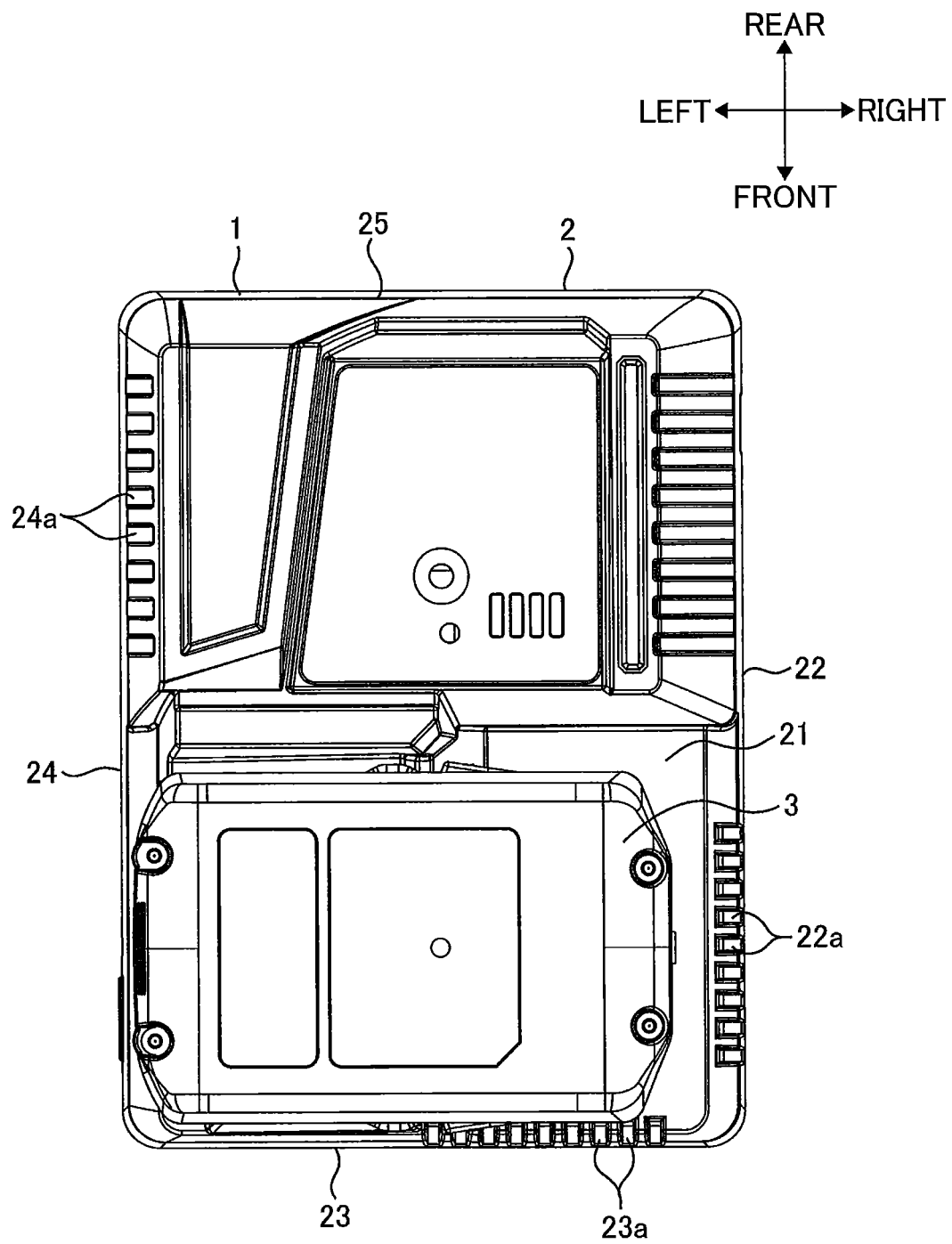
FIG. 2 Top view of the charging apparatus shown in FIG. 1.
Figure 3:
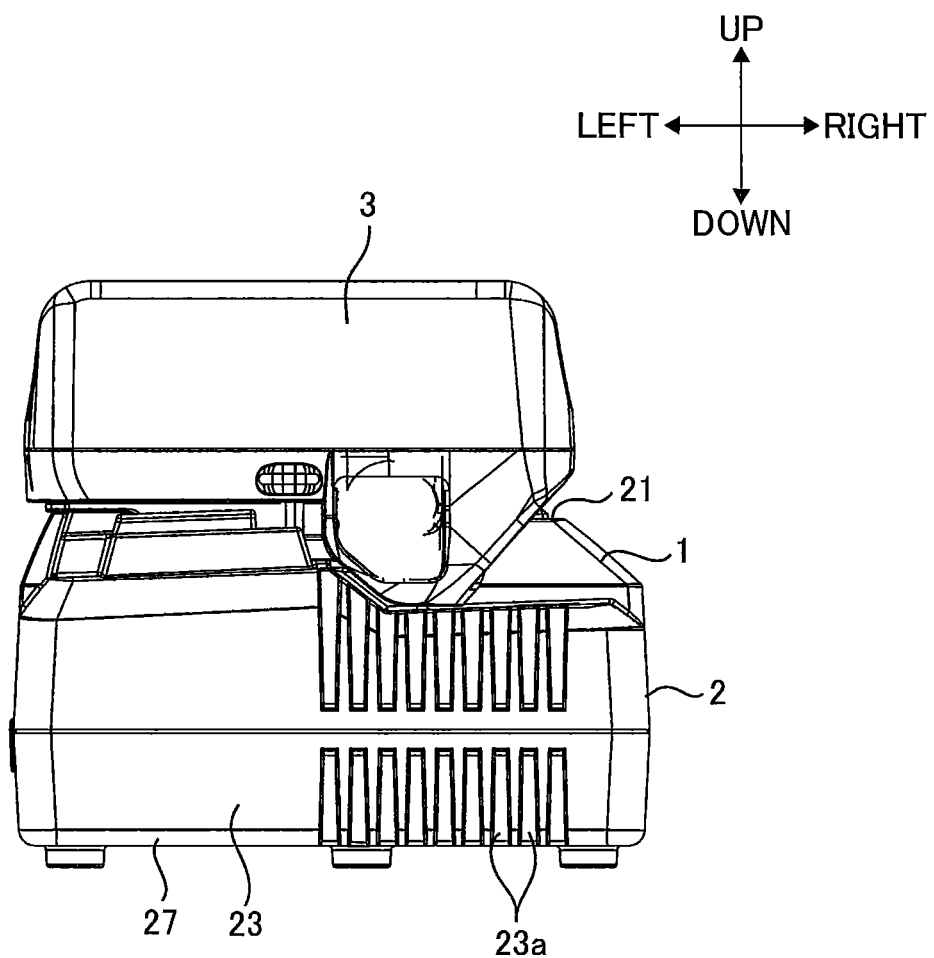
FIG. 3 Side view of the charging apparatus shown in FIG. 1.

Charging apparatuses of embodiments of the present invention will be described with reference to the accompanying drawings. In the following description, an upward direction is defined as a direction toward which one surface of a battery pack faces. Here, the one surface is a surface to which a battery pack is attached. A downward direction is defined as a direction opposite to the upward direction. A right-left direction and a front-back direction are directions illustrated in the figures, unless otherwise specified.

A charging apparatus 1 of a first embodiment of the present invention is configured to charge a variety of battery packs including battery packs 3 and 33, that is, a plurality of battery packs whose battery types (voltages and nominal capacities of the battery packs) are different from each other. In the following description, a case where the battery pack 3 is attached to the charging apparatus 1 will be mainly described, and the description of the battery pack 33 will be made, as necessary, together with the description of the battery pack 3.

Referring to FIGS. 1 to 5, the charging apparatus 1 includes, in a case 2, a charge circuit portion 4 for charging the battery pack 3, and a plurality of fans, a first fan 5 and a second fan 6, for cooling the charge circuit portion 4 and the battery pack 3.

The case 2 is substantially cuboidal, and includes a top face 21 which is an upper portion of the case 2. A front side portion of the top face 21 is provided with a battery attachment portion 7 to which the battery pack 3 is attached to be charged. The battery attachment portion 7 is provided with a plurality of terminals 70 used to charge the battery pack 3, and with an opening 71 through which air flows for cooling the battery pack 3. In addition, the case 2 also includes four side faces 22, 23, 24, and 25 which surround the top face 21; and a bottom face 27 which is a bottom portion of the case 202 and is placed opposite to the top face 21. The side faces 22 and 23 which are adjacent to each other are joined with each other via a corner portion 26. The side faces 22 and 24 face each other, and the side faces 23 and 25 face each other. In the case 2, a direction extending from the bottom face 27 toward the top face 21 is defined as an upward direction of the charging apparatus 1, that is, a first direction crossing the top face.

Figure 4:
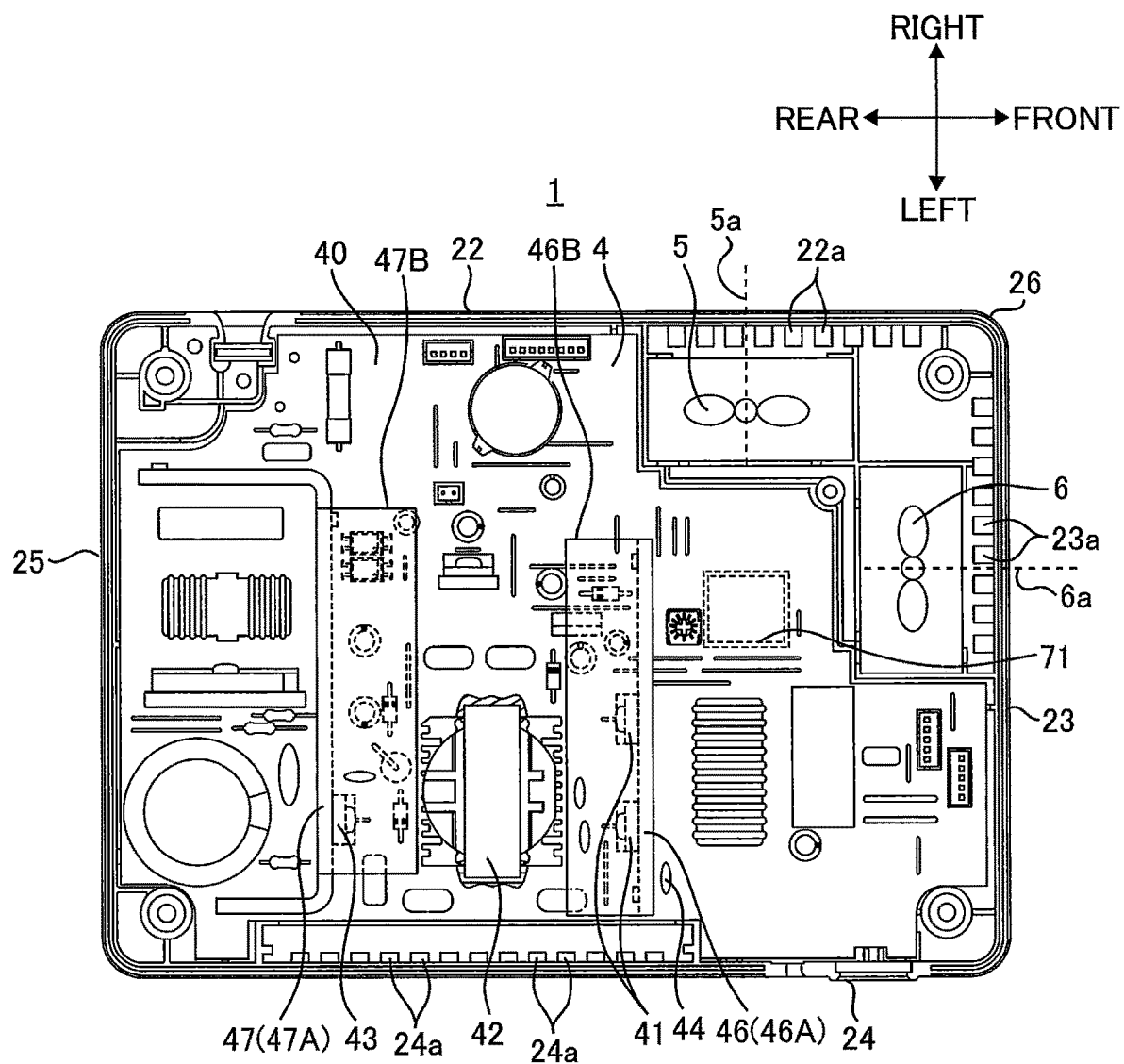
FIG. 4 Plan view of a charging circuit portion in a case of the charging apparatus shown in FIG. 1.

As illustrated in FIG. 4, the first fan 5 is disposed near the corner portion 26, the opening 71, and the side face 22 in the case 2. The first fan 5 has a first rotational axis 5a. A portion of the side face 22 which the first fan 5 faces is provided with a first outlet 22a. The first outlet 22a is constituted by a plurality of ventilating windows. When driven, the first fan 5 generates a first cooling airflow toward a direction in which the first rotational axis 5a extends. The first cooling airflow flows toward the first outlet 22a, and is discharged from the case 2 through the first outlet 22a.

As illustrated in FIG. 4, the second fan 6 is disposed near the corner portion 26, the opening 71, and the side face 23 in the case 2. The second fan 6 has a second rotational axis 6a. The second fan 6 is disposed such that a direction in which the second rotational axis 6a extends crosses the direction in which the first rotational axis 5a extends. A portion of the side face 23 which the second fan 6 faces is provided with a second outlet 23a. The second outlet 23a is constituted by a plurality of ventilating windows. When driven, the second fan 6 generates a second cooling airflow toward the direction in which the second rotational axis 6a extends. The second cooling airflow flows toward the second outlet 23a, and is discharged from the case 2 through the second outlet 23a. Thus, the plurality of fans (the first fan 5 and the second fan 6) can increase cooling efficiency for heat-producing elements of the charging apparatus 1. In addition, since the fans 5 and 6 are disposed along the side faces of the case 2 (specifically, the side faces 22 and 23), a mounting space for a board 40, which serves as a circuit board, can be secured in the case 2, making it possible to effectively use the board 40. It is particularly effective to dispose the fans 5 and 6 in the vicinity of a corner portion that joins side faces of the case 2.

In the case 2, the side face 24, which is opposite to the side face 22, is provided with a plurality of ventilating windows in a predetermined area. The plurality of ventilating windows constitute an inlet 24a. Thus, when the first fan 5 and the second fan 6 are driven, air is taken in from the inlet 24a into the case 2; passes through the interior of the case 2, as the first cooling airflow and the second cooling airflow, along a cooling air passage; and is discharged out of the case 2 through the first outlet 22a and the second outlet 23a. The detailed description of the cooling air passage will be made later.

The charge circuit portion 4 is configured such that components including a diode 41, a transformer 42, an FET 43, a temperature detecting element 44, and a charge control portion 45 are mounted on the board 40 which is placed in the vicinity of the inlet 24a in the case 2. Under the control by the charge control portion 45, the charge circuit portion 4 charges the battery pack 3 via the terminals 70, by using electric power supplied from, for example, a commercial alternating-current power supply P. When a large amount of current flows in the charge circuit portion 4 per unit time for the large-current-used and quick charging, so called 2 C charging, the diode 41, the transformer 42, and the FET 43 are apt to produce heat. To protect these components from heat and facilitate them to dissipate heat, radiation members 46 and 47 are respectively attached to the diode 41 and the FET 43.

In addition, the diode 41, the transformer 42, and the FET 43 are disposed in the vicinity of the inlet 24a, and directly exposed to the air which is taken in from the inlet 24a into the case 2. In particular, the transformer 42 is disposed in the most upstream side of the cooling air passage, that is, in the vicinity of the inlet 24a.

Figure 5:
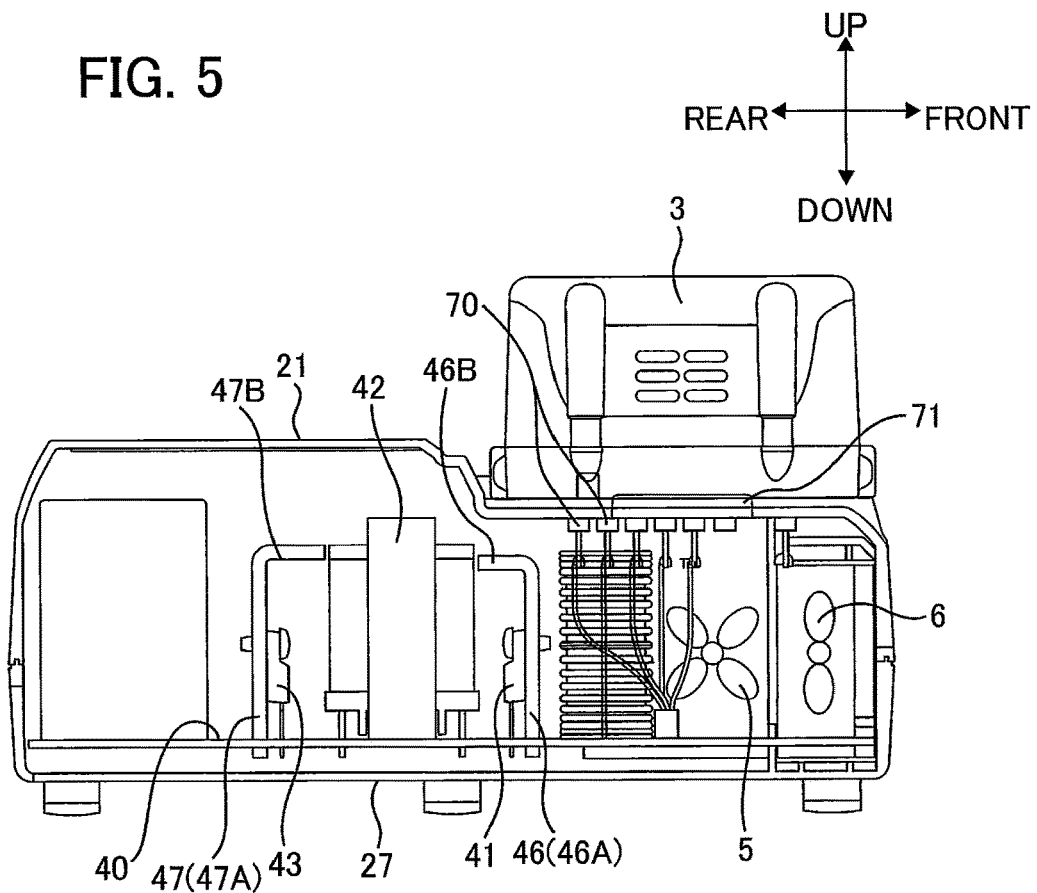
FIG. 5 Side view of the charging apparatus shown in FIG. 1 charging a battery pack.

The radiation member 46 is made of a metal having a high thermal conductivity. As illustrated in FIG. 5, the radiation member 46 includes a first radiation portion 46A and a second radiation portion 46B. The first radiation portion 46A is formed like a plate and extends from the board 40 toward the top face 21, that is, in the first direction. The diode 41 is fixed on the first radiation portion 46A. The second radiation portion 46B is formed like a plate and extends from an edge of the first radiation portion 46A toward the radiation member 47 in substantially parallel with the top face 21. A direction in which the second radiation portion 46B extends is a direction which crosses the first direction, that is, a second direction. Thus, the radiation member 46 has a substantially L-shaped section in a side view of the radiation member 46.

The radiation member 47 is also made of a metal having a high thermal conductivity. As illustrated in FIG. 5, the radiation member 47 includes a first radiation portion 47A and a second radiation portion 47B. The first radiation portion 47A is formed like a plate and extends from the board 40 toward the top face 21 in the first direction. The FET 43 is fixed on the first radiation portion 47A. The second radiation portion 47B is formed like a plate and extends from an edge of the first radiation portion 47A toward the radiation member 46 in the second direction, in substantially parallel with the top face 21. Thus, the radiation member 47 has a substantially L-shaped section in a side view of the radiation member 47.

Figure 6:
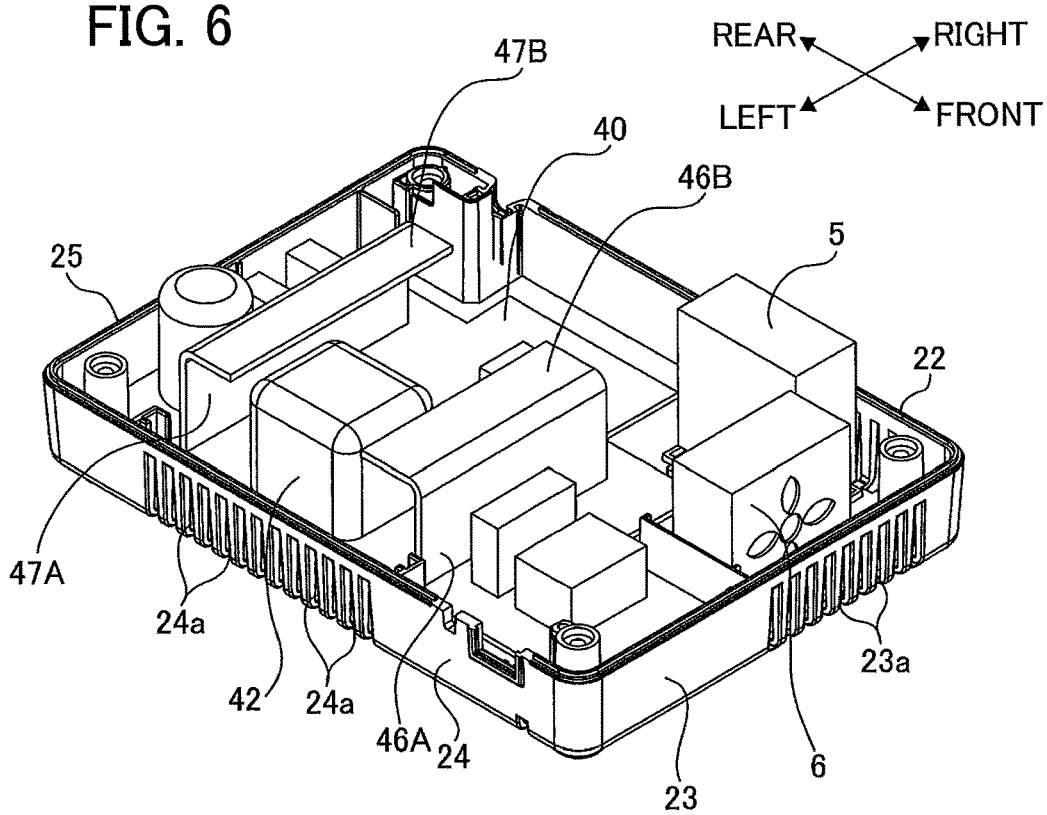
FIG. 6 Perspective view of a radiation member, the charging circuit portion, and first and second fans in the charging apparatus shown in FIG. 1.

As illustrated in FIG. 6, in a state where the radiation members 46 and 47 are mounted on the board 40, the radiation members 46 and 47 are disposed such that one end of the first radiation portion 46A and one end of the first radiation portion 47A are separated from each other and disposed in the vicinity of the inlet 24a. In addition, the radiation members 46 and 47 are each disposed, separated from the transformer 42 by a predetermined distance so that the transformer 42 is interposed between the second radiation portions 46B and 47B. The predetermined distance is determined according to specifications. As illustrated in FIG. 5, the second radiation portions 46B and 47B are plate-like portions, and positioned between the top face 21 and components of the diode 41 and the FET 43 in the first direction. The first radiation portion 46A and the second radiation portion 46B of the radiation member 46 and the first radiation portion 47A and the second radiation portion 47B of the radiation member 47 are sized so that an appropriate insulating distance is secured between the radiation member 46 and the transformer 42, and between the radiation member 47 and the transformer 42.

In the state where the radiation members 46 and 47 are mounted on the board 40, the radiation members 46 and 47 are disposed so that the radiation members 46 and 47 and the board 40 define an air passage for the air taken in from the inlet 24a into the case 2, and that the air passage contains the diode 41, the transformer 42, and the FET 43.

The temperature detecting element 44 may be a thermistor, and detects the temperature of the interior of the case 2.

The charge control portion 45 controls the charging of the battery pack 3 performed by the charge circuit portion 4, and controls the rotation of the first fan 5 and the second fan 6, while monitoring the temperature of the battery pack 3.

Figure 7:
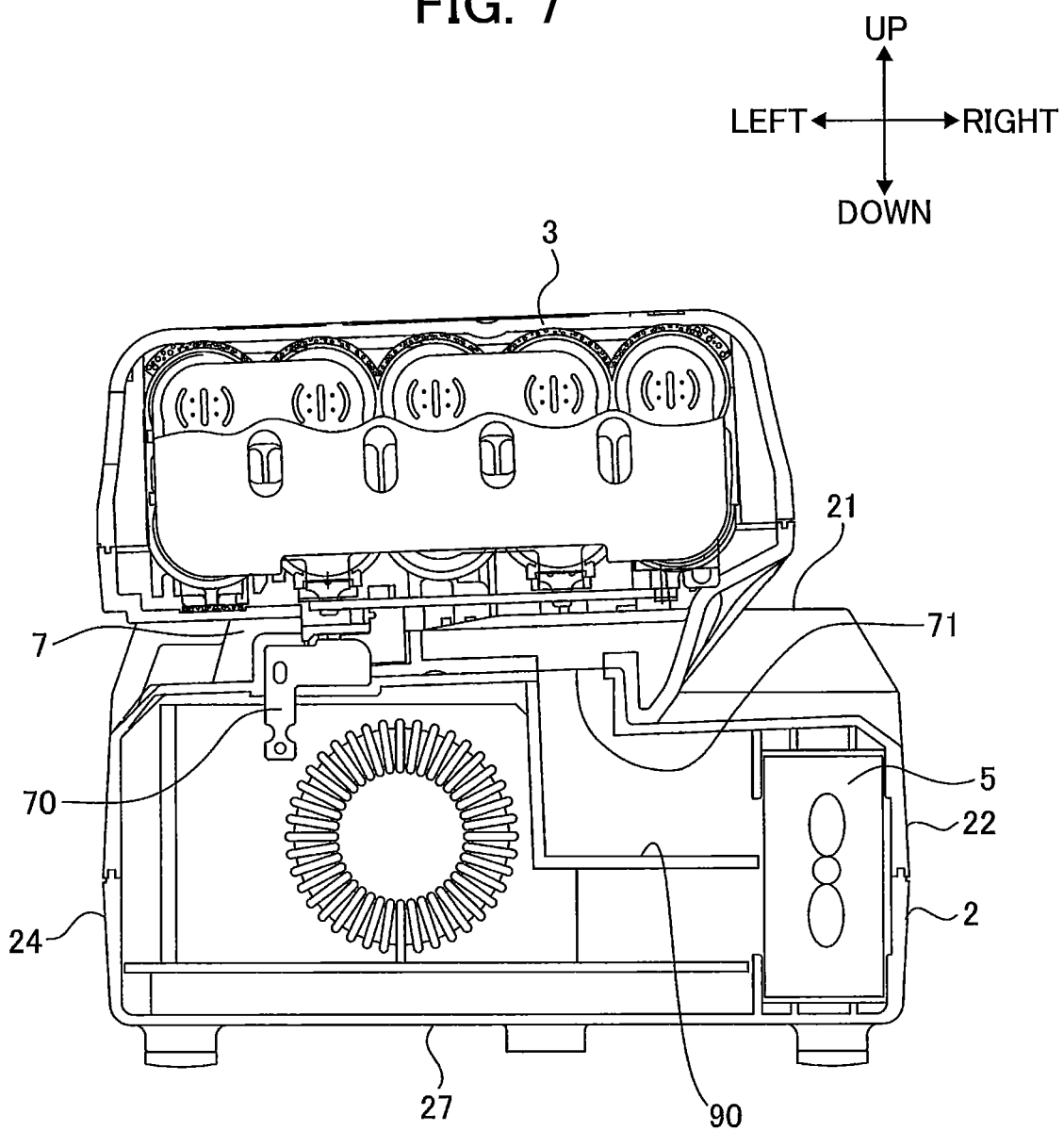
FIG. 7 Front view of the charging apparatus of FIG. 1 charging the battery pack.

When the battery pack 3 is attached to the battery attachment portion 7 as illustrated in FIG. 7, the charging apparatus 1 drives the first fan 5 and the second fan 6. The charging apparatus 1 causes the first fan 5 and the second fan 6 to generate a first cooling airflow and a second cooling airflow in the case 2, and forms a cooling air passage from the inlet 24a to the first outlet 22a and the second outlet 23a.

As illustrated in FIG. 6, in the vicinity of the inlet 24a, the cooling air passage is defined like a duct, with its top face partly opened, by the first radiation portion 46A and the second radiation portion 46B of the radiation member 46, the first radiation portion 47A and the second radiation portion 47B of the radiation member 47, and the board 40. Thus, the first cooling airflow and the second cooling airflow flow in the cooling air passage from one end side of the first radiation portions 46A and 47A, which is closer to the inlet 24a, toward the other end side of the first radiation portions 46A and 47A, which is closer to the outlets 22a and 23a.

The cooling airflows generally tend to flow from the inlet 24a toward the outlets 22a and 23a, taking the shortest way. Thus, if the second radiation portion 46B was not provided, most of the cooling airflows would not flow from the one end of the radiation member 46 toward the other end thereof, but would flow over the radiation member 46 and directly reach the outlets 22a and 23a. As a result, the first cooling airflow or the second cooling airflow would not pass through the vicinity of the diode 41, the transformer 42, and the FET 43 disposed between the radiation members 46 and 47, and thus could not cool the diode 41, the transformer 42, and the FET 43 sufficiently.

Figure 8:
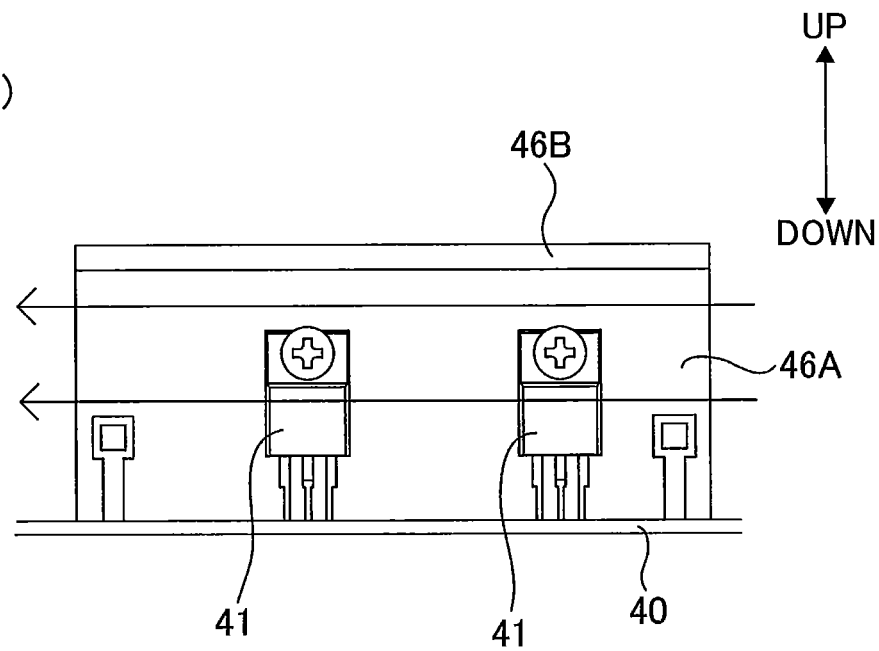
FIG. 8 Views explaining relationship between the radiation member and a cooling airflow; (a) the view showing the airflow without a second radiation portion, and (b) the view showing the airflow with the second radiation portion.
Figure 8:
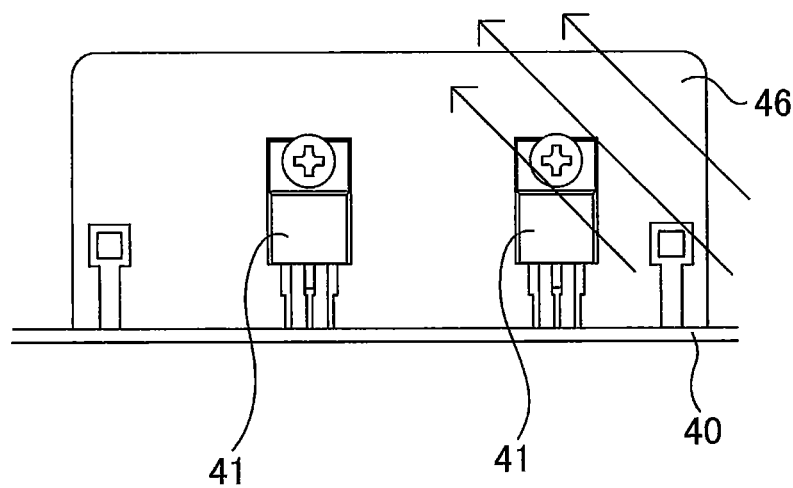

In contrast, in this embodiment of the present invention, the second radiation portions 46B and 47B, which extend from the edges of the first radiation portions 46A and 47A in the second direction, prevent the cooling airflows from flowing over the first radiation portion 46A to the outlets 22a and 23a, as illustrated in FIG. 8A. Thus, since the cooling airflows flow from the one ends of the first radiation portions 46A and 47A toward the other ends, the cooling airflows pass through the vicinity of the diode 41, the transformer 42, and the FET 43 disposed between the radiation members 46 and 47, and thus can cool the diode 41, the transformer 42, and the FET 43 sufficiently.

The arrangement of the diode 41, the transformer 42, and the FET 43 disposed in the cooling air passage, which is defined by the radiation members 46 and 47 illustrated in FIGS. 4, 5, and 6, is one example, and may be determined as appropriate as long as the first cooling airflow and the second cooling airflow pass through the vicinity of those components. In addition, the cooling airflows may be taken in from the outlets 22a and 23a, which serve as an inlet, disposed near the first fan 5 and the second fan 6, toward the inlet 24a which serves as an outlet, by the fans 5 and 6. In this case, the fans 5 and 6 blow the cooling airflows on the heat-producing elements, and thus the cooling effect is less than the configuration in which the first fan 5 and the second fan 6 discharge the cooling airflows out of the case 2. However, the cooling airflows converge at the vicinity of the inlet 24a (used as an outlet), and thus can cool the heat-producing elements (such as the transformer 42) disposed in the vicinity of the inlet 24a, with a large volume of air. Also in this case, the first fan 5 and the second fan 6 may take in dust as well as air, and thus clog the outlets (22a, 23a) with the dust. In the configuration where the first fan 5 and the second fan 6 discharge the winds out of the case 2, however, not only the cooling efficiency for the heat-producing elements is increased, but also the clogging of the outlets (22a, 23a) can be prevented.

To cool the battery pack 3, another air passage is formed between the opening 71 and the first outlet 22a and the second outlet 23a by a duct 90 illustrated in FIG. 7. The duct 90 separates the cooling air passage used for the battery pack 3, from the cooling air passage used for the charging apparatus 1. That is, the air which is taken in from an inlet of the battery pack 3 into the interior of the battery pack 3 and is then taken into the charging apparatus 1 through the opening 71 passes through an upper side of the duct 90, and is discharged from the first outlet 22a and the second outlet 23a. On the other hand, the air which is taken in from the inlet 24a into the charging apparatus 1 does not flow through a space on the battery pack 3 side due to the duct 90, but passes through a space on a lower side with respect to the duct 90 and is discharged from the first outlet 22a and the second outlet 23a. In FIG. 5, the duct 90 is omitted.

Figure 9:
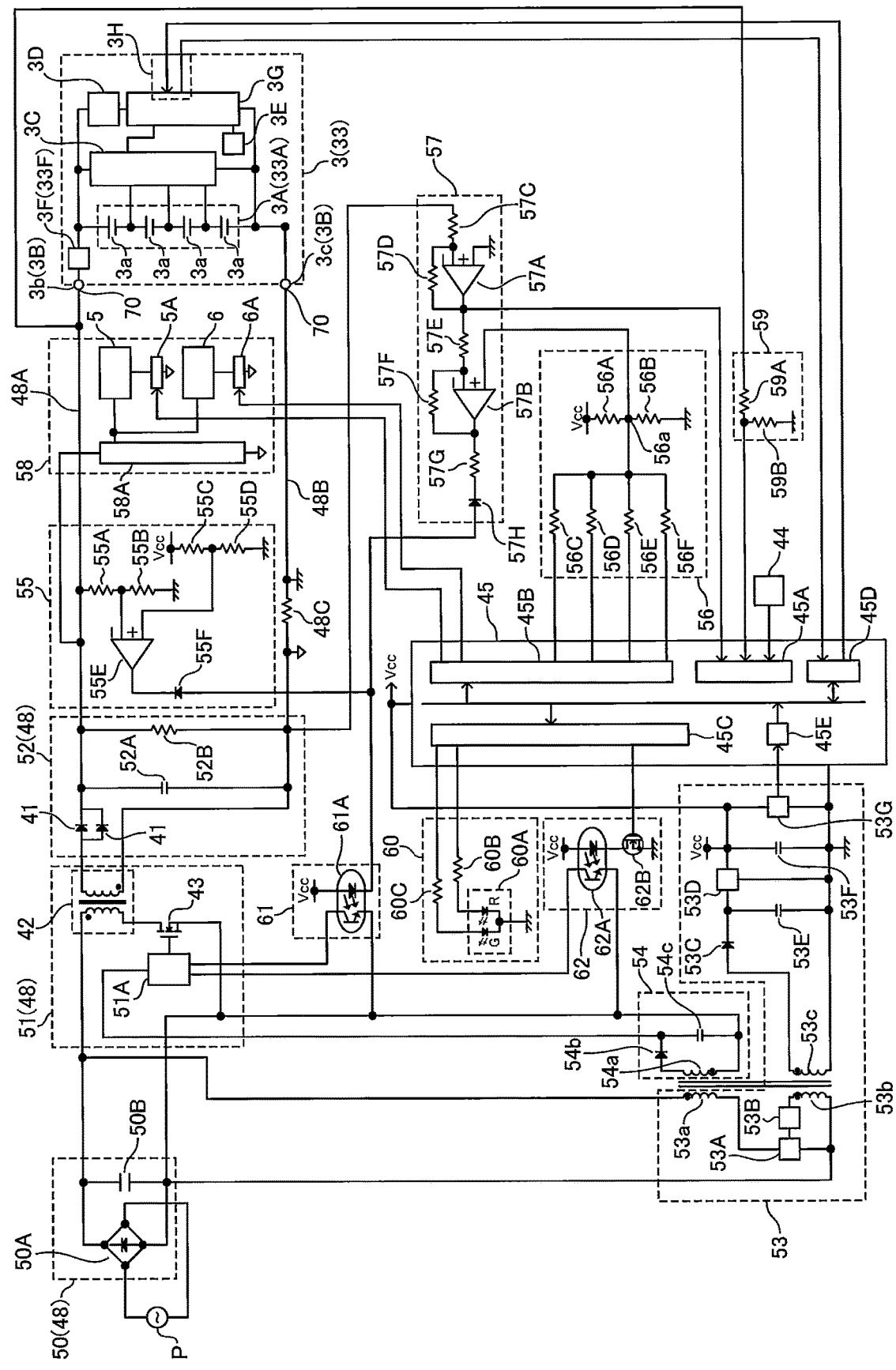
FIG. 9 Circuit diagram including a block diagram of electric configuration of the charging apparatus shown in FIG. 1, and showing the battery charging portion mounted with the battery pack.

Now, electrical configurations of the charging apparatus 1 of the first embodiment, and of the battery packs 3 and 33 connected to the charging apparatus 1 will be described with reference to FIG. 9. The battery packs 3 and 33 are different from each other in battery type, breaking element, and allowable charging current value and internal resistance (nominal capacity) of battery set, but are the same as each other in basic configuration, connection with charging apparatus, and method of communicating with the charging apparatus 1. Thus, the battery pack 3 will be described as an example, and regarding the battery pack 33, only the differences will be described. FIG. 9 is a circuit diagram including a block diagram and illustrating the electrical configuration of the charging apparatus 1 and the battery packs 3 and 33; and illustrates a state in which the battery pack 3 or 33 is attached to the battery attachment portion 7.

At first, the electrical configuration of the battery pack 3 will be described. The battery pack 3 is a high-capacity (5 Ah or more nominal capacity) battery pack which can be detachably attached to electric tools, such as hammer drills and portable disc saws, and which is used as a driving power supply for the electric tools. As illustrated in FIG. 9, the battery pack 3 includes a battery set 3A, a connecting terminal portion 3B, a protection IC 3C, a battery-side power supply circuit 3D, a battery-temperature detecting circuit 3E, a first breaking element 3F, and a battery-side control portion 3G. The battery capacity may be a rated capacity.

The battery set 3A has a configuration in which four battery cells 3a are connected in series with each other. In the present embodiment, the battery cells 3a may be lithium ion batteries. Each of the battery cells 3a has a nominal voltage of 3.6V, and a maximum charging voltage of 4.2V. Thus, the maximum charging voltage of the battery set 3A is 16.8V (4.2V/cell×4 cells). The nominal capacity of the battery set 3A is 6 Ah, and the allowable charging current value of the same is about 12 A (or 2 C). Thus, the battery set 3A has the higher capacity among the driving power supplies for electric tools. Here, the allowable charging current value is the maximum value of charging currents which can charge the battery set 3A without causing deterioration or failure of the battery set 3A. The value of 12 A (2 C) is merely one example, and more than the value may be used. For example, in a case where high-performance battery cells are used, the battery cells may have an allowable charging current value of 12 A (12C) or more.

The connecting terminal portion 3B has a positive connection terminal 3b and a negative connection terminal 3c. The positive connection terminal 3b is connected to a positive terminal of one of the battery cells 3a having the highest electric potential, via the first breaking element 3F. The negative connection terminal 3c is connected to a negative terminal of one of the battery cells 3a having the lowest electric potential. When the battery pack 3 is attached to the battery attachment portion 7 of the charging apparatus 1, the positive connection terminal 3b and the negative connection terminal 3c are connected to corresponding and predetermined terminals of the plurality of terminals 70 of the charging apparatus 1, and thus the battery pack 3 is connected to the charging apparatus 1.

The protection IC 3C monitors a voltage of each of the four battery cells 3a. If at least one of the battery cells 3a falls into an abnormal state, such as an overcharge state or an over-discharge state, the protection IC 3C outputs an error signal to the battery-side control portion 3G. The battery-side power supply circuit 3D converts a voltage from the battery set 3A, and supplies a converted voltage to the battery-side control portion 3G.

The battery-temperature detecting circuit 3E detects a temperature (battery temperature) of the battery set 3A; and includes a temperature sensing element(not illustrated), such as a thermistor, disposed adjacent to the battery set 3A. The battery-temperature detecting circuit 3E uses the temperature sensing element, such as a thermistor, to detect the battery temperature; converts a detected temperature to a voltage signal; and then outputs the voltage signal to the battery-side control portion 3G.

The first breaking element 3F is an element, such as a thermal protector or a fuse, disposed between the positive connection terminal 3b and the battery set 3A to protect the battery set 3A (battery cells 3a). The first breaking element 3F has a breaking characteristic which defines a condition used to cut off the charging current. When the breaking characteristic is satisfied, the first breaking element 3F allows the charging current to flow in the battery set 3A (battery cells 3a); when the breaking characteristic is not satisfied, the first breaking element 3F cuts off the charging current. More specifically, the first breaking element 3F has a first breaking-characteristic curve A (charging current—ambient temperature curve) illustrated in FIG. 10.

Figure 10:
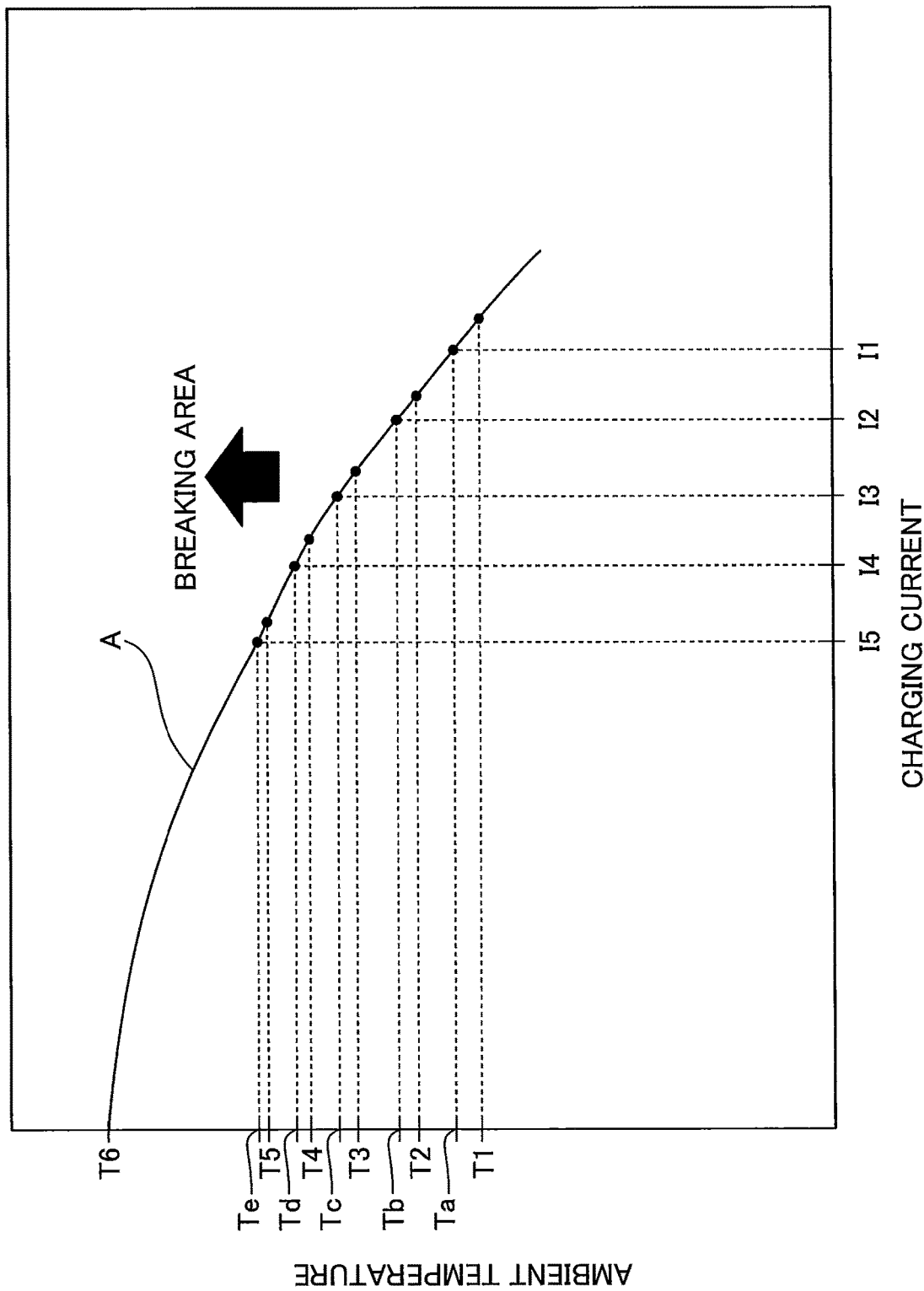
FIG. 10 Graph showing a first breaking characteristic curved line of a first breaking element in the battery pack shown in FIG. 9.

FIG. 10 illustrates the first breaking-characteristic curve A of the first breaking element 3F. The first breaking-characteristic curve A is a curve which shows a boundary between a state in which the first breaking element 3F is opened and the charging current is cut off, and a state in which the first breaking element 3F is closed and the charging current is allowed to flow. In the graph of FIG. 10, an upper area than the first breaking-characteristic curve A is an area in which the first breaking element 3F is opened and the charging current is cut off, that is, an area in which the breaking characteristic is not satisfied. Here, ambient temperatures Ta to Te and T1 to T6, which are illustrated in FIG. 10, satisfy the relationship of T1<Ta<T2<Tb<T3<Tc<T4<Td<T5<Te<T6, and charging currents I1 to I5 satisfy the relationship of I5<I4<I3<I2<I1.

The first breaking-characteristic curve A of the first breaking element 3F is set such that as the charging current increases, the maximum value of allowable ambient temperatures (allowable maximum temperature) decreases. In other words, the first breaking-characteristic curve A is set such that as the ambient temperature increases, the maximum value of allowable charging currents (allowable maximum current value) decreases.

For example, when the charging current is I4, the allowable maximum temperature is Td. Thus, the charging current is allowed to flow until the ambient temperature reaches Td, and is cut off when the ambient temperature is Td or more. In other words, when the charging current is I4, the allowable maximum temperature is Td, and the breaking characteristic is satisfied until the ambient temperature reaches Td, and is not satisfied when the ambient temperature is Td or more.

When the charging current is I3 which is larger than I4, the allowable maximum temperature is Tc which is lower than Td. Thus, when the ambient temperature is Tc or more, the charging current is cut off. In another aspect, when the ambient temperature is Tc, the allowable maximum current value is I3. Thus, when the charging current is I3 or more, the charging current is cut off. When the ambient temperature is Td which is higher than Tc, the allowable maximum current value is I4 which is smaller than I3.

Here, T6 is an ambient temperature at which the first breaking element 3F is opened even when the charging current does not flow. In the present embodiment, the first breaking element 3F is disposed in contact with the battery set 3A, and thus has its ambient temperature substantially the same as the battery temperature. Thus, the first breaking element 3F not only limits or cuts off the charging current, but also prevents the start of the charging when the battery temperature is higher than a predetermined temperature.

The battery-side control portion 3G is a microprocessor having a ROM, a RAM, and computing functions; and includes an information communication port 3H. The information communication port 3H is connected to a predetermined terminal of the plurality of terminals 70 of the charging apparatus 1 when the battery pack 3 is connected to the charging apparatus 1. The communication between the battery-side control portion 3G and the charging apparatus 1 is performed via the information communication port 3H.

During the charging, the battery-side control portion 3G sends battery type data to the charging apparatus 1 via the information communication port 3H. The battery type is a classification based on characteristics of the battery pack 3. Thus, the charging apparatus 1 can identify the characteristics of the battery pack 3 which is necessary for the charge control, by receiving the battery type data from the battery-side control portion 3G. Examples of the characteristics of the battery pack 3, which can be identified from the battery type, include the number of cells 3a of the battery set 3A, connection configuration (the number of serial connections, the number of parallel connections), the maximum charging voltage of the battery cells 3a, the nominal capacity of the battery set 3A, the breaking characteristic (the first breaking-characteristic curve A) of the first breaking element 3F of the battery pack 3, a target charging voltage for appropriately charging the whole battery set 3A (in the present embodiment, the target charging voltage is equal to the maximum charging voltage), the allowable charging current value, and a final current value which is a criterion of determination to end the charging. In the present embodiment, the battery type of the battery pack 3 is, for example, C. When receiving an error signal from the protection IC 3C, the battery-side control portion 3G outputs a charge stop signal to the charging apparatus 1 via the information communication port 3H.

Next, the battery pack 33, which is different from the battery pack 3 in battery type, will be described. The battery pack 33 includes a battery set 33A which is different from the battery set 3A in characteristics. The battery set 33A has the same nominal capacity (6 Ah) as that of the battery set 3A, but has a different allowable charging current value which is, for example, 12 A (2 C) or more. The allowable charging current value is not limited to this current value, because the allowable charging current value varies depending on manufacturers or performance of the battery cells. Since the battery pack 33 includes the battery set 33A whose allowable charging current value is different from that of the battery set 3A, the battery pack 33 includes a second breaking element 33F whose breaking characteristic is different from that of the first breaking element 3F. More specifically, the second breaking element 33F has a second breaking-characteristic curve B illustrated in FIG. 11. In the present embodiment, the battery type of the battery pack 33 is, for example, D. Thus, when the battery pack 33 is attached to the charging apparatus 1, the charging apparatus 1 receives D, as a battery type, from the battery-side control portion 3G of the battery pack 33, and thus can identify the breaking characteristic of the second breaking element 33F of the battery pack 33, that is, the second breaking-characteristic curve B, and the target charging voltage.

Figure 11:
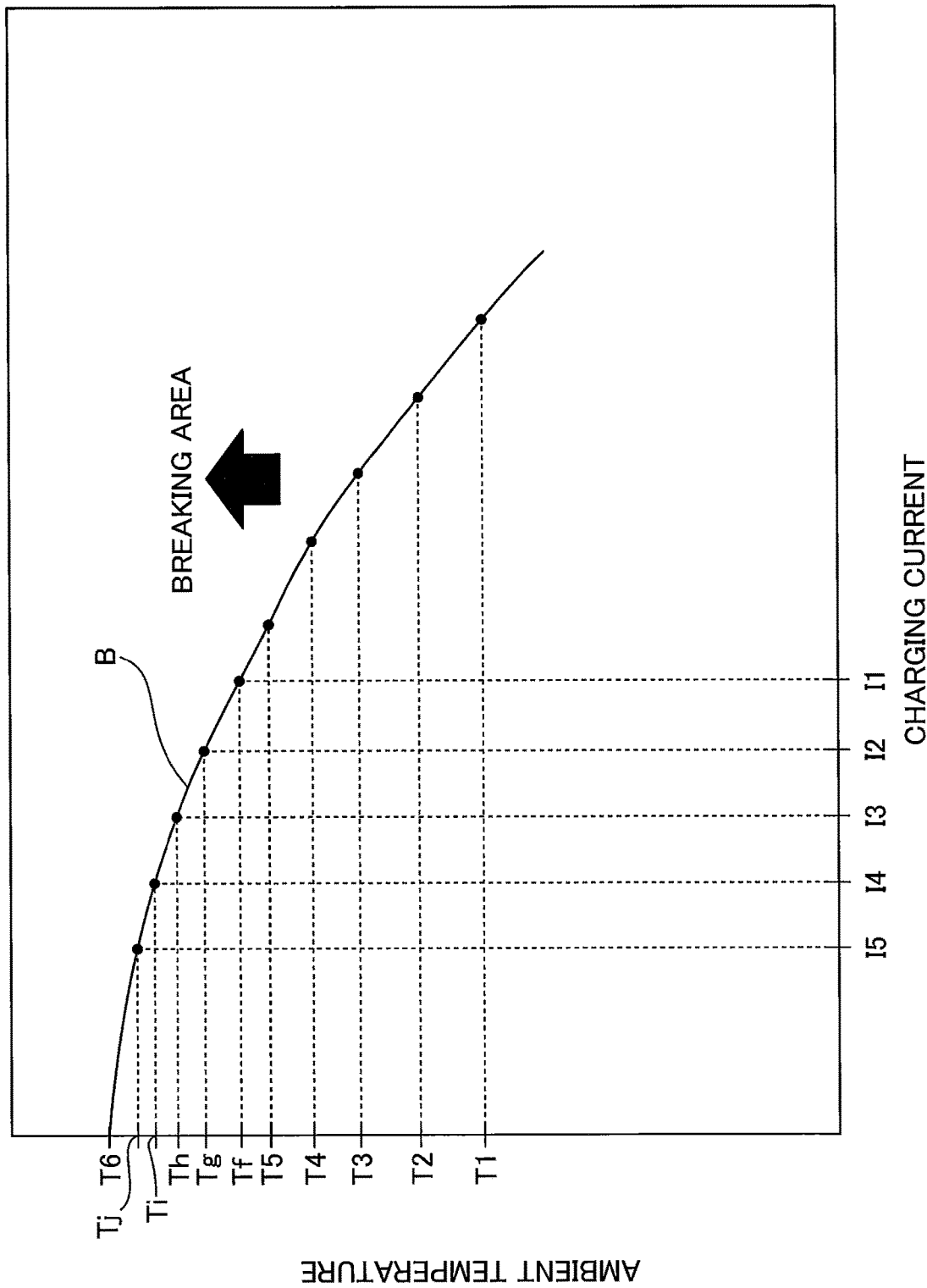
FIG. 11 Graph showing a second breaking characteristic curved line of a second breaking element in the battery pack shown in FIG. 9.

FIG. 11 illustrates the second breaking-characteristic curve B of the second breaking element 33F. Here, the ambient temperatures T1 to T5 and the charging currents I1 to I5 illustrated in FIG. 11 have same values as those of the ambient temperatures T1 to T5 and the charging currents I1 to I5 illustrated in FIG. 10. The ambient temperatures T5, T6, and Tf to Tj satisfy the relationship of T5<Tf<Tg<Th<Ti<Tj<T6.

As illustrated in FIG. 11, the second breaking-characteristic curve B of the second breaking element 33F is the same as the first breaking-characteristic curve A of FIG. 10 in that as the charging current increases, the allowable maximum temperature decreases. In the second breaking element 33F (the second breaking-characteristic curve B), the charging currents I1 to I5 corresponds to the allowable maximum temperatures Tf to Tj, respectively. Here, even the lowest allowable maximum temperature Tf in Tf to Tj is higher than T5 and the allowable maximum temperatures Ta to Te of the first breaking element 3F (first breaking-characteristic curve A), which corresponds to the charging currents I1 to I5.

As described above, in the present embodiment, the battery temperature is substantially equal to the ambient temperature. Generally, the battery temperature is apt to increase as the charging current increases and flows for a longer time. In view of the above description, the battery pack 33, which includes the second breaking element 33F whose allowable maximum temperature is higher than that of the first breaking element 3F of the battery pack 3, allows a larger charging current to flow for a longer time than the battery pack 3. For example, if the battery pack 3 and the battery pack 33 are charged with the charging current I1 for comparison, the battery temperature (ambient temperature) of the battery pack 3 is allowed up to only Ta (<Tf), whereas the battery temperature of the battery pack 33 is allowed up to Tf (>Ta). Thus, when the ambient temperature Ta is reached, the charging current (I1) is cut off in the battery pack 3, but is not cut off in the battery pack 33 and thus can keep flowing after that. In this manner, the battery pack 33 allows the charging current I1 to flow for a longer time than the battery pack 3.

Next, the electrical configuration of the charging apparatus 1 will be described. As illustrated in FIG. 9, the charging apparatus 1 includes an electric power supply circuit 48, an auxiliary power supply circuit 53, a switching power supply circuit 54, the charge control portion 45, a voltage-setting control circuit 55, a current setting circuit 56, a current control circuit 57, a first control-signal-transmission portion 61, a second control-signal-transmission portion 62, a fan portion 58, the temperature detecting element 44, a voltage detecting circuit 59, and a display circuit 60. The charging apparatus 1 charges the battery set 3A (battery cells 3a) of the battery pack 3, in a state where the battery pack 3 is attached to the charging apparatus 1, by using constant current and constant voltage control.

The constant current and constant voltage control is a charge control which sets a target current value when charging is started; charges the battery set while controlling charging current so that the charging current becomes the target current value (constant current control); after a voltage across the whole battery set 3A reaches a target charging voltage, keeps charging while keeping the charging voltage at the target charging voltage (constant voltage control); and ends the charging when the charging current has a value equal to or lower than a predetermined final current value under the constant voltage control.

The electric power supply circuit 48 is a circuit to supply electric power to the battery pack 3; and includes a first rectifying-and-smoothing circuit 50, a switching circuit 51, a positive charge line 48A, a negative charge line 48B, and a second rectifying-and-smoothing circuit 52.

The first rectifying-and-smoothing circuit 50 includes a full-wave rectifying circuit 50A and a smoothing capacitor 50B; causes the full-wave rectifying circuit 50A to full-wave rectify an alternating-current voltage supplied from the commercial alternating-current power supply P; and causes the smoothing capacitor 50B to smooth a full-wave rectified voltage and output a direct-current voltage. The commercial alternating-current power supply P is, for example, an external power supply with AC 100V.

The switching circuit 51 is connected to the first rectifying-and-smoothing circuit 50; and includes the transformer 42, the FET 43, and a PWM-control IC 51A. The PWM-control IC 51A changes the width of pulses used to drive the FET 43. The FET 43 performs switching in accordance with the width of the driving pulses, converts a direct-current output signal from the first rectifying-and-smoothing circuit 50 to a voltage having a pulse train waveform. The voltage having the pulse train waveform is applied to a primary winding of the transformer 42, stepped down (or stepped up)

by the transformer 42, and outputted to the second rectifying-and-smoothing circuit 52.

The second rectifying-and-smoothing circuit 52 includes two diodes 41, a smoothing capacitor 52A, and a discharge resistor 52B. The second rectifying-and-smoothing circuit 52 rectifies and smoothes the output voltage from a secondary winding of the transformer 42, and outputs a direct-current voltage. The direct-current voltage is outputted from predetermined terminals (the plurality of terminals 70) connected to the positive connection terminal 3b and the negative connection terminal 3c of the battery pack 3.

The positive charge line 48A and the negative charge line 48B are electrical paths along which the charging current flows when the battery pack 3 is charged. In a state where the battery pack 3 is connected to the battery attachment portion 7, the positive charge line 48A connects one of the terminals 70, which is connected to the positive connection terminal 3b, and one end of the secondary winding of the transformer 42. In the state where the battery pack 3 is connected to the battery attachment portion 7, the negative charge line 48B connects one of the terminals 70, which is connected to the negative connection terminal 3c, and the other end of the secondary winding of the transformer 42. In the negative charge line 48B, the current detecting resistor 48C is provided.

The current detecting resistor 48C is a shunt resistor used to detect the charging current which flows in the battery pack 3, and is disposed between the second rectifying-and-smoothing circuit 52 and GND in the negative charge line 48B. The charging current is detected by the current control circuit 57 inverting and amplifying a voltage drop across the current detecting resistor 48C and outputting an inverted and amplified voltage to the charge control portion 45.

The auxiliary power supply circuit 53 is a constant-voltage power supply circuit used to supply a stabilized reference voltage Vcc to various circuits, such as the charge control portion 45 and later-described operational amplifiers 55E, 57A. The auxiliary power supply circuit 53 is connected to the first rectifying-and-smoothing circuit 50; and includes coils 53a, 53b, and 53c, a switching element 53A, a control element 53B, a rectifying diode 53C, a three-terminal regulator 53D, oscillation prevention capacitors 53E and 53F, and a reset IC 53G. The reset IC 53G outputs a reset signal to the charge control portion 45 to reset the charge control portion 45.

The switching power supply circuit 54 supplies electric power to the PWM-control IC 51A; and includes a coil 54a, a rectifying diode 54b, and a smoothing capacitor 54c.

The charge control portion 45 is a microprocessor including a ROM, a RAM, and a computing unit; and includes an A/D input port portion 45A, a first output-port portion 45B, a second output-port portion 45C, a digital communication port portion 45D, and a reset port portion 45E. The charge control portion 45 causes the computing unit to process a variety of signals inputted to the A/D input port portion 45A and the digital communication port portion 45D, and outputs a variety of signals, obtained based on the result of the processing, from the first output-port portion 45B, the second output-port portion 45C, and the digital communication port portion 45D to the current setting circuit 56, the fan portion 58, and the like to control the charging of the battery pack to be charged.

The ROM stores a variety of control programs required for the charge control, battery types of two or more kinds of battery packs that can be charged, characteristics of the battery types (such as the above-described breaking characteristic and the target charging voltage), and a later-described table illustrated in FIG. 14. The charge control portion 45 receives battery type data from the battery pack connected to the terminals 70, and identifies characteristics of the battery pack by using the received battery type data.

The A/D input port portion 45A is connected to the current control circuit 57, the temperature detecting element 44, and the voltage detecting circuit 59. The A/D input port portion 45A receives a voltage signal which indicates a charging current, from the current control circuit 57; a voltage signal which indicates a temperature of the charge circuit portion 4, from the temperature detecting element 44; and a voltage signal which indicates a charging voltage, from the voltage detecting circuit 59.

The first output-port portion 45B has a plurality of ports, each of which is connected to the current setting circuit 56 or the fan portion 58. The charge control portion 45 outputs a signal used to set a target current value, from the first output-port portion 45B to the current setting circuit 56; and outputs a fan control signal used to control the first fan 5 and the second fan 6, to the fan portion 58.

The second output-port portion 45C has a plurality of ports, each of which is connected to the display circuit 60 or the second control-signal-transmission portion 62. The charge control portion 45 outputs a signal used to control the display circuit, from the second output-port portion 45C to the display circuit 60; and outputs a signal used to control start/stop of the charging, to the second control-signal-transmission portion 62.

When the battery pack 3 is connected to the battery attachment portion 7, the digital communication port portion 45D is connected to the information communication port 3H of the battery pack 3, and can achieve interactive communication. The charge control portion 45 obtains information on the battery pack 3 required for the charge control, that is, the battery temperature and the battery type, via the digital communication port portion 45D. The reset port portion 45E is connected to the auxiliary power supply circuit 53, and receives a reset signal outputted from the reset IC 53G.

The voltage-setting control circuit 55 sets a target charging voltage, and performs control so that the charging voltage becomes the target charging voltage. The voltage-setting control circuit 55 includes voltage-dividing resistors 55A to 55D, an operational amplifier 55E, and a diode 55F.

The voltage-dividing resistors 55A and 55B are connected in series with each other between the positive charge line 48A and GND. A connection point between the voltage-dividing resistors 55A and 55B is connected to the inverting input terminal of the operational amplifier 55E. The charging voltage on the positive charge line 48A is divided by the voltage-dividing resistors 55A and 55B, and the divided voltage value is outputted to the inverting input terminal of the operational amplifier 55E, as a comparison voltage value.

The voltage-dividing resistors 55C and 55D are connected in series with each other between the reference voltage Vcc and GND. A connection point between the voltage-dividing resistors 55C and 55D is connected to the non-inverting input terminal of the operational amplifier 55E. The reference voltage Vcc is divided by the voltage-dividing resistors 55C and 55D, and the divided voltage value is outputted to the non-inverting input terminal of the operational amplifier 55E, as a reference value for setting the target charging voltage.

The operational amplifier 55E is an element that compares the above-described comparison voltage value with the reference value. The output terminal of the operational amplifier 55E is connected to the first control-signal-transmission portion 61 via the diode 55F.

The current setting circuit 56 selectively sets the target current value, and includes voltage-dividing resistors 56A to 56F. The voltage-dividing resistors 56A and 56B are connected in series with each other between the reference voltage Vcc and GND. The voltage-dividing resistors 56C to 56F are connected in parallel with each other between a connection point 56a and the first output-port portion 45B of the charge control portion 45. The connection point 56a is a point between the voltage-dividing resistors 56A and 56B. The connection point 56a is connected to the current control circuit 57. A voltage (divided voltage value) at the connection point 56a is outputted to the current control circuit 57, as a reference value for setting the target current value. In the present embodiment, the target current value can be selectively set from five current values I1 to I5, by outputting or not outputting a low signal to the voltage-dividing resistors 56C to 56F from the first output-port portion 45B.

Specifically, a divided voltage value of the connection point 56a obtained when any of the ports of the first output-port portion 45B does not output a low signal and thus the reference voltage Vcc is divided by the voltage-dividing resistors 56A and 56B, is a reference value used for setting the target current value to I1. In the present embodiment, I1 is 12 A for example.

In another case, a divided voltage value of the connection point 56a obtained when the port of the first output-port portion 45B connected to the voltage-dividing resistor 56C outputs a low signal and thus the reference voltage Vcc is divided by the voltage-dividing resistor 56A and a parallel resistance of the voltage-dividing resistors 56B and 56C, is a reference value used for setting the target current value to I2. In the present embodiment, I2 is 10 A for example.

Similarly, a divided voltage value of the connection point 56a obtained when the port of the first output-port portion 45B connected to the voltage-dividing resistor 56D outputs a low signal is a reference value used for setting the target current value to I3; a divided voltage value of the connection point 56a obtained when the port of the first output-port portion 45B connected to the voltage-dividing resistor 56E outputs a low signal is a reference value used for setting the target current value to I4; a divided voltage value of the connection point 56a obtained when the port of the first output-port portion 45B connected to the voltage-dividing resistor 56F outputs a low signal is a reference value used for setting the target current value to I5. In the present embodiment, I3, I4, and I5 are respectively 9 A, 8 A, and 6 A for example.

The currents I1 to I5, which are set as target current values, may have different values from the above values, depending on a battery type of the battery pack 3 (such as nominal voltage or the number of cells). In other words, if a different type (battery type) of battery pack is used, the combination of I1, I2, I3, I4, and I5 may be different. In addition, in four ports of the first output-port portion 45B connected to the voltage-dividing resistors 56C to 56F, two or more ports may output low signals simultaneously. In this case, six or more values can be set as target current values.

The current control circuit 57 includes operational amplifiers 57A and 57B, resistors 57C to 57G, and a diode 57H. The output terminal of the operational amplifier 57A is connected to the A/D input port portion 45A of the charge control portion 45. The inverting input terminal of the operational amplifier 57A is connected to the current detecting resistor 48C via the resistor 57C. The non-inverting input terminal of the operational amplifier 57A is connected to GND. The output terminal of the operational amplifier 57B is connected to the first control-signal-transmission portion 61 via the resistor 57G and the diode 57H. The inverting input terminal of the operational amplifier 57B is connected to the output terminal of the operational amplifier 57A via the resistor 57E. The non-inverting input terminal of the operational amplifier 57B is connected to the connection point 56a of the current setting circuit 56.

The current control circuit 57 causes the operational amplifier 57A to invert and amplify a comparison voltage, which corresponds to the charging current, received by the inverting input terminal of the operational amplifier 57A, and to output the inverted and amplified voltage to the inverting input terminal of the operational amplifier 57B. Then, the current control circuit 57 causes the operational amplifier 57B to compare the comparison voltage with a reference value, which corresponds to the target current value, received by the non-inverting input terminal of the operational amplifier 57B; and causes the operational amplifier 57B to output a voltage signal, which corresponds to a comparison result, from the output terminal of the operational amplifier 57B. In this manner, the current control circuit 57 controls the charging current.

The first control-signal-transmission portion 61 includes a photocoupler 61A. The photocoupler 61A is connected to the voltage-setting control circuit 55 and the current control circuit 57, and outputs a feedback signal to the PWM-control IC 51A in accordance with signals outputted from the output terminal of the operational amplifier 55E of the voltage-setting control circuit 55 and from the output terminal of the operational amplifier 57B of the current control circuit 57.

The fan portion 58 includes the first fan 5, the second fan 6, a constant voltage circuit 58A, a first fan control circuit 5A, and a second fan control circuit 6A. The constant voltage circuit 58A converts an output voltage from the second rectifying-and-smoothing circuit 52, and supplies a converted voltage to the first fan 5 and the second fan 6. The first fan control circuit 5A and the second fan control circuit 6A are connected to the first output-port portion 45B of the charge control portion 45. In accordance with fan control signals outputted from the first output-port portion 45B, the first fan control circuit 5A controls driving/stop of the first fan 5 and the volume of air of the first fan 5, and the second fan control circuit 6A controls driving/stop of the second fan 6 and the volume of air of the second fan 6.

The temperature detecting element 44 is connected to the A/D input port portion 45A of the charge control portion 45. The temperature detecting element 44 detects the temperature of the interior of the case 2, that is, the temperature of the charge circuit portion 4; and outputs a voltage signal indicating a detected temperature, to the A/D input port portion 45A.

The voltage detecting circuit 59 detects the charging voltage, and includes voltage-dividing resistors 59A and 59B. The voltage-dividing resistors 59A and 59B are connected in series with each other between the positive charge line 48A and GND. A connection point between the voltage-dividing resistors 59A and 59B is connected to the A/D input port portion 45A of the charge control portion 45. The charging voltage on the positive charge line 48A is divided by the voltage-dividing resistors 59A and 59B, and the divided voltage value is outputted to the A/D input port portion 45A of the charge control portion 45, as a voltage signal indicating the charging voltage. The charge control portion 45 detects the charging voltage by reading the voltage signal.

The display circuit 60 displays a charge state, and includes an LED 60A, and resistors 60B and 60C. The LED 60A is connected to the second output-port portion 45C of the charge control portion 45 via the resistors 60B and 60C. When the charge control portion 45 outputs a high signal from a port of the second output-port portion 45C connected to the resistor 60B, the LED 60A turns on to red. When the charge control portion 45 outputs a high signal from a port of the second output-port portion 45C connected to the resistor 60C, the LED 60A turns on to green. When the charge control portion 45 outputs high signals from both ports of the second output-port portion 45C connected to the resistors 60B and 60C, the LED 60A turns on to orange. In the present embodiment, the charge control portion 45 causes the LED 60A to turn on to red in a state where the battery pack 3 is not connected or in a state before the charging is performed, such as a standby time for charging; causes the LED 60A to turn on to orange while the charging is performed; and causes the LED 60A to turn on to green after the charging completes.

The second control-signal-transmission portion 62 includes a photocoupler 62A and an FET 62B. The photocoupler 62A transmits a signal to start/stop the PWM control IC 51A, to the PWM-control IC 51A. The FET 62B is connected between a light emitting element of the photocoupler 62A and GND. The gate of the FET 62B is connected to the second output-port portion 45C. When a port of the second output-port portion 45C of the charge control portion 45 connected to the FET 62B outputs a high signal, the FET 62B turns ON and the photocoupler 62A then turns ON. With this operation, the PWM-control IC 51A is started to start the charging. On the other hand, when the port of the second output-port portion 45C connected to the FET 62B outputs a low signal, the FET 62B turns OFF and the photocoupler 62A then turns OFF. With this operation, the PWM-control IC 51A is stopped to stop (end) the charging.

Next, the charge control by the charge control portion 45 of the charging apparatus 1 will be described. The charge control portion 45 of the charging apparatus 1 of the present embodiment performs the charge control for shortening charge time. In particular, the charge control portion 45 performs the charge control, which shortens charge time, by charging a high-capacity (5 Ah or more nominal capacity) battery pack with a charging current of 2 C or more, that is, by performing 2 C charging.

In conventional charging apparatuses, there has been a problem in which, when a high-capacity battery pack is tried to be charged with a relatively large charging current (charging current of 2 C or more) than a nominal capacity of the battery pack for shortening charge time, a breaking element of the battery pack, which is to be charged, is operated in a short time, causing interruption of the charging and resulting in a longer charge time.

In view of the above problem, in the present embodiment, the charge control is performed as follows. First, the charging is started with a charging current of 2 C or more (10 A or more for a nominal capacity of 5 Ah, 12 A or more for a nominal capacity of 6 Ah; that is, 10 A or more) relative to the nominal capacity (5 Ah or more) of the battery pack. Then, the charging is performed, with the target current value being changed sequentially, to charge the battery pack with a charging current as large as possible. Here, the charging current is determined in consideration of a breaking characteristic (breaking-characteristic curve) of the battery pack so that the charging current is within a range (a range in which the breaking characteristic is satisfied; that is, a range which is lower than the breaking-characteristic curve of FIGS. 10 and 11) in which the breaking element does not operate. In addition to the above control, when the charging is started with a charging current of 2 C or more relative to the nominal capacity of the high-capacity battery pack, and if the breaking element of the battery pack to be charged does not operate, the control is performed such that the battery pack is charged with the charging current of 2 C or more from the start of the charging to a time when the charging voltage reaches the target charging voltage, to shorten the charge time. Preferably, the charging current is 2 C or more, and 3 C or less (or, 10 A or more, and 15 A or less), considering a balance between a shortened charge time, and deterioration and failure of the battery pack due to the charging current. However, the upper limit is not limited to 3 C or less, and may be 3 C (15 A) or more, because the upper limit varies depending on manufactures or performance of battery cells. In addition, the charging apparatus 1 can not only charge the battery pack of 5 A or more with a charging current of 2 C (10 A) or more, but also charge a battery pack of 5 Ah or less with a charging current of 2 C or more. Thus, the charge time of conventional battery packs can also be shortened. Furthermore, the charging apparatus 1 can charge not only the battery pack having serially-connected four cells, but also other battery packs having different voltages (having serially-connected five or more cells, or three or less cells). In this case, the voltage-setting control circuit 55 may be configured to set a plurality of target charging voltages to charge the battery packs having different voltages.

Figure 12:
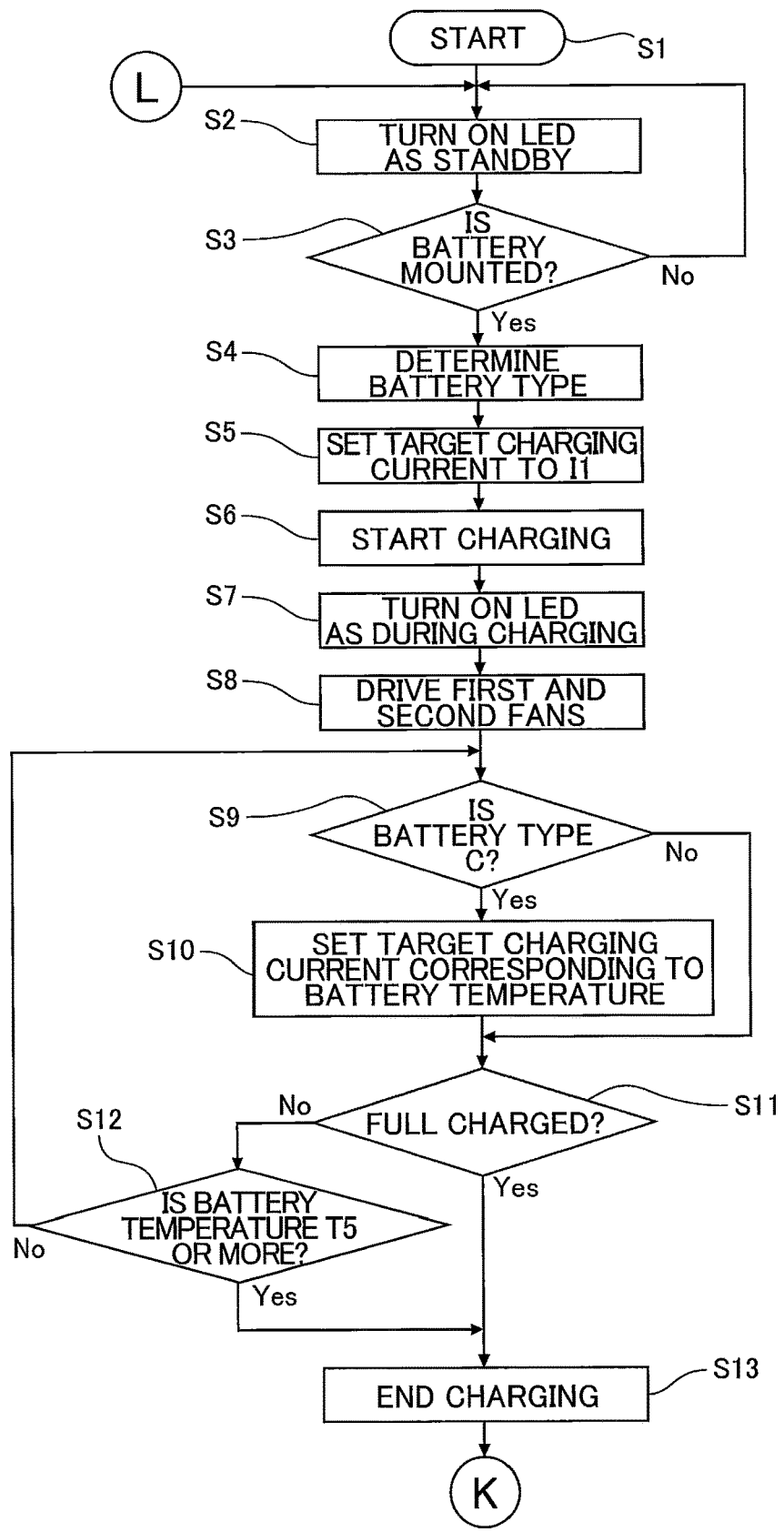
FIG. 12 Flowchart showing a charging process by the charging control portion of the charging apparatus shown in FIG. 9.

Next, one example of the charge process by the charging apparatus 1 will be described with reference to FIGS. 12 to 14. FIGS. 12 and 13 are flowcharts illustrating the charge process performed by the charge control portion 45 of the charging apparatus 1. FIG. 14 is a table for determining the target current value used when the charge control portion 45 charges the battery pack 3.

As illustrated in FIG. 12, when the charging apparatus 1 is connected to the commercial alternating-current power supply P, the charge control portion 45 starts the charge control in S1, and turns on the display circuit 60 to red, in S2, for indicating the charge standby state. To turn on the display circuit 60 to red, the process causes a port of the plurality of ports of the second output-port portion 45C connected to the resistor 60B to output a high signal, and thereby causes the LED 60A to turn on to red.

After causing the LED 60A to turn on to red in S2, the process determines, in S3, whether the battery pack is attached to the battery attachment portion 7 (terminals 70). The determination of whether the battery pack is attached is performed by the battery-side control portion 3G of the battery pack and the charge control portion 45 communicating with each other via the information communication port H and the digital communication port portion 45D. If the battery pack 3 is not attached (S3:No), the process returns to S2. That is, the process keeps the charge standby state, while repeating S2 and S3 until the battery pack is attached.

If the process determines, in S3, that the battery pack is attached to the battery attachment portion 7 (S3:Yes), the process determines the battery type in S4. The determination of the battery type is performed through communication with the battery pack. In the present embodiment, when the battery pack 3 is attached to the battery attachment portion 7 (terminals 70), the charge control portion 45 receives C as the battery type; when the battery pack 33 is attached, the charge control portion 45 receives D as the battery type. In the present embodiment, the battery type is determined through communication with the battery pack. However, in a case where a determination resistor is provided in the battery pack to determine the battery type, a determination terminal which can be connected to the determination resistor may be provided in the charging apparatus, and the battery type may be determined by reading a resistance value of the determination resistor.

After determining the battery type in S4, the process sets the target current value to I1 in S5, and starts the charging in S6 with a charging current of 2 C or more, that is, I1. The charging is started by causing a port of the plurality of ports of the second output-port portion 45C connected to the FET 62B to output a high signal, and thus causing the PWM-control IC 51A to operate.

When the charging is started in S6, the process causes the display circuit 60 to turn on to orange, in S7, for indicating that the battery pack is in the charge. To turn on the display circuit 60 to orange, the process causes both ports of the plurality of ports of the second output-port portion 45C connected to the resistors 60B and 60C to output high signals, and thereby causes the LED 60A to turn on to orange.

The process turns on the display circuit 60 to orange in S7, and drives the first fan 5 and the second fan 6 in S8. The driving of the first fan 5 and the second fan 6 is performed by outputting fan control signals from the first output-port portion 45B to the first fan control circuit 5A and the second fan control circuit 5B. The first and the second fans 5 and 6 generate first and second cooling airflows, and thereby the air is taken into the case 2 through the inlet 24a. With this operation, a cooling air passage of the charging apparatus 1 toward the first outlet 22a and the second outlet 23a is formed. In addition, another cooling air passage which extends from the opening 71 toward the first outlet 22a and the second outlet 23a is also formed.

After driving the first and second fans 5 and 6, the process determines, in S9, whether the battery type is C. If the battery type is C (S9:Yes), the process determines that the battery pack 3 is connected to the charging apparatus 1, and sets (changes) the target current value corresponds to the battery temperature (ambient temperature) again, in S10, depending on the table of FIG. 14. Like the determination of the battery type, the detection of the battery temperature is performed through communication with the battery pack 3.

Figures 13, 14:
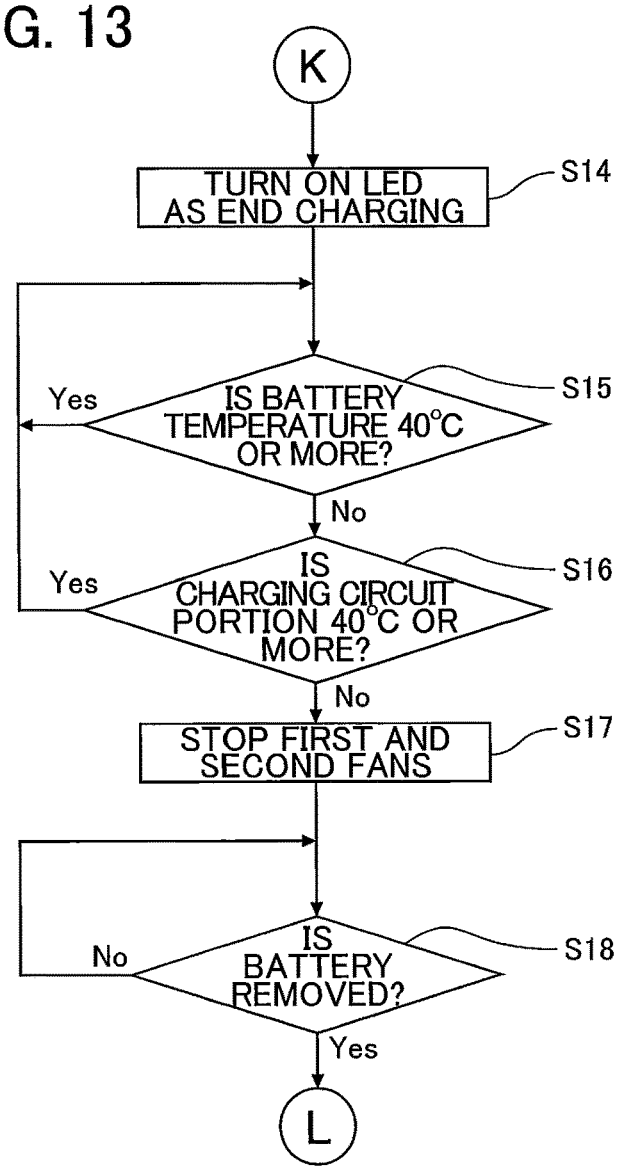
FIG. 13 Flowchart showing a charging process by the charging control portion of the charging apparatus shown in FIG. 9.
FIG. 14 Table for determining a target current value used when the charging control portion of the charging apparatus shown in FIG. 9 charges the battery pack.

The table illustrated in FIG. 14 is a correspondence table of the battery temperature and the target current value, defined in consideration of the breaking characteristic of the first breaking element 3F, that is, the first breaking-characteristic curve A so that the charging is performed with a current as large as possible in a range (a range in which the charging current is not cut off, that is, a range in which the breaking characteristic is satisfied) in which the first breaking element does not operate.

As illustrated in FIG. 14, when the battery temperature (ambient temperature) is T1 or less, the target current value is set again (changed) to I1. As illustrated in FIG. 10, T1 is slightly lower than the allowable maximum temperature Ta of the first breaking-characteristic curve A, which corresponds to the charging current I1. When the battery temperature is T1 or more, and less than T2, the target current value is changed to I2. T2 is a temperature between the allowable maximum temperature Ta of the first breaking-characteristic curve A, which corresponds to the charging current I1, and the allowable maximum temperature Tb which corresponds to the charging current I2 (Ta<T2<Tb), and is slightly lower than Tb.

According to the first breaking-characteristic curve A, until the battery temperature reaches Ta, I1 that is the maximum current value in the target current values, which can be set by the charging apparatus 1, can be set as the target current value. However, when the battery temperature slightly increases than T1 and reaches Ta while the charging current I1 flows, the first breaking element 3F is opened, then the charging current is cut off, and then the charging is interrupted. For this reason, when the battery temperature reaches T1 which is slightly lower than Ta, the target current value is changed to I2 which is lower than I1. With this operation, the cutoff of the charging current by the first breaking element 3F can be reliably avoided.

In addition, as illustrated in FIG. 14, when the battery temperature is T2 or more and less than T3, the target current value is set to I3; when the battery temperature is T3 or more and less than T4, the target current value is set to I4; when the battery temperature is T4 or more, the target current value is set to I5. With the same reason as that of T1 and T2, T3 is determined to satisfy the relationship of Tb<T3<Tc, T4 is determined to satisfy the relationship of Tc<T4<Td, and T5 is determined to satisfy the relationship of Td<T5<Te. Thus, T1 to T5 are determined as described above, and the target current value (charging current) is sequentially changed to a smaller value every time the battery temperature reaches a temperature slightly lower than an allowable maximum temperature which corresponds to a currently-set target current value (charging current). With this operation, the charging can be performed with charging currents as large as possible in a range in which the first breaking element 3F does not operate, and the open state of the first breaking element 3F can be reliably avoided to continue the charging. This can shorten the charge time of high-capacity battery packs.

Referring back to FIG. 12, after setting (changing) the target current value again in the above manner in S10, the process determines, in S11, whether the battery pack is fully charged. In the determination of the full charge, the full charge may be determined when the charging current decreases to a value equal to or lower than a predetermined final current value under constant voltage control of the constant current and constant voltage control. The constant current and constant voltage control is commonly used as a method of charging lithium ion batteries. However, the method of determining the full charge is not limited to this.

If the full charge is determined (S11:Yes), then the process ends the charging in S13. The charge end operation is performed by causing the port of the plurality of ports of the second output-port portion 45C connected to the FET 62B to output a low signal, and causing the PWM-control IC 51A to stop.

On the other hand, if the full charge is not determined (S11:No), then the process determines, in S12, whether the battery temperature is T5 or more. T5 is a high temperature which is normally not reached in a state where the charging is performed with a charging current of I5, and which is not suitable for the charging of the battery set 3A. For this reason, when the battery temperature reaches T5 or more, the process performs the charge end operation in S13 to stop the charging.

If the process determines, in S12, that the battery temperature is not T5 or more, the process returns to S9 and changes the target current value again to a value corresponding to the battery temperature. That is, until the process determines, in S11, that the battery pack is fully charged or the process determines, in S12, that the battery temperature is T5 or more, the process charges the battery pack 3 by using the constant current and constant voltage control, while repeating S9, S10, S11, and S12, and while changing the target current value to a smaller current value, sequentially and step-by-step, every time the battery temperature reaches a temperature which is slightly lower than an allowable maximum temperature corresponding to a currently-set target current value. In addition, also when the battery temperature decreases, the target current value is changed depending on a decreased battery temperature. For example, when the battery temperature decreases from a temperature in a range which is from T3 or more to T4 or less, to a temperature in a range which is from T2 or more to T3 or less, the target current value is changed from I4 to I3 which is larger than I4.

If the process returns to S9 and determines that the battery type is not C, that is, the battery type is D (S9:No), then the process determines that the battery pack 33 is attached to the charging apparatus 1, and proceeds to S11 and S12. That is, the process does not perform the change operation of the target current value, which is performed in S10 in consideration of the breaking characteristic. This is because of the following reason. That is, as illustrated in FIG. 11, when any of the target current values I1 to I5, which can be set by the charging apparatus 1, is used, as long as the battery temperature is Tf or less, the second breaking element 33F of the battery pack 33 does not cut off the charging current. As a result, the battery pack 33 can be charged within a range in which the second breaking element 33F does not operate, from the start of the charging to a time when the charging voltage reaches the target charging voltage, with the maximum current value I1 in the target current values that can be set. Thus, from the above reason, the target current value needs not to be changed The second breaking element 33F of the battery pack 33 does not cut off the charging current as long as the battery temperature is Tf or less. However, if the battery temperature is equal to or higher than T5 which is lower than Tf (S12: Yes), then the process ends the charging to prevent deterioration or failure of the battery pack 33. In this manner, when the battery pack 33 is attached to the charging apparatus 1, the process charges the battery pack 33 with a charging current of 2 C, that is, I1, from the start of the charging to a time when the charging voltage reaches the target charging voltage, while repeating S9, S11, and S12, as long as the battery temperature is less than T5.

After performing the charge end operation in S13, the process turns on the display circuit 60 to green, in S14, for indicating a charge end state, as illustrated in FIG. 13. To turn on the display circuit 60 to green, the process causes the port of the plurality of ports of the second output-port portion 45C connected to the resistor 60C to output a high signal, and thereby causes the LED 60A to turn on to green.

After turning on the display circuit 60 to green in S14, the process determines, in S15, whether the battery temperature is 40 degrees or more. If the battery temperature is 40 degrees or more (S15:Yes), the process repeats S15 while keeping the driving of the first and second fans, and keeps cooling of the battery pack 3 until the battery temperature becomes less than 40 degrees.

If the battery temperature is less than 40 degrees (S15: No), the process determines, in S16, whether the temperature of the charge circuit portion 4 is 40 degrees or more. The detection of the temperature of the charge circuit portion 4 is performed by reading a voltage signal which is outputted from the temperature detecting element 44 to the A/D input port portion 45A and which indicates the temperature of the charge circuit portion 4. If the temperature of the charge circuit portion 4 is 40 degrees or more (S16:Yes), the process returns to S15, and keeps the driving of the first and second fans and the cooling of the charge circuit portion 4, while repeating S15 and S16, until the temperature of the charge circuit portion 4 becomes less than 40 degrees. If the temperature of the charge circuit portion 4 is less than 40 degrees (S16:No), the process stops the driving of the first and second fans 5 and 6 in S17.

While the battery pack 3 or 33 is charged in S6 to S13, the air passage from the inlet 24a toward the first outlet 22a and the second outlet 23a is being formed in the case 2. Since the diode 41, the transformer 42, and the FET 43 are disposed in the vicinity of the inlet 24a and cooled by the air which has just been taken in from the inlet 24a, as a cooling airflow, and which is still not warmed, those components are efficiently cooled.

Also, since the radiation members 46 and 47 define the air passage so that the air passage contains the diode 41, the transformer 42, and the FET 43, the diode 41, the transformer 42, and the FET 43, which need cooling, can be efficiently cooled. Furthermore, since the diode 41 and the FET 43 are respectively mounted on the radiation members 46 and 47, the diode 41 and the FET 43 are exposed to the cooling airflow which flows along the radiation members 46 and 47, and thus efficiently cooled. Furthermore, since the transformer 42 is positioned on the most upstream side of the air passage defined by the radiation members 46 and 47 (that is, in the vicinity of the inlet 24a), the transformer 42 is efficiently cooled by the air which is still not warmed.

Returning to the description of the charge process, the process will be further described. After stopping the driving of the first and second fans 5 and 6 in S17, the process determines, in S18, whether the battery pack is removed from the charging apparatus 1. If the process determines that the battery pack is not removed (S18:No), then the process keeps the charge end state until the battery pack is removed from the charging apparatus 1, while repeating S18. On the other hand, if the process determines that the battery pack is removed (S18:Yes), then the process returns to S2 and keeps the charge standby state again until the battery pack is attached to the charging apparatus 1. In this manner, the charging apparatus 1 of the present embodiment can charge the high-capacity (5 Ah or more) battery pack 3 or 33 with a large current (2 C or more, or 10 A or more), directly from the commercial alternating-current power supply P; and thus shorten the charge time.

Figure 15:
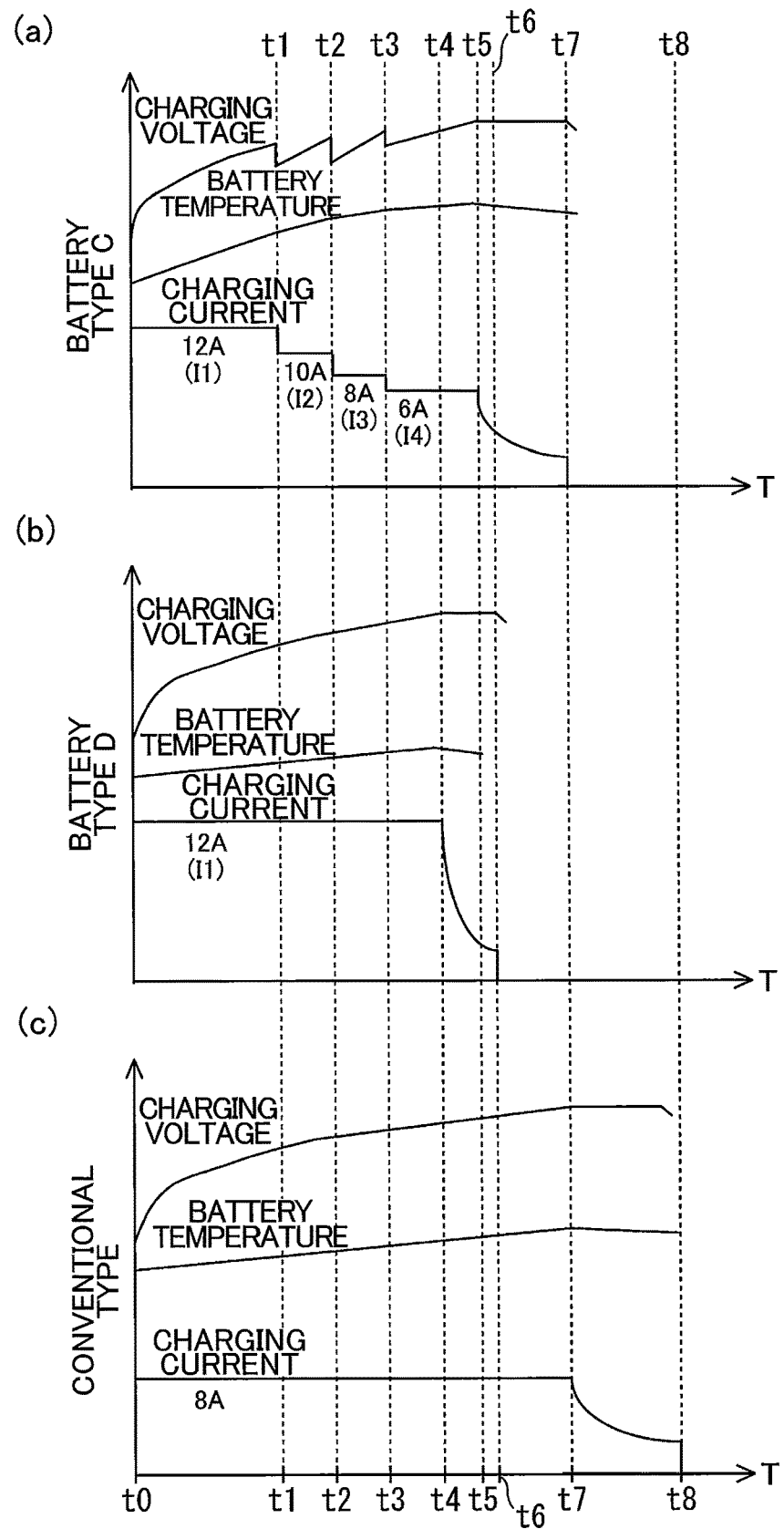
FIG. 15 (a) and (b) Timing charts showing time changes in the battery temperature, a charging voltage, and a charging current flow when the charging control portion of the charging apparatus shown in FIG. 9 controls the charging process, and (c) Timing chart showing time changes in the battery temperature, a charging voltage, and a charging current flow when a conventional charging apparatus controls the charging process.

Next, with reference to FIGS. 15A and 15B, there will be described how the battery temperature, the charging voltage, and the charging current change with time when the above-described charge process is performed. FIGS. 15A and 15B are time charts illustrating how the battery temperature, the charging voltage, and the charging current change with time when the charge control is performed by the charging apparatus 1.

As illustrated in FIG. 15A, in a case where the charging apparatus 1 of the present embodiment charges the battery pack 3, the target current value is set, at a time t0, to I1 (12 A in the present embodiment) by the charge control portion 45. That is, the target current value is set to a charging current of 2 C relative to a nominal capacity of 6 Ah of the battery pack 3 (in S5), and the charging is started with the charging current I1 (in S6). When the charging is started, the battery pack 3 is charged under the constant current control, with the charging current being kept at I1 (S9, S10, S11, and S12 are repeated). After the time t0, the battery temperature and the charging voltage increase with the charging, and the battery temperature reaches T1 at a time t1.

When the battery temperature reaches T1 at the time t1, the target current value is changed (set again) from I1 to I2 by the charge control portion 45, and thus the charging current decreases from I1 to I2 (in S10). After the charging current decreases to I2, the charging is continued under the constant current control, with the charging current being kept at I2 (S9, S10, S11, and S12 are repeated). The charging voltage drops once at the time t1 with the decrease of the charging current, but increases again after the time t1 with the continued charging. The battery temperature increases after the time t1, and reaches T2 at a time t2.

When the battery temperature reaches T2 at the time t2, the target current value is changed (set again) from I2 to I3 by the charge control portion 45, and thus the charging current decreases from I2 to I3 (in S10). After the charging current decreases to I3, the charging is continued under the constant current control, with the charging current being kept at I3 (S9, S10, S11, and S12 are repeated). The charging voltage drops again at the time t2 with the decrease of the charging current, but further increases after the time t2 with the continued charging. The battery temperature further increases after the time t2, and reaches T3 at a time t3.

When the battery temperature reaches T3 at the time t3, the target current value is changed (set again) from I3 to I4 by the charge control portion 45, and thus the charging current decreases from I3 to I4 (in S10). After the charging current decreases to I4, the charging is continued under the constant current control, with the charging current being kept at I4 (S9, S10, S11, and S12 are repeated). The charging voltage drops again at the time t3 with the decrease of the charging current, but further increases after the time t3 with the continued charging, and reaches a predetermined target charging voltage at a time t5. When the charging voltage reaches the target charging voltage, the charge control portion 45 shifts its control to the constant voltage control, and continues the charging, after the time t5, with the charging voltage being kept at the target charging voltage (S9, S10, S11, and S12 are repeated). The battery temperature further increases after the time t3, but does not reach T4, at the time t5, which is a next temperature threshold used to change the target current value.

After the time t5, from which the control is shifted to the constant voltage control, the charging is continued with the charging voltage being kept at the target charging voltage. During this, the charging current decreases, and the battery temperature also decreases due to the decrease of the charging current and the driving of the first fan 5 and the second fan 6 (S10, S11, and S12 are repeated). After that, when the charging current has a predetermined final current value or less at a time t7, the charge control portion 45 determines that the battery pack is fully charged (S11:Yes), and ends the charging (in S13). In FIG. 15A, when the battery temperature reaches a predetermined value, the charging current is changed regardless of the charging voltage (battery voltage).

As illustrated in FIG. 15B, in a case where the charging apparatus 1 of the present embodiment charges the battery pack 33, the target current value is set, at the time t0, to I1 (12 A in the present embodiment) by the charge control portion 45. That is, the target current value is set to a charging current of 2 C relative to a nominal capacity of 6 Ah of the battery pack 33 (in S5), and the charging is started with the charging current I1 (in S6). Unlike the case where the battery pack 3 is charged, in the case where the battery pack 33 is charged, the change of the target current value based on the battery temperature is not performed (operations of S9:YES and S10 are not performed), the battery pack is charged from the start of the charging to a time when the charging voltage reaches the target charging voltage (during the constant current control), with the charging current always being kept at I1 (S9, S11, and S12 are repeated). As described above, this is because the battery packs 3 and 33 have different allowable charging current values from each other in spite of having the same nominal capacity of 6 Ah, and have different breaking elements with different breaking characteristics. After the time t0, the battery temperature and the charging voltage both increase with the charging, and the charging voltage reaches a predetermined target charging voltage at the time t4.

After the time t4 at which the charging voltage reaches the target charging voltage, the charging is continued with the charging voltage being kept at the target charging voltage. During this, the charging current decreases, and the battery temperature also decreases due to the decrease of the charging current and the driving of the first fan 5 and the second fan 6 (S9, S11, and S12 are repeated). After that, when the charging current has a predetermined final current value or less at a time t6, the charge control portion 45 determines that the battery pack is fully charged (S11:Yes), and ends the charging (in S13).

In this manner, the charging of the battery pack 33 is performed from the start of the charging to a time when the control is shifted to the constant voltage control, with the charging current of 2 C; and thus, the charging of the battery pack 33 ends at the time t6 which is earlier than the time t7, which is the charge end time of the battery pack 3. In the present embodiment, the time period from the time t0 to the time t6, that is, the charge time period of the battery pack 33 by the charging apparatus 1 is about 30 minutes; the time period from the time t0 to the time t7, that is, the charge time of the battery pack 3 by the charging apparatus 1 is about 40 minutes.

Here, there will be described how the battery temperature, the charging voltage, and the charging current change with time when a conventional charging apparatus performs its charge control. FIG. 15C is a time chart illustrating how the battery temperature, the charging voltage, and the charging current change with time when the conventional charging apparatus performs its charge control.

As illustrated in FIG. 15C, the conventional charging apparatus does not perform the switch control of the charging current (operation of S10 of FIG. 12 is not performed), which is performed in the present embodiment in consideration of the breaking characteristic (breaking-characteristic curve) of the breaking element of the battery pack to be charged. In addition, in the conventional charging apparatus, the charging current is less than 2 C because, if the charging is performed with a charging current of 2 C or more, the breaking element operates in a short time and the charging is interrupted or ended. Specifically, the conventional charging apparatus uses a charging current of 8 A so that the breaking element does not operate. FIG. 15C indicates a case where a battery pack having the same nominal capacity as that of the battery pack 3 and 33 of the present embodiment is charged with, for example, the charging current of 8 A (charging current of less than 2 C).

In the conventional charging apparatus, in a case where the charging is started at the time t0, the target charging voltage is reached at the time t7, the charging ends at a time t8, and the charge time is about 45 minutes. Comparing the charging apparatus 1 with the conventional charging apparatus in terms of charge time of battery packs having the same capacity, the charging apparatus 1 takes about 30 minutes to charge the battery pack 33 and about 40 minutes to charge the battery pack 3, whereas the conventional battery pack takes about 45 minutes. Thus, the charge time of the battery pack 3 by the charging apparatus 1 and the charge time of the battery pack 33 by the charging apparatus 1 are both shorter than the charge time by the conventional charging apparatus.

In this manner, the charging apparatus 1 of the first embodiment of the present invention allows the battery pack 3 with the battery set 3A having the battery cells 3a to be directly charged from the commercial alternating-current power supply P, and allows the battery pack 3 whose nominal capacity is 6 Ah (5 Ah or more) to be charged with a charging current of 2 C (preferably, 2 C or more and 3 C or less). In other words, the battery pack whose nominal capacity is $\alpha$ Ah or more ($\alpha$ is a real number of 5 or more) can be charged with a charging current of $2\alpha$ or more (preferably, $2\alpha$ or more and $3\alpha$ or less). For this reason, the high-capacity battery pack can be charged in a short time of about 30 minutes.

The charging apparatus 1 can charge the battery pack 3 (battery pack 33) including the first breaking element 3F (second breaking element 33F) that allows the charging current to flow into the battery cells 3a when the breaking characteristic is satisfied, and cuts off the charging current when the breaking characteristic is not satisfied. In addition, the charging apparatus 1 includes the plurality of terminals 70 that can be connected to the battery pack 3 (battery pack 33), and the charge control portion 45 that identifies the breaking characteristic of the first breaking element 3F (second breaking element 33F), that is, the first breaking-characteristic curve A (second breaking-characteristic curve B); and performs the charge control so that the breaking characteristic is satisfied. As a result, the first breaking element 3F (second breaking element 33F) does not cut off the charging current, and thus the charging is not interrupted or ended. This allows the high-capacity battery pack 3 (battery pack 33) to be charged with a charging current of 2 C, and thus allows the high-capacity battery pack 3 (battery pack 33) to be charged in a short time.

In the present embodiment, the breaking characteristic of the battery pack 3 (battery pack 33) is satisfied when the charging current is smaller than an allowable maximum current value corresponding to a battery temperature of the battery cells 3a. The charging apparatus 1 includes the charge control portion 45 that acquires the battery temperature of the battery pack 3 (battery pack 33), the current setting circuit 56 that can set one current value from the plurality of current values (I1 to I5), and the current control circuit 57 that controls the charging current so as to charge the battery pack 3 (battery pack 33) with the one current value which has been set. The charge control portion 45 controls the charging current so as to charge the battery pack 3 (battery pack 33) with a charging current, depending on the battery temperature. The charging current has the maximum current value in current values, I1 to I5 which can be set, smaller than an allowable maximum current value corresponding to the battery temperature. In the present embodiment, when S9:No is determined in FIG. 12, that is, when the battery pack 33 is to be charged, the switch control of the charging current based on the breaking characteristic (S10) is not performed. However, the switch control of the charging current (S10) may be performed for the battery pack 33.

In the above-described configuration, for example, if I2 to I5 are smaller than an allowable maximum current value corresponding to the battery temperature in the plurality of current values (I1 to I5) that can be set, the battery pack 3 (battery pack 33) can be charged with the largest current value I2 among I2 to I5. Thus, the charge time can be more shortened.

In the present embodiment, since the allowable maximum current value of the breaking characteristic of the battery pack 3 (battery pack 33) decreases as the battery temperature increases, the charge control portion 45 makes the charging current smaller as the battery temperature increases. That is, since the charging apparatus 1 can change the charging current in accordance with the breaking characteristic of the first breaking element 3F (second breaking element 33F), the cutoff of the charging current by the first breaking element 3F (second breaking element 33F) can be reliably avoided. This can reliably shorten the charge time.

In the present embodiment, the charge control portion 45 controls the charging current such that, when the charge control portion 45 charges the battery pack with I1 and when the battery temperature becomes T1 or more, the charge control portion 45 charges the battery pack with I2 which is smaller than I1. In addition, T1 is set lower than a battery temperature which corresponds to an allowable maximum current value of I1, that is, Ta. With this operation, the cutoff of the charging current by the first breaking element 3F (second breaking element 33F) can be reliably avoided.

More specifically, when the charging is performed with the allowable maximum current value I1 which corresponds to Ta, the charging current is cut off by the first breaking element 3F when the battery temperature reaches Ta, but in the above-described configuration, since the current value is changed from I1 to I2 which is smaller than I1, when the battery temperature reaches T1 lower than Ta, the cutoff of the charging current by the breaking element can be reliably avoided.

In the present embodiment, the charge control portion 45 controls the charging current such that, when the charge control portion 45 charges the battery pack with I2 and when the battery temperature becomes T2 or more which is higher than T1, the charge control portion 45 charges the battery pack with I3 which is smaller than I2. In addition, T2 is set lower than a battery temperature which corresponds to an allowable maximum current value of I2, that is, Tb; and is set higher than Ta. With this operation, the cutoff of the charging current by the first breaking element 3F can be reliably avoided; and the charge time can be more shortened.

More specifically, since the temperature threshold T2 used to change the charging current from I2 to I3, which is smaller than I2, is lower than Tb, the operation of the first breaking element 3F can be reliably avoided. In addition, T2 is higher than Ta, that is, is not an extremely lower value than Tb. If T2 is an extremely lower value than Tb, such as a value lower than Ta, the operation of the first breaking element 3F can be reliably avoided, but a timing at which the charging current is changed from I2 to I3, which is smaller than I2, becomes earlier, and thus the charge time period cannot be sufficiently shortened. In contrast, in the present embodiment, since T2 is higher than Ta, the timing at which the charging current is changed to a smaller current value can be delayed, and thus the charge time period can be more shortened. In addition, the charging apparatus 1 can charge a plurality of battery packs having different voltages and different nominal capacities, one by one. Thus, since the single charging apparatus 1 can charge the plurality of battery packs, other charging apparatuses are not necessary. Furthermore, since battery packs having a nominal capacity of less than 5 Ah can also be charged with a charging current of 2 C or more, charge time period of low-capacity (less than 5 Ah) battery packs can also be shortened.

Next, a modification of the first embodiment will be described with reference to FIGS. 16 to 20.

The charging apparatus 1 of the present modification uses a radiation plate 80 in place of the radiation members 46 and 47. Since other configurations are the same as those of the first embodiment, the detailed description thereof is omitted.

The radiation plate 80 defines an air passage of the air which is taken in from the inlet 24a and which serves as a cooling airflow, and guides the air toward the outlets 22a and 23a.

Figure 16:
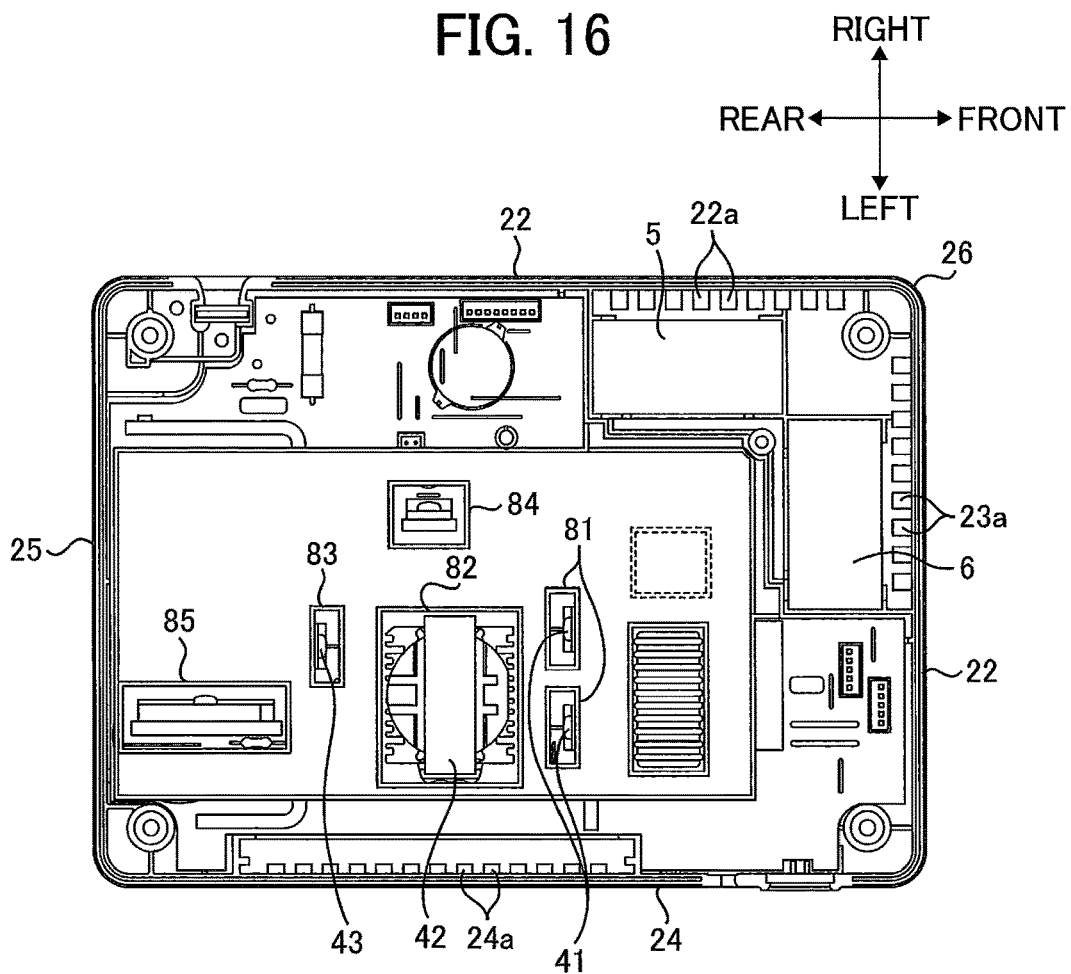
FIG. 16 Plan view showing the interior of the charging apparatus according to a modification of the first embodiment.
Figure 17:
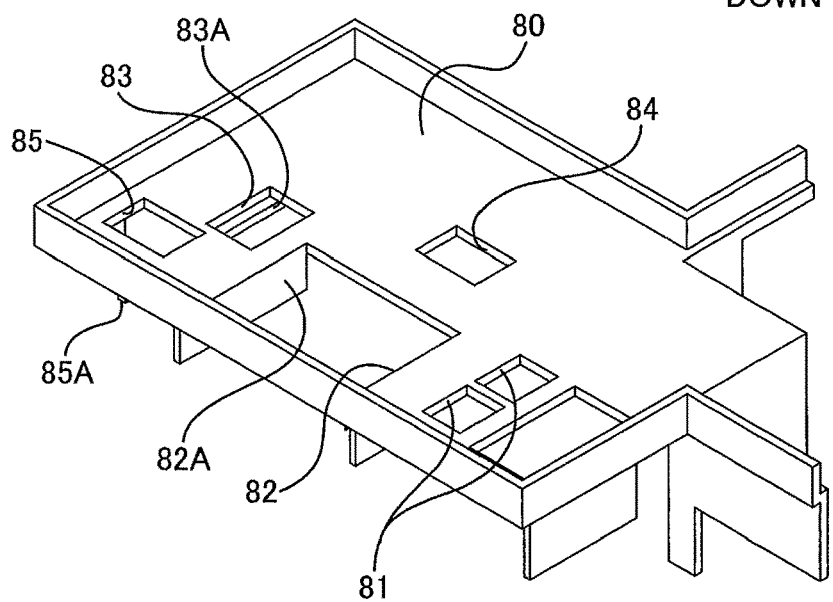
FIG. 17 Perspective view showing a radiation plate in the modification shown in FIG. 16.
Figure 18:
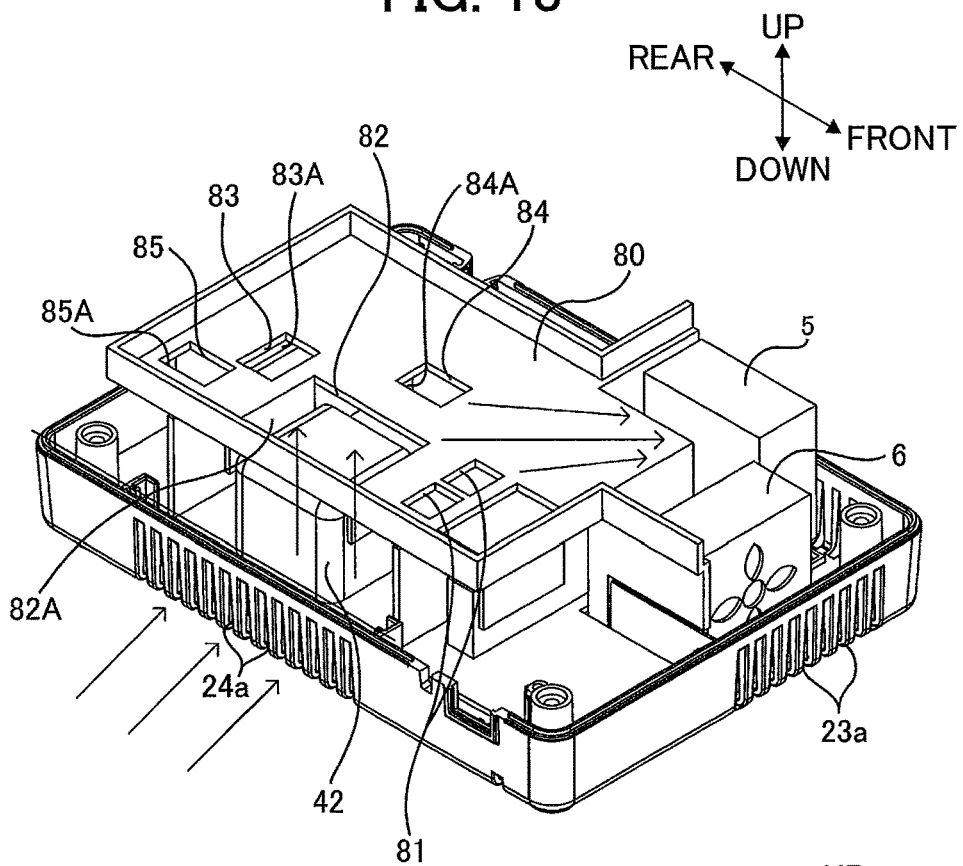
FIG. 18 Perspective view showing relationship between the radiation plate shown in FIG. 16 and an air passage defined by the radiation plate.

The radiation plate 80 has a size and a shape determined so that the radiation plate 80 covers heat-producing elements such as the diode 41, the transformer 42, and the FET 43, as illustrated in FIGS. 16 to 18, when mounted in the case 2 of the charging apparatus 1 as illustrated in FIG. 16. The radiation plate 80 is disposed between the top face 21 of the case 2 and the components of the diode 41, the transformer 42, and the FET 43.

The radiation plate 80 is provided with openings 81, 82, 83, 84, and 85. These openings are placed in positions corresponding to the diode 41, the transformer 42, and the FET 43; and have shapes corresponding to outer shapes of those components. In addition, ribs 81A, 82A, 83A, 84A, and 85A are respectively formed from the vicinities of edges of the openings 81, 82, 83, 84, and 85, toward the board 40. For example, the opening 82 formed for the transformer 42 and the rib 82A of the opening 82 define an air passage for the transformer 42 extending from a board-side portion of the transformer 42 to the opening 82. In addition, the diode 41, the opening 81, and the rib 81A define an air passage for the diode 41. Similarly, other air passages are defined for other heat-producing elements including the FET 43.

Thus, when the radiation plate 80 is mounted in the case 2, the openings 81, 82, 83, 84, and 85 and the ribs 81A, 82A, 83A, 84A, and 85A formed around edges thereof surround the corresponding heat-producing elements spaced-apart therefrom. That is, the heat-producing elements are surrounded by the corresponding ribs 81A to 85A.

Figure 19:
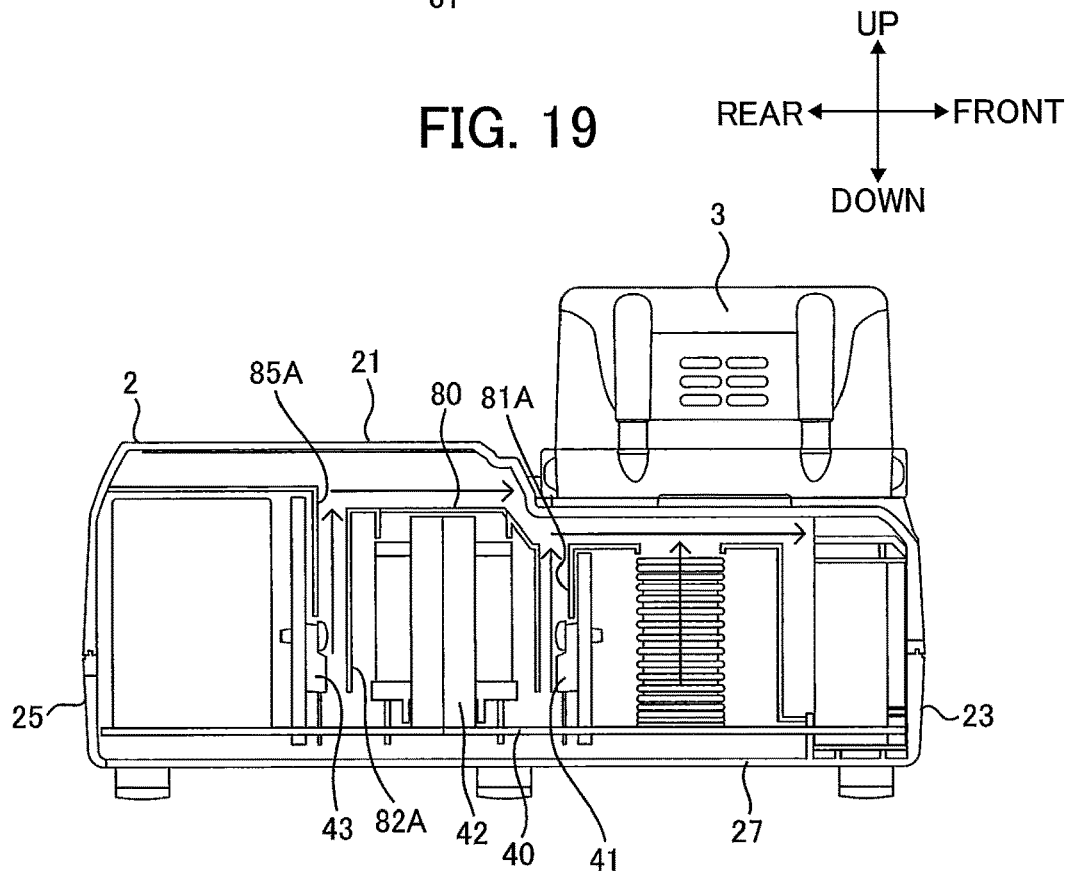
FIG. 19 View explaining an airflow of a cooling air in the charging apparatus shown in FIG. 16 when charging the battery pack.
Figure 20:
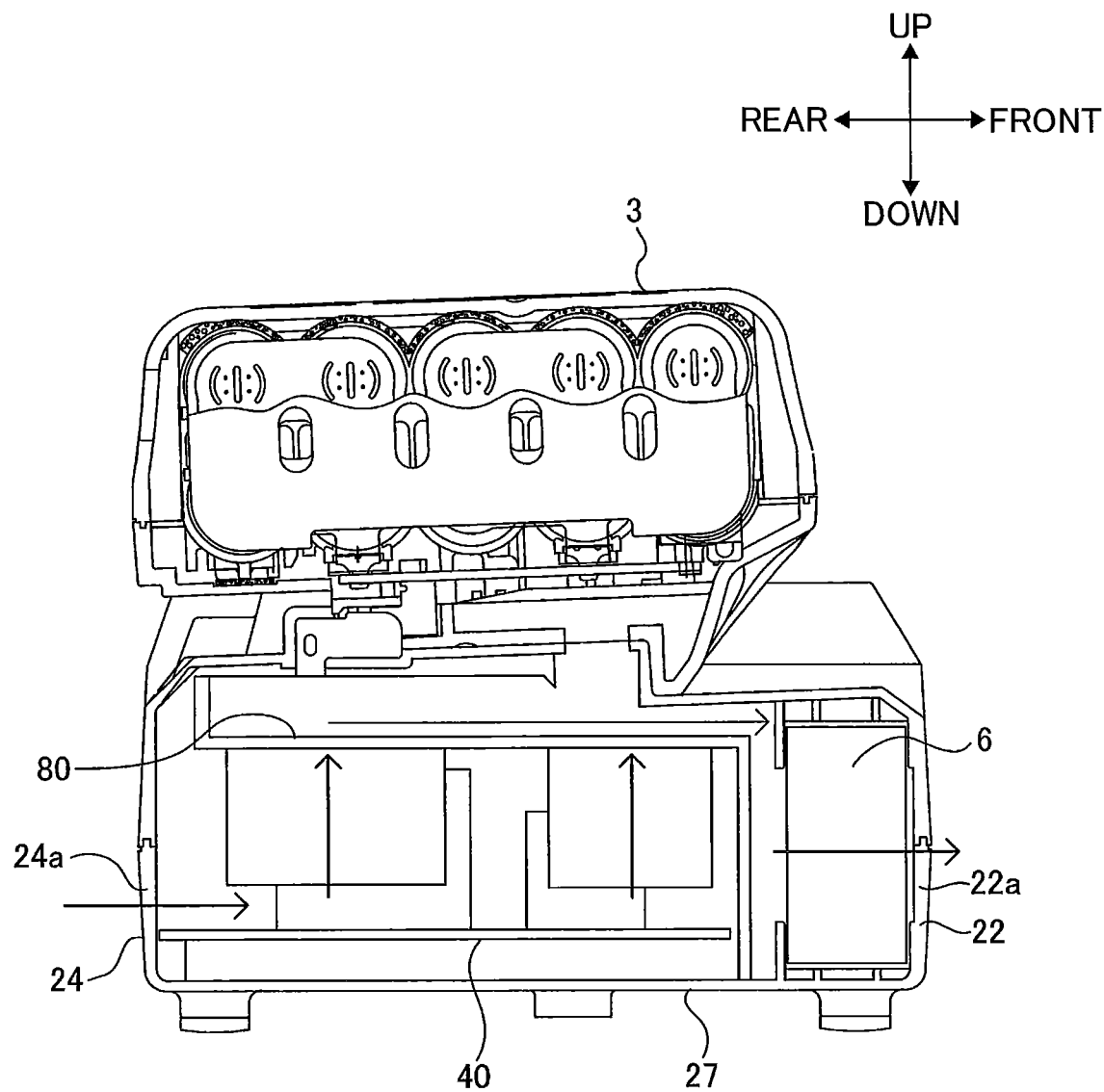
FIG. 20 View explaining the flow of the cooling airflow in the charging apparatus shown in FIG. 16 when charging the battery pack.

Thus, when the fans 5 and 6 are driven, a cooling air passage is formed, as illustrated in FIGS. 18 to 20, which extends from the inlet 24a, through the air passages formed around the heat-producing elements and through the openings, to the outlets 22a and 23a. The first cooling airflow and the second cooling airflow pass through the cooling air passage, and cool the heat-producing elements of the diode 41, the transformer 42, and the FET 43. In the vicinity of each heat-producing element, an air passage is formed between a side face of each heat-producing element and a corresponding rib, and a cooling airflow flows along the side face of the heat-producing element toward the opening. The cooling airflow having passed through the opening flows along the radiation plate 80 toward the outlets 22a and 23a, and is discharged out of the case 2. Thus, since the present modification is configured so that the cooling airflow is concentrated in a space around each of the heat-producing elements by the ribs, the heat-producing elements are efficiently cooled and the temperature rise of the whole charging apparatus 1 is suppressed.

Next, a second embodiment of the present invention will be described with reference to FIGS. 21 and 22.

Figure 21:
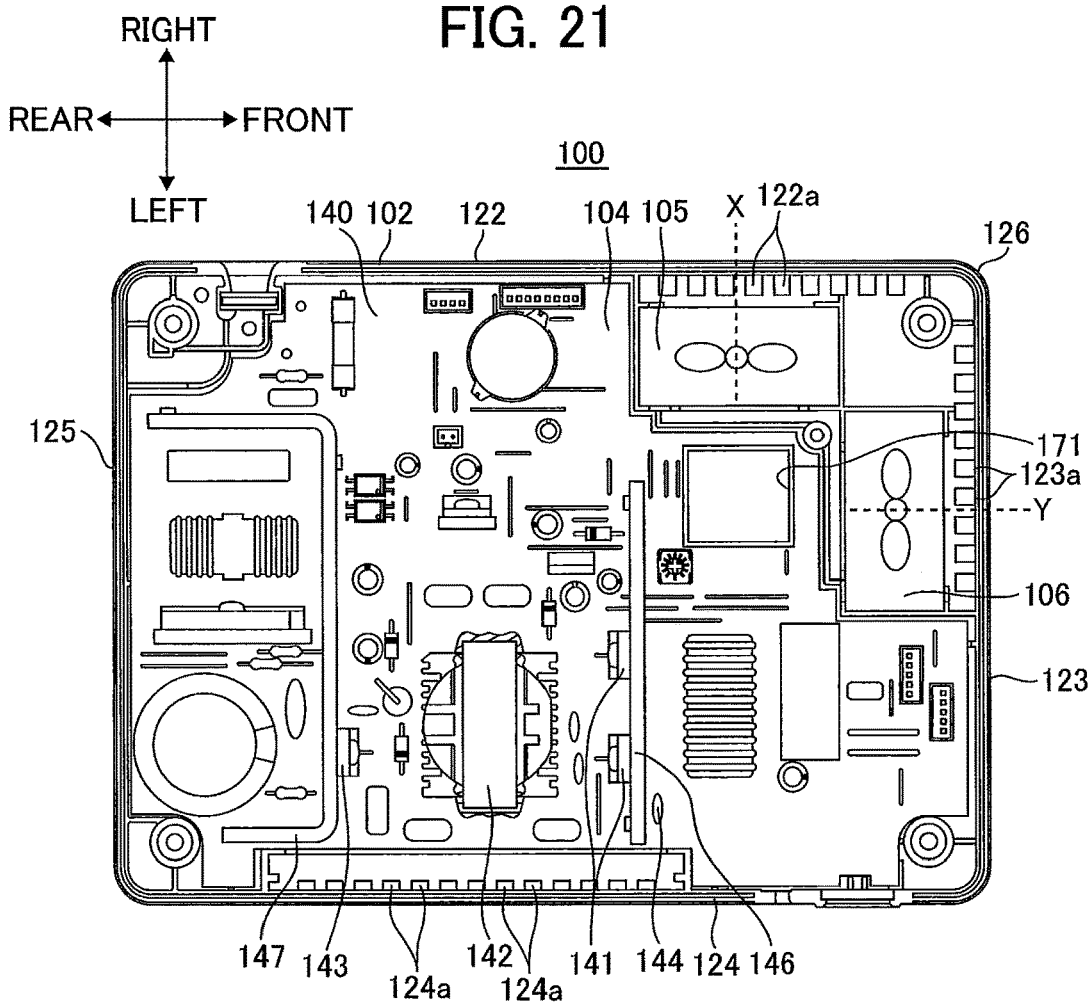
FIG. 21 Plan view showing the charging circuit portion in the case of the charging apparatus according to a second embodiment of the present invention.
Figure 22:
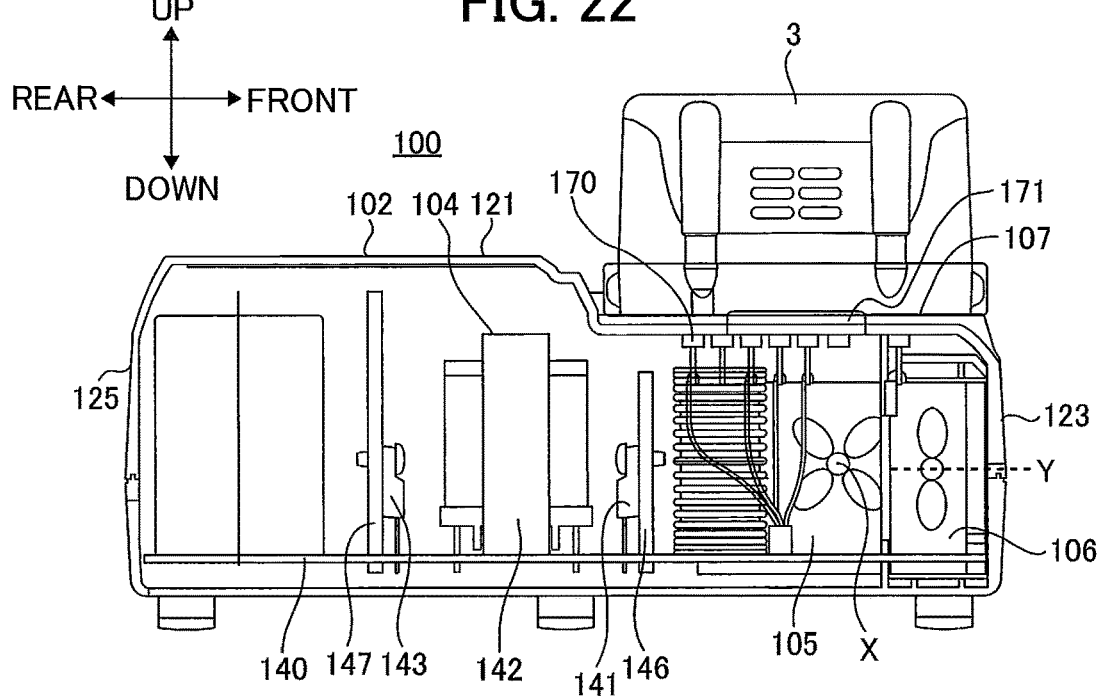
FIG. 22 Side view showing the charging apparatus shown in FIG. 21.

Referring to FIG. 21, the charging apparatus 100 includes, in a case 102, a charge circuit portion 104 for charging the battery pack 3, and a first fan 105 and a second fan 106 for cooling the charge circuit portion 104 and the battery pack 3.

The case 102 is substantially cuboidal, and includes a top face 121. A front side portion of the top face 121 is provided with a battery attachment portion 107 to which the battery pack 3 is attached to be charged. The battery attachment portion 107 is provided with a plurality of terminals 170 used to charge the battery pack 3, and with an opening 171 through which an airflow flows for cooling the battery pack 3. In addition, the case 102 also includes four side faces 122, 123, 124, and 125 which surround the top face 121. The side faces 122 and 123, which are adjacent to each other, are joined with each other via a corner portion 126. The side faces 122 and 124 face each other, and the side faces 123 and 125 face each other.

The first fan 105 is disposed in the case 102, near the corner portion 126 and the opening 171; and is disposed near the side face 122, facing the side face 122. When driven, the first fan 105 generates a first cooling airflow toward a rotational-axis direction X. A portion of the side face 122 which the first fan 105 faces is provided with a first outlet 122a constituted by a plurality of ventilating windows. When driven, the first fan 105 takes in the air from the inlet 124a and generates a first cooling airflow toward the first outlet 122a. The first cooling airflow is discharged from the case 102 through the first outlet 122a.

The second fan 106 is disposed in the case 102, near the corner portion 126 and the opening 171; and is disposed near the side face 123, facing the side face 123. When driven, the second fan 106 generates a second cooling airflow toward a rotational-axis direction Y. In this case, the second fan 106 is disposed such that the rotational-axis direction Y crosses the rotational-axis direction X. A portion of the side face 123 which the second fan 106 faces is provided with a second outlet 123a constituted by a plurality of ventilating windows. When driven, the second fan 106 takes in the air from the inlet 124a and generates a second cooling airflow toward the second outlet 123a. The second cooling airflow is discharged from the case 102 through the second outlet 123a.

The inlet 124a is formed, as a plurality of ventilating windows, in a predetermined area of the side face 124 of the case 102. Thus, when the first fan 105 and the second fan 106 are driven, the air is taken into the case 102 through the inlet 124a.

The charge circuit portion 104 has a configuration in which components, such as a diode 141, a transformer 142, an FET 143, a temperature detecting element 144, and the charge control portion 45, are mounted on a board 140; and charges the battery pack 3 via the terminals 170, by using electric power supplied from, for example, a commercial alternating-current power supply. When a large amount of current per unit time flows in the charge circuit portion 104 for quick charging, the diode 141, the transformer 142, and the FET 143 are apt to produce heat, and become so-called heat-producing elements. To protect these components from heat and facilitate them to dissipate heat, radiation members 146 and 147 are respectively attached to the diode 141 and the FET 143, for example.

The diode 141, the transformer 142, and the FET 143 are disposed in the vicinity of the inlet 124a, and directly exposed to the air which is taken in from the inlet 124a into the case 102.

The case 2 has the opening 171 in the top face 121; and has the first outlet 122a, the second outlet 123a, and the inlet 124a in the side faces. The air flow in the case 102 is formed mainly between the opening 171 and the first outlet 122a and the second outlet 123a, and between the inlet 124a and the first outlet 122a and the second outlet 123a. The radiation members 146 and 147 are shaped and positioned in the case 102 such that the air passage formed between the inlet 124a and the first outlet 122a and the second outlet 123a contains at least one, preferably all, of the diode 141, the transformer 142, and the FET 143. The diode 141 and the FET 143 are attached to the radiation members 146 and 147 so that the first and second cooling airflows cool the diode 141 and the FET 143 in the case 102. Here, each of the radiation members 146 and 147 does not have the second radiation portion.

The temperature detecting element 144 may be a thermistor, and detects the temperature of the interior of the case 102.

The charge control portion 45 controls charging of the battery pack 3 performed by the charge circuit portion 104, and controls rotation of the first fan 105 and the second fan 106, while monitoring the temperature of the battery pack 3.

Because the two fans 105 and 106 are driven in the case 102 when the battery pack 3 is charged, the cooling airflow taken in from the inlet 124a into the case 102 cools the diode 141, the transformer 142, and the FET 143 by passing through the vicinity of those heat-producing elements, and is discharged from the outlets 122a and 123a. As a result, the temperature rise of the diode 141, the transformer 142, and the FET 143 can be prevented, and the charging apparatus 100 can be efficiently cooled.

In addition, since the radiation members 146 and 147 define the air passage such that the air passage surrounds the diode 141, the transformer 142, and the FET 143, and since the first cooling airflow and the second cooling airflow flow from one end side of the radiation members 146 and 147, which is near the inlet, toward the other end side, the diode 141, the transformer 142, and the FET 143, which need to be cooled, can be efficiently cooled. Furthermore, since the diode 141 and the FET 143 are respectively mounted on the radiation members 146 and 147, the diode 141 and the FET 143 are exposed to the cooling airflow which flows along the radiation members 146 and 147, and thus efficiently cooled.

Furthermore, since the first fan 105 and the second fan 106 are disposed such that the rotational-axis direction of the first fan 105 crosses the rotational-axis direction of the second fan 106, and since the first fan 105 and the second fan 106 are disposed near the corner portion 126 of the case 102, a large space for the charge circuit portion 104 can be secured in the case 102. In addition, a large space through which the cooling airflow passes can be secured.

Furthermore, since the diode 141, the transformer 142, and the FET 143 are disposed in the vicinity of the inlet 124a, those components are efficiently cooled by the air which has just been taken in from the inlet 124a, as a cooling airflow, and which is still not warmed. The flowing direction in which the cooling airflow flows may be reversed. That is, the air may be taken in from the outlets 122a and 123a which serve as inlets, and may be discharged from the inlet 124a which serves as an outlet.

Next, a modification of the second embodiment will be described with reference to FIGS. 23 to 28.

Figure 23:
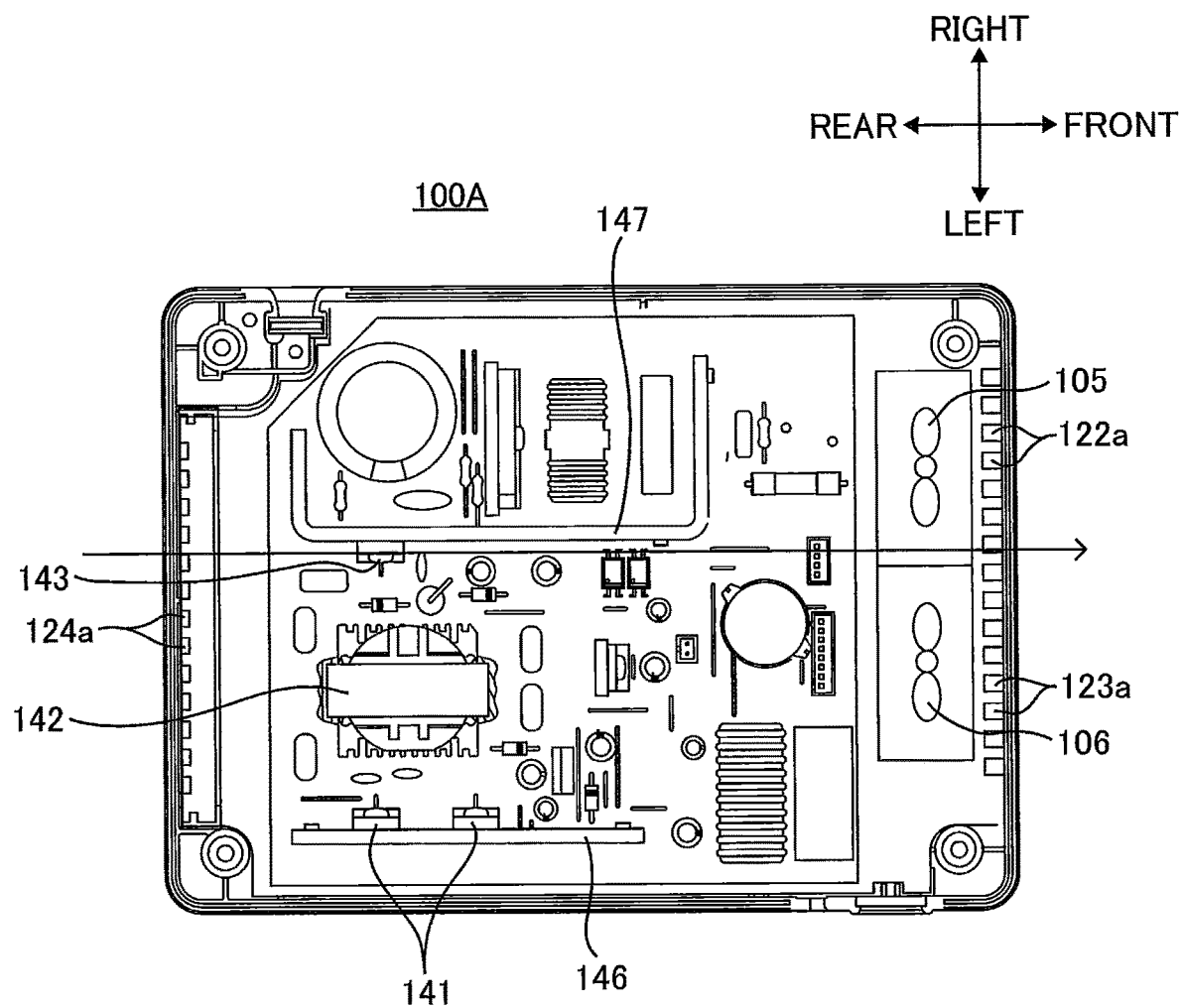
FIG. 23 Top view showing a modification of the second embodiment.

FIG. 23 illustrates a charging apparatus 100A in which the first fan 105 and the second fan 106 are disposed parallel to each other near the side face 123 of the cuboidal case 102. The inlet 124a is formed in the side face 125 which faces the side face 123. Since other components are the same as those of the second embodiment, the detailed description thereof is omitted. When the first fan 105 and the second fan 106 are driven, the first cooling airflow and the second cooling airflow flow from the inlet 124a toward the outlets 122a and 123a, and cool the diode 141, the transformer 142, and the FET 143 disposed in the air passage of the first cooling airflow and the second cooling airflow. That is, the radiation members 146 and 147 are disposed, extending from the inlet 124a toward the outlets 122a and 123a (in the front-back direction in the figure) so as to guide the cooling airflows; and the transformer 142 is disposed between the radiation members 146 and 147. The two fans 105 and 106 are provided in the case 102 to increase the volume of air and a space through which the cooling airflows flow, and thereby the cooling effect of not only the heat-producing elements 141, 142, and 143 but also the charging apparatus 100A can be increased.

Figure 24:
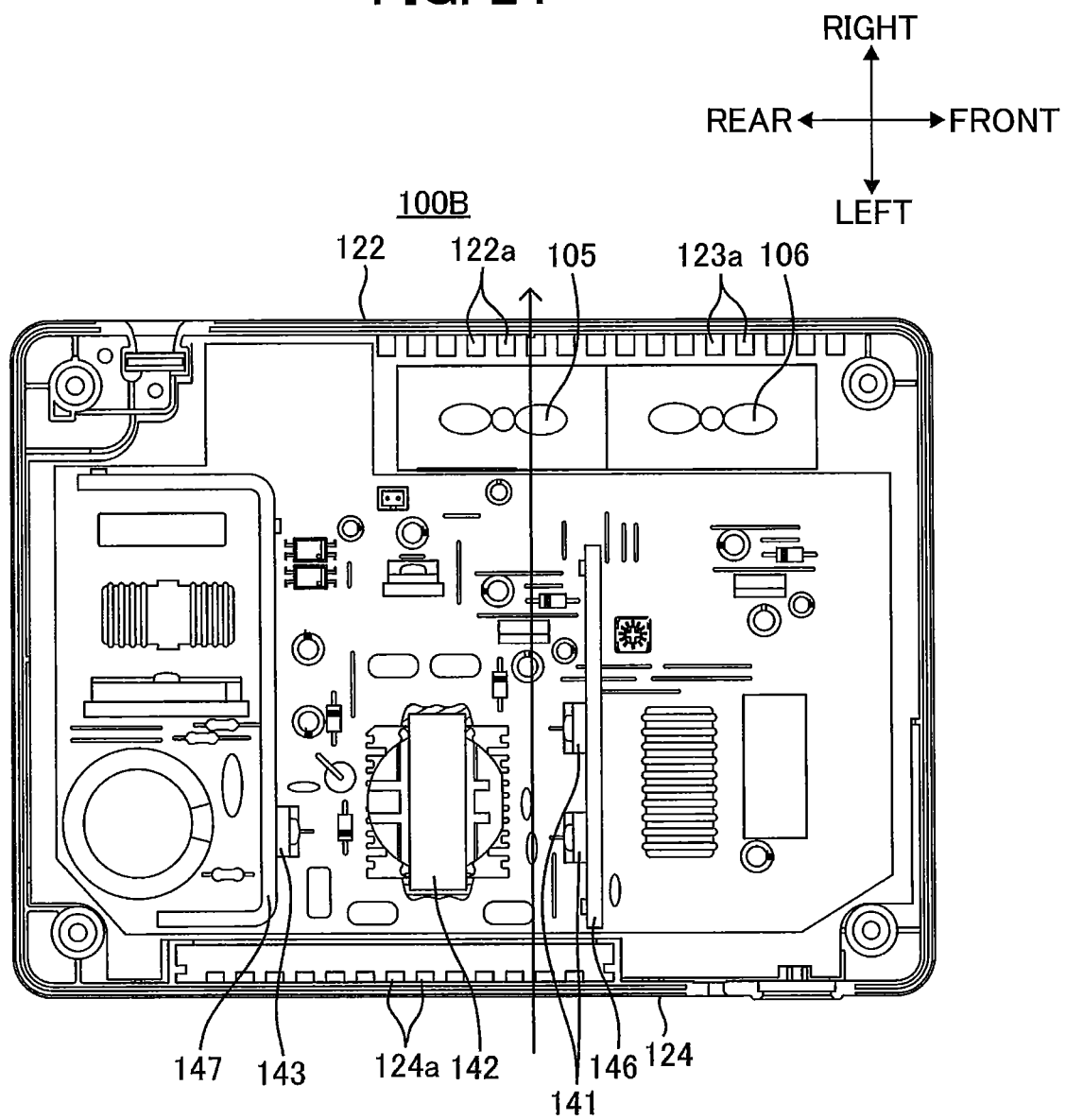
FIG. 24 Top view showing a modification of the second embodiment.

FIG. 24 illustrates a charging apparatus 100B in which the first fan 105 and the second fan 106 are disposed parallel to each other near the side face 122 of the case 102. The inlet 124a is formed in the side face 124 which faces the side face 122. Since other components are the same as those of the second embodiment, the detailed description thereof is omitted. When the first fan 105 and the second fan 106 are driven, the first cooling airflow and the second cooling airflow flow from the inlet 124a toward the outlets 122a and 123a, and cool the diode 141, the transformer 142, and the FET 143 disposed in the air passage of the first cooling airflow and the second cooling airflow. That is, the radiation members 146 and 147 are disposed, extending from the inlet 124a toward the outlets 122a and 123a (in the right-left direction in the figure) so as to guide the cooling airflows; and the transformer 142 is disposed between the radiation members 146 and 147. The two fans 105 and 106 are provided in the case 2 to increase the volume of air and a space through which the cooling airflows flow, and thereby the cooling effect of not only the heat-producing elements 141, 142, and 143 but also the charging apparatus 100B can be increased. The direction in which the cooling airflow flows may be reversed. That is, the air may be taken in from the outlets 122a and 123a which serve as inlets, and may be discharged from the inlet 124a which serves as an outlet.

Figure 25:
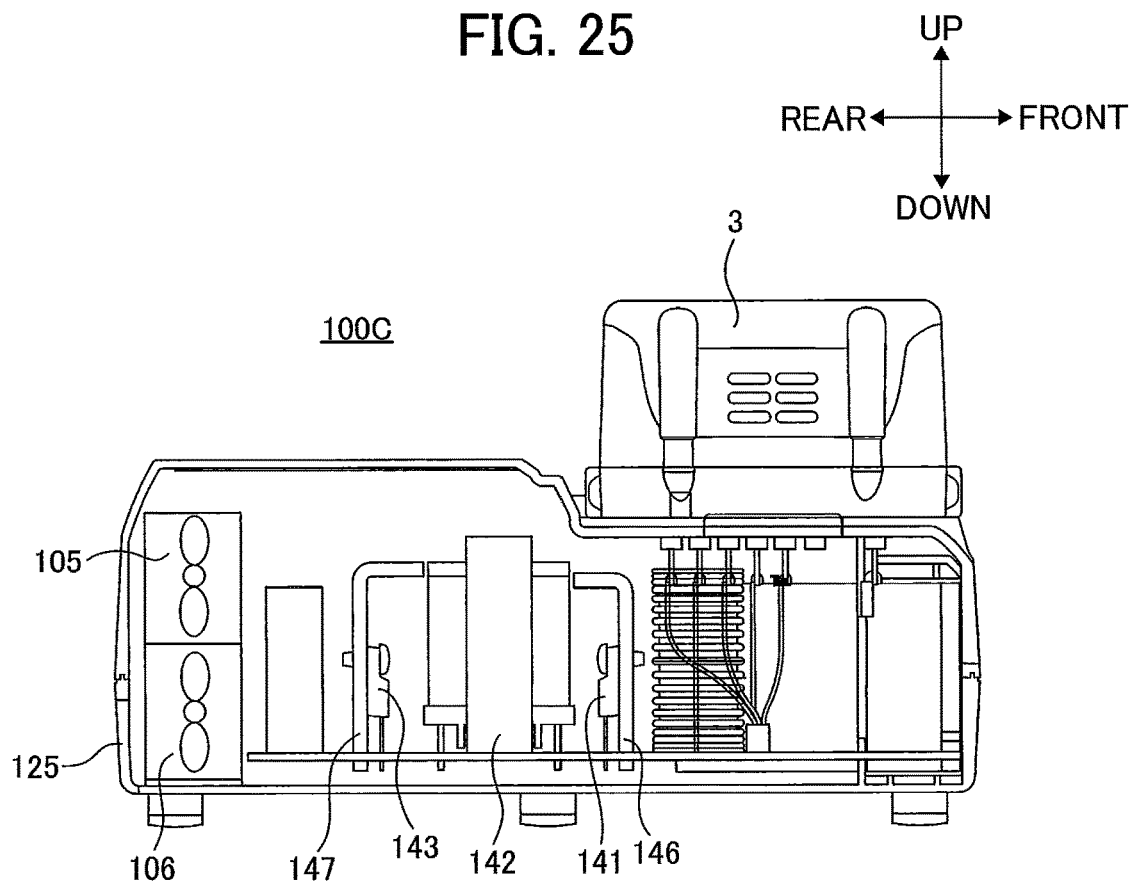
FIG. 25 Side view showing a modification of the second embodiment.

FIG. 25 illustrates a charging apparatus 100C in which the first fan 105 and the second fan 106 are disposed parallel to each other in a vertical direction near the side face 125 of the case 102. Outlets which correspond to the fans 105 and 106 are formed in the side face 125 located near the fans 105 and 106, and an inlet is formed in the side face 123 which faces the side face 125. Since other components are the same as those of the second embodiment, the detailed description thereof is omitted. When the first fan 105 and the second fan 106 are driven, the first cooling airflow and the second cooling airflow flow from the inlet toward the outlets, and cool the diode 141, the transformer 142, and the FET 143 disposed in the air passage of the first cooling airflow and the second cooling airflow. The two fans 105 and 106 are provided in the case 2 to increase the volume of air, and thereby the cooling effect of not only the heat-producing elements 141, 142, and 143 but also the charging apparatus 100C can be increased. In FIG. 25, the radiation members 146 and 147 are disposed so as to block a cooling air passage extending from the inlet 124a toward the outlets 122a and 123a. However, if the radiation members 146 and 147 are disposed so as to guide the cooling airflows as illustrated in FIG. 23, the cooling effect can be increased. In this case, if the transformer 142 is disposed near the inlet 124a and between the radiation members 146 and 147, the cooling effect of not only the diode 141 and the FET 143 but also the transformer 142 can be increased. The flowing direction in which the cooling airflow flows may be reversed. That is, the air may be taken in from the outlets 122a and 123a which serve as inlets, and may be discharged from the inlet 124a which serves as an outlet.

Figure 26:
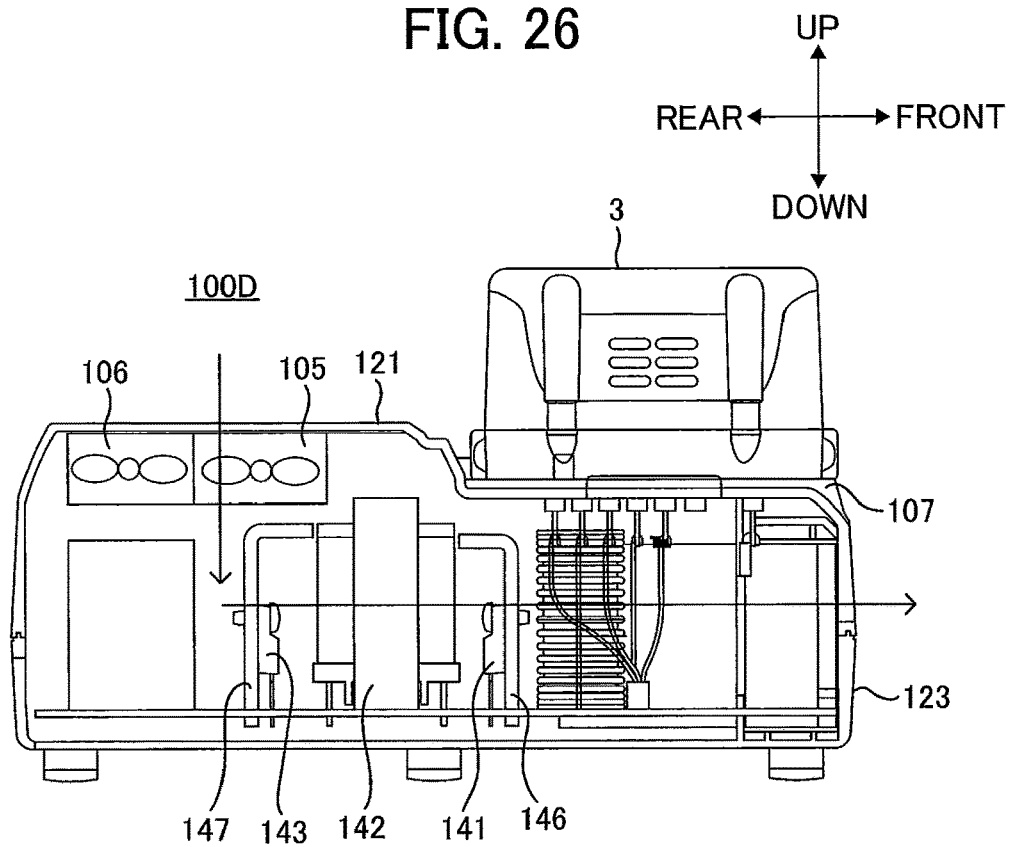
FIG. 26 Side view showing a modification of the second embodiment.

FIG. 26 illustrates a charging apparatus 100D in which the first fan 105 and the second fan 106 are disposed parallel to each other near a position of the top face 121 of the case 102, which is out of the battery attachment portion 107. Inlets which correspond to the fans 105 and 106 are formed in the top face 121 located near the fans 105 and 106, and an outlet is formed in the side face 123. Since other components are the same as those of the second embodiment, the detailed description thereof is omitted. When the first fan 105 and the second fan 106 are driven, the first cooling airflow and the second cooling airflow flow from the inlets toward the outlets, and cool the diode 141, the transformer 142, and the FET 143 disposed in the air passage of the first cooling airflow and the second cooling airflow. The two fans 105 and 106 are provided in the case 102 to increase the volume of air, and thereby the cooling effect of not only the heat-producing elements 141, 142, and 143 but also the charging apparatus 100D can be increased. In addition, since the two fans 105 and 106 are disposed along the top face 121, a space where the board 140 is disposed can be secured. In another case, the two fans 105 and 106 may be disposed, one disposed along the top face 121 and the other disposed along the side face 122 or 124. As is in FIG. 25, if the radiation members 146 and 147 are disposed along the cooling air passage, the cooling effect can be more increased. The flowing direction in which the cooling airflow flows may be reversed. That is, outlets may be formed in the top face in the vicinity of the fans, and the outlet 123a of the side face 123 may serve as an inlet to guide the air in the case 102.

Figure 27:
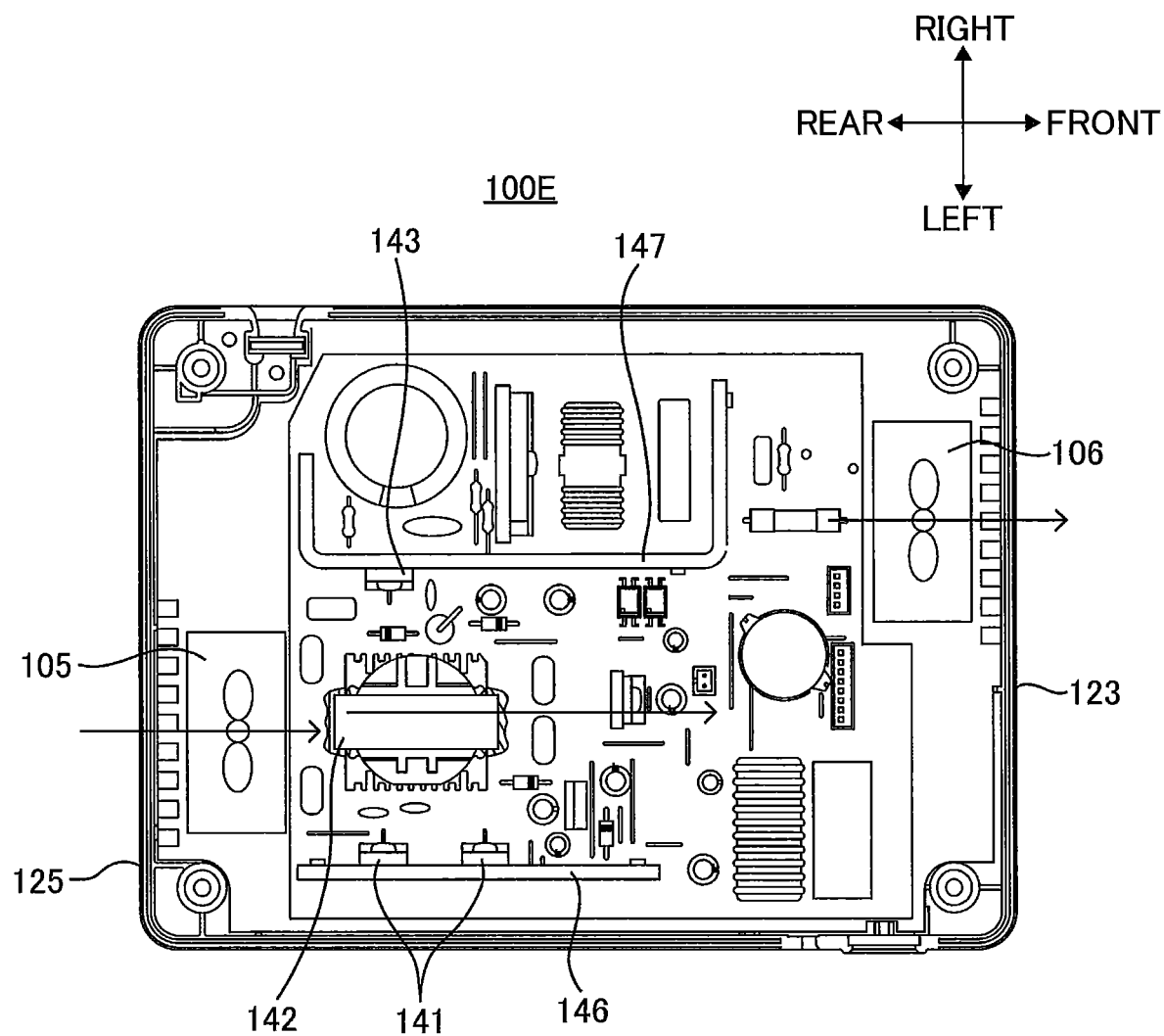
FIG. 27 Top view showing a modification of the second embodiment.

FIG. 27 illustrates a charging apparatus 100E in which the first fan 105 is disposed in the vicinity of the side face 125 and the second fan 106 is disposed in the vicinity of the side face 123. That is, the first fan 105 and the second fan 106 are disposed, separated from each other, with the charge circuit portion 104 being interposed between the first fan 105 and the second fan 106. An inlet is formed in the side face 125, and an outlet is formed in the side face 123. Since other components are the same as those of the second embodiment, the detailed description thereof is omitted. When the first fan 105 and the second fan 106 are driven, the first cooling airflow and the second cooling airflow flow from the inlet toward the outlet, and cool the diode 141, the transformer 142, and the FET 143 disposed in the air passage of the first cooling airflow and the second cooling airflow. By providing the two fans 105 and 106 in the case 102, and driving one of them for intake and the other for discharge to increase the volume of air, the cooling effect of not only the heat-producing elements 141, 142, and 143 but also the charging apparatus 100E can be increased.

Figure 28:
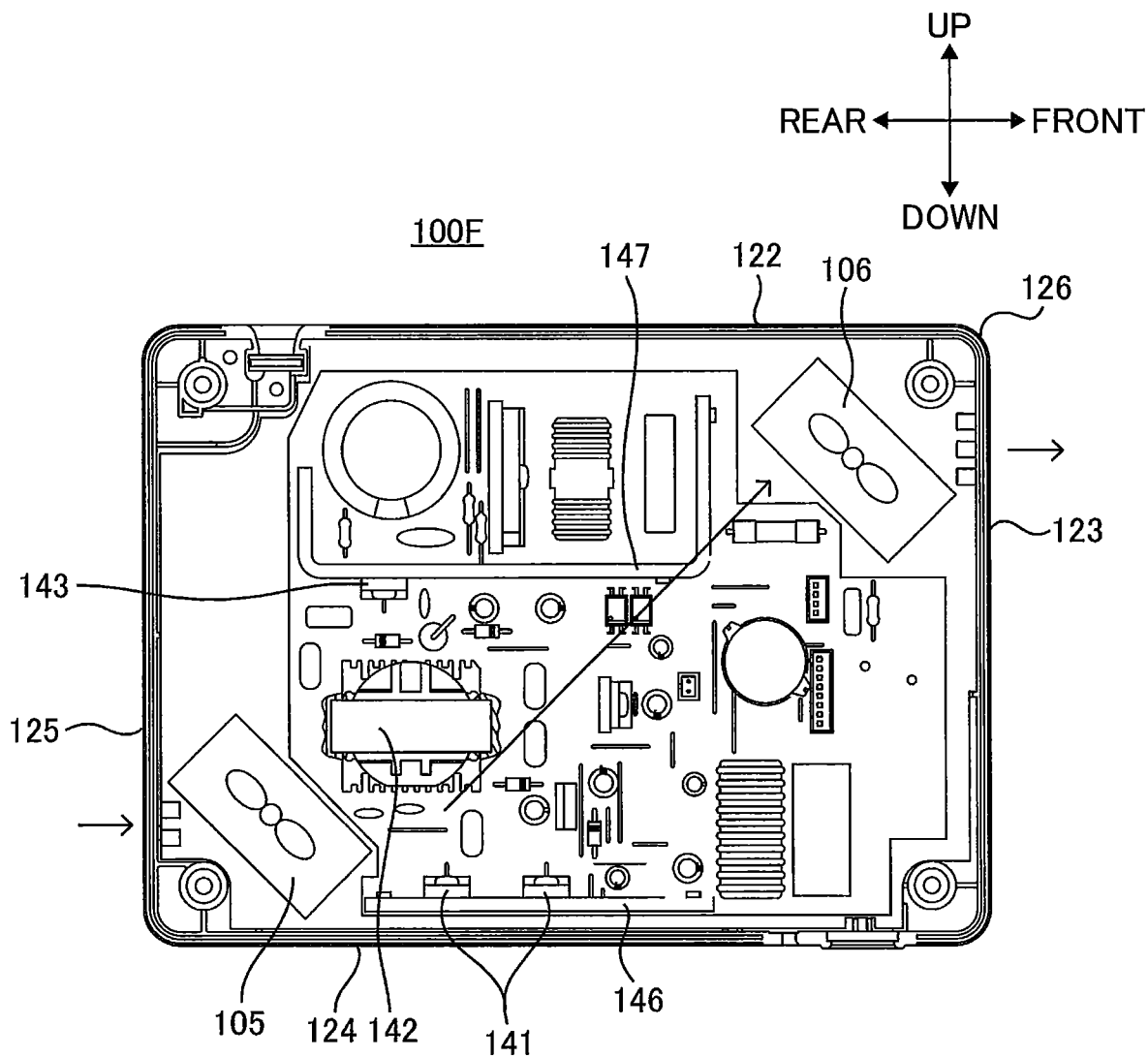
FIG. 28 Top view showing a modification of the second embodiment.

FIG. 28 illustrates a charging apparatus 100F in which the first fan 105 is disposed in the vicinity of a corner portion between the side face 124 and the side face 125 and the second fan 106 is disposed in the vicinity of the corner portion 126. That is, the first fan 105 and the second fan 106 are disposed, separated from each other, with the charge circuit portion 104 being interposed between the first fan 105 and the second fan 106. An inlet is formed in the side face 125, and an outlet is formed in the side face 123. Since other components are the same as those of the second embodiment, the detailed description thereof is omitted. When the first fan 105 and the second fan 106 are driven, the first cooling airflow and the second cooling airflow flow from the inlet toward the outlet, and cool the diode 141, the transformer 142, and the FET 143 disposed in the air passage of the first cooling airflow and the second cooling airflow. By providing the two fans 105 and 106 at both corners in a diagonal direction in the case 2, and driving one of them for intake and the other for discharge to increase the length of the air passage of the cooling airflow which flows in the case 2, the cooling effect of not only the heat-producing elements 141, 142, and 143 but also the charging apparatus 100F can be increased. If the radiation members 146 and 147 are disposed along the cooling air passage (arrow in the figure), the cooling effect can be more increased. The flowing direction in which the cooling airflow flows may be reversed. That is, the air may be introduced in the case 102 from the side face 123, and discharged from the side face 125.

Next, a charging apparatus 200 of a third embodiment will be described with reference to FIG. 29. In the charging apparatus 200, the same members as those of the first embodiment are given the same reference symbols, and different features will be mainly described below.

Figure 29:
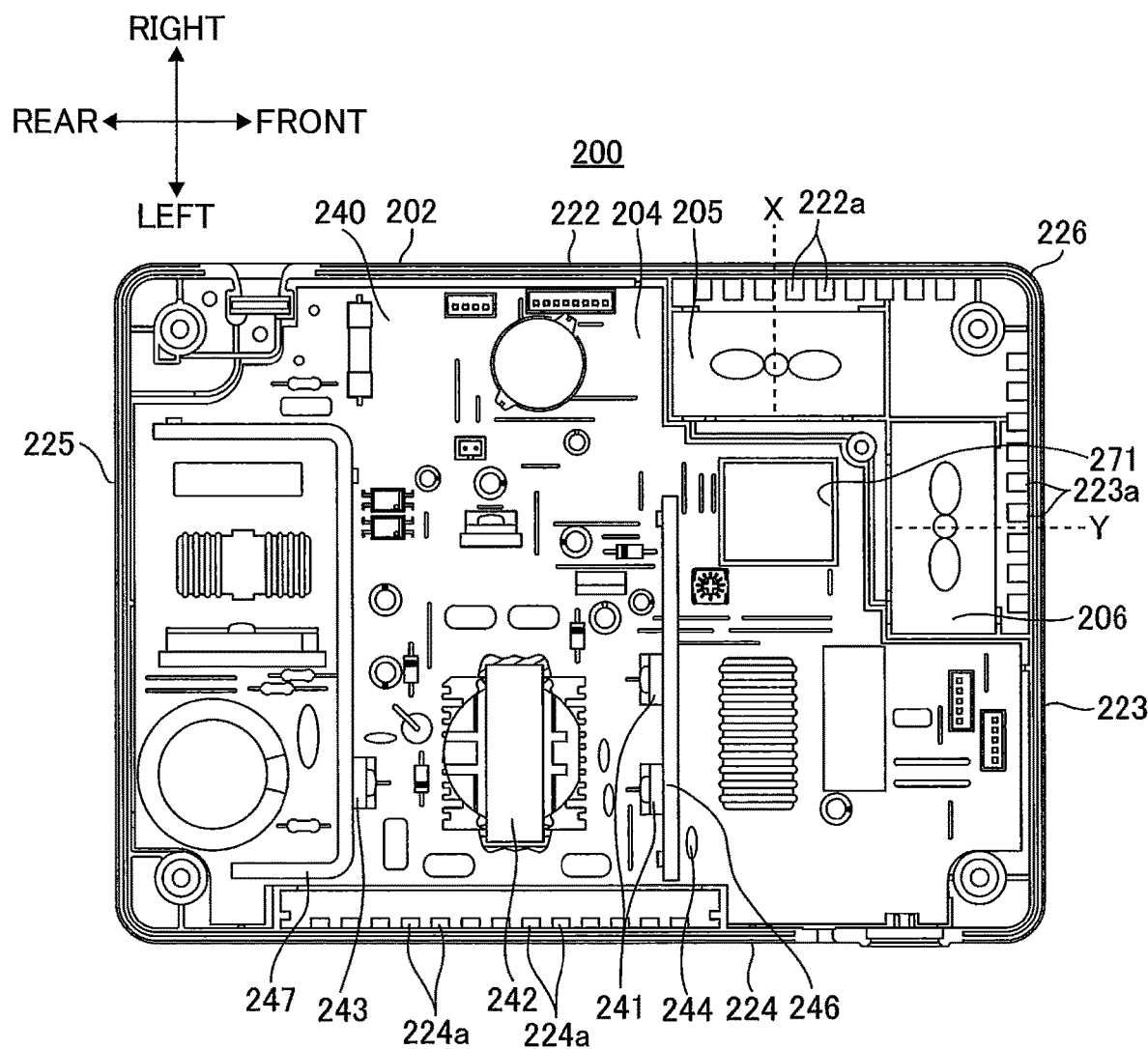
FIG. 29 Plan view of the charging apparatus according to a third embodiment of the present invention.

Referring to FIG. 29, the charging apparatus 200 includes, in a case 202, a charge circuit portion 204 for charging the battery pack 3, and a first fan 205 and a second fan 206 for cooling the charge circuit portion 204 and the battery pack 3.

The case 202 is substantially cuboidal, and includes a top face 221. A front side portion of the top face 221 is provided with a battery attachment portion 207 to which the battery pack 3 is attached to be charged. The battery attachment portion 207 is provided with a plurality of terminals 270 used to charge the battery pack 3, and with an opening 271 through which an airflow flows for cooling the battery pack 3. In addition, the case 202 also includes four side faces 222, 223, 224, and 225 which surround the top face 221. The side faces 222 and 223, which are adjacent to each other, are joined with each other via a corner portion 226.

The first fan 205 is disposed in the case 202, near the corner portion 226 and the opening 271; and is disposed facing the side face 222. A portion of the side face 222 which the first fan 205 faces is provided with a first ventilating opening 222a constituted by a plurality of ventilating windows. When driven, the first fan 205 introduces air from the first ventilating opening 222a in the case 102 and generates a first cooling airflow toward a rotational-axis direction X.

The second fan 206 is disposed in the case 202, near the corner portion 226 and the opening 271; and is disposed facing the side face 223. A portion of the side face 223 which the second fan 206 faces is provided with a second ventilating opening 223a constituted by a plurality of ventilating windows. When driven, the second fan 206 introduces air from the second ventilating opening 223a in the case 102 and generates a second cooling airflow toward a rotational-axis direction Y. In this case, the second fan 206 is disposed such that the rotational-axis direction Y crosses the rotational-axis direction X of the first fan 205.

During the charging of the battery pack 3, the first ventilating opening 222a and the second ventilating opening 223a serve as inlets which take the air into the case 202.

In the side face 224 of the case 202, a plurality of discharging windows are formed in a predetermined area, as an outlet 224a. By driving the first fan 205 and the second fan 206, the first cooling airflow and the second cooling airflow are discharged out of the case 202 through the outlet 224a.

The charge circuit portion 204 has a configuration in which components, such as a diode 241, a transformer 242, an FET 243, a temperature detecting element 244, and the charge control portion 45, are mounted on a board 240; and charges the battery pack 3 via the terminals 270, by using electric power supplied from, for example, a commercial alternating-current power supply. When a large amount of current per unit time flows in the charge circuit portion 204 for quick charging, the diode 241, the transformer 242, and the FET 243 are apt to produce heat, and become so-called heat-producing elements. To protect these components from heat and facilitate them to dissipate heat, radiation members 246 and 247 are respectively attached to the diode 241 and the FET 243, for example.

The diode 241, the transformer 242, and the FET 243 are disposed in the vicinity of the outlet 224a, and directly exposed to the first cooling airflow and the second cooling airflow which are discharged out of the case 202 from the outlet 224a.

The case 202 has the opening 271 in the top face 221; and has the first ventilating opening 222a, the second ventilating opening 223a, and the outlet 224a in the side faces. The air flow in the case 202 is formed mainly between the opening 271 and the first fan 205 and the second fan 206, and between the outlet 224a and the first ventilating opening 222a and the second ventilating opening 223a. The radiation members 246 and 247 form an air passage, in particular, between the outlet 224a and the first ventilating opening 222a and the second ventilating opening 223a. The radiation members 246 and 247 are shaped and positioned in the case 202 such that the air passage contains at least one, preferably all, of the diode 241, the transformer 242, and the FET 243. The diode 241 and the FET 243 are attached to the radiation members 246 and 247 so that the first cooling airflow and the second cooling airflow cool the diode 241 and the FET 243 in the case 202.

The temperature detecting element 244 may be a thermistor, and detects the temperature of the interior of the case 202.

The charge control portion 45 controls charging of the battery pack 3 performed by the charge circuit portion 204, and controls rotation of the first fan 205 and the second fan 206, while monitoring the temperature of the battery pack 3.

Figure 30:
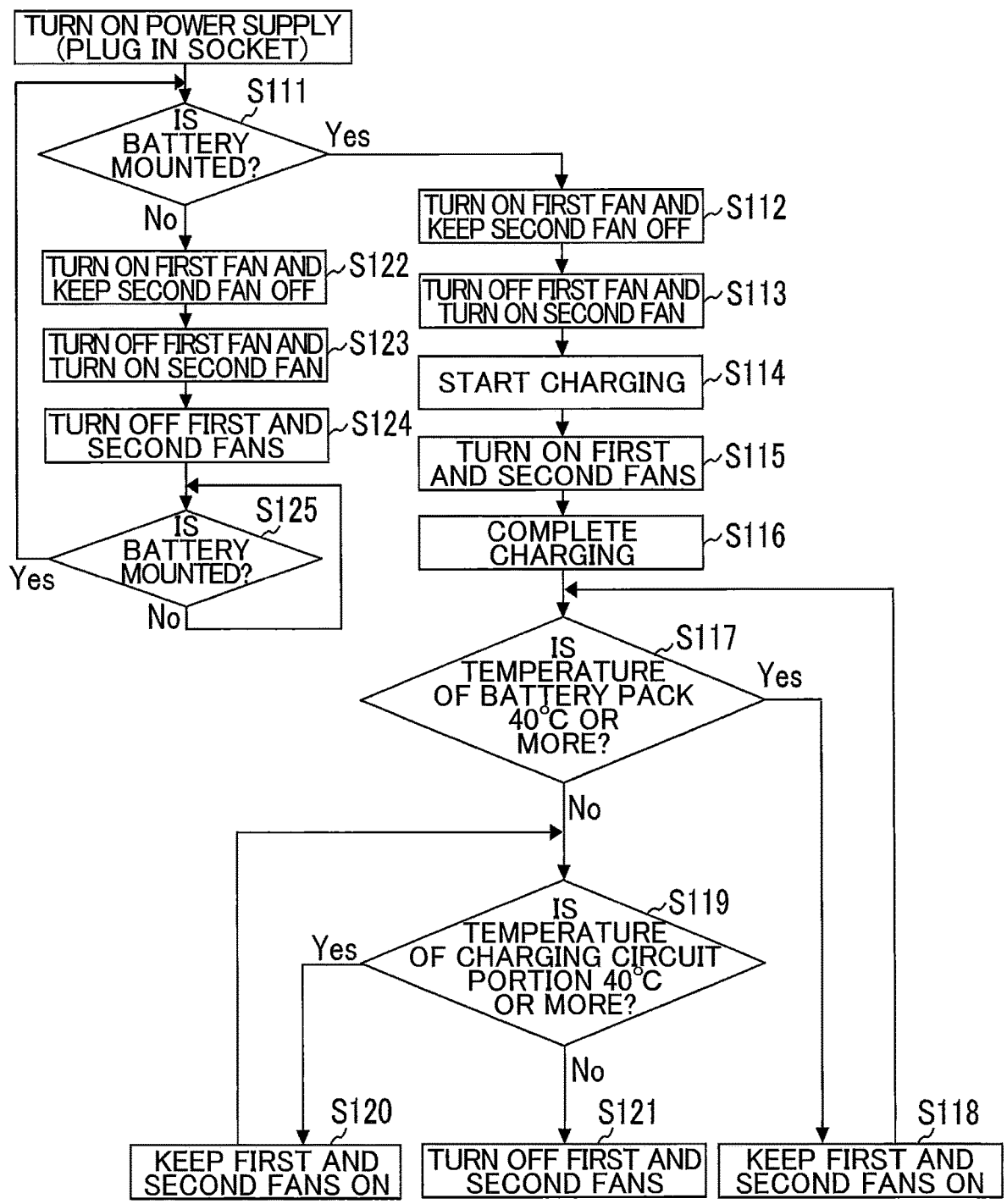
FIG. 30 Flowchart showing a first charging operation of the charging apparatus according to the third embodiment of the present invention.

Next, a first operation of the charging apparatus 200 will be described with reference to FIG. 30.

Figure 31:
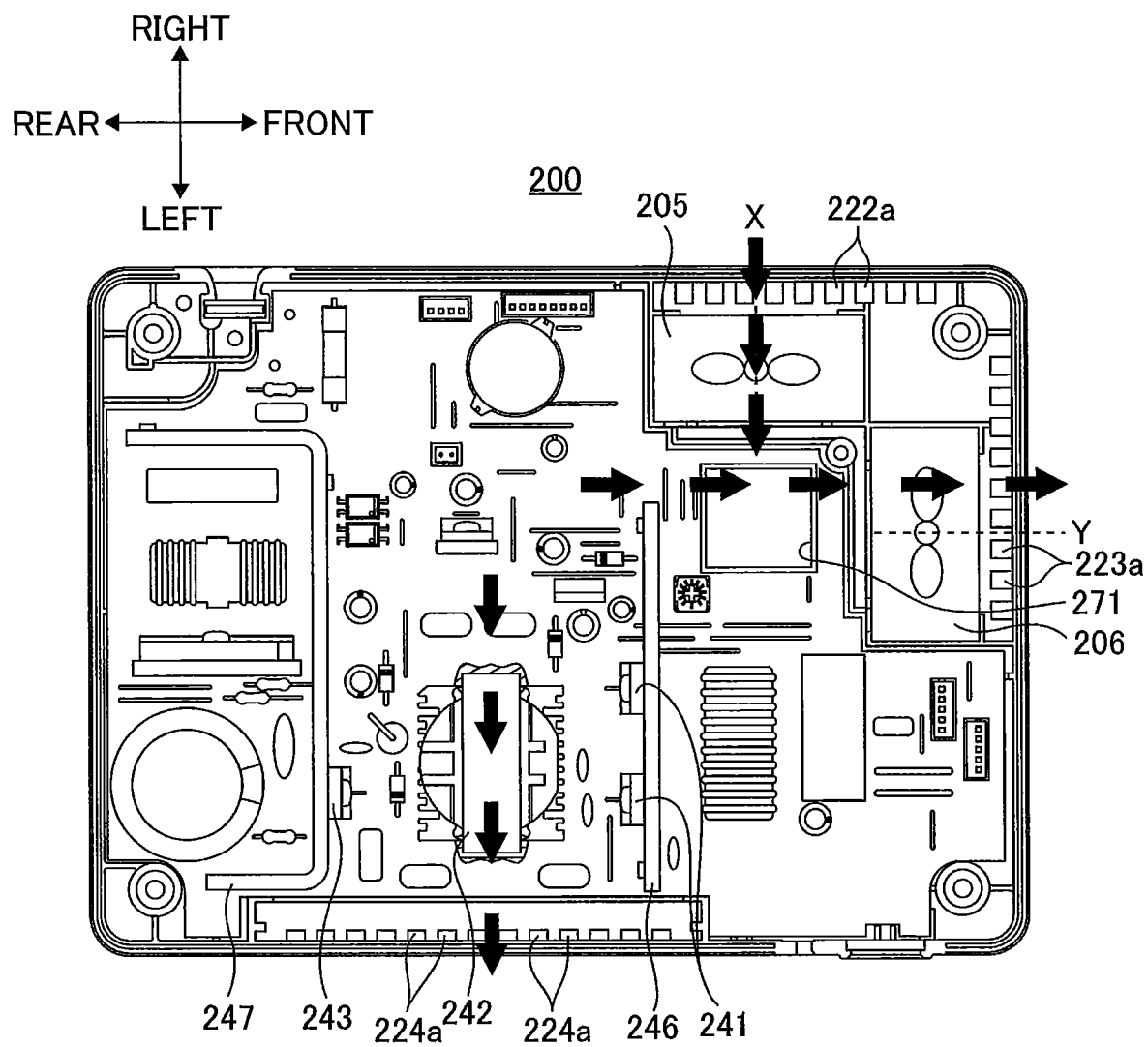
FIG. 31 View explaining a first cooling airflow generated in the charging apparatus when driving only the first fan.

When the charging apparatus 200 is connected to, for example, a commercial power supply, the charge control portion 45 determines, in S111, whether the battery pack 3 is attached to the battery attachment portion 207. If the battery pack 3 is attached (S111:Yes), then the process turns on the first fan 205 and drives it, and keeps an off-state of the second fan 206, for five seconds in S112. As illustrated in FIG. 31, when the first fan 205 is driven and the second fan 206 is turned off, the air introduced from the first ventilating opening 222a in the case 202 flows, as a first cooling airflow, from the first fan 205 toward the second ventilating opening 223a and the outlet 224a. The first cooling airflow toward the second ventilating opening 223a is discharged out of the case 202 from the second ventilating opening 223a, and blows off the dust which is stuck on the second ventilating opening 223a, out of the case 202.

Figure 32:
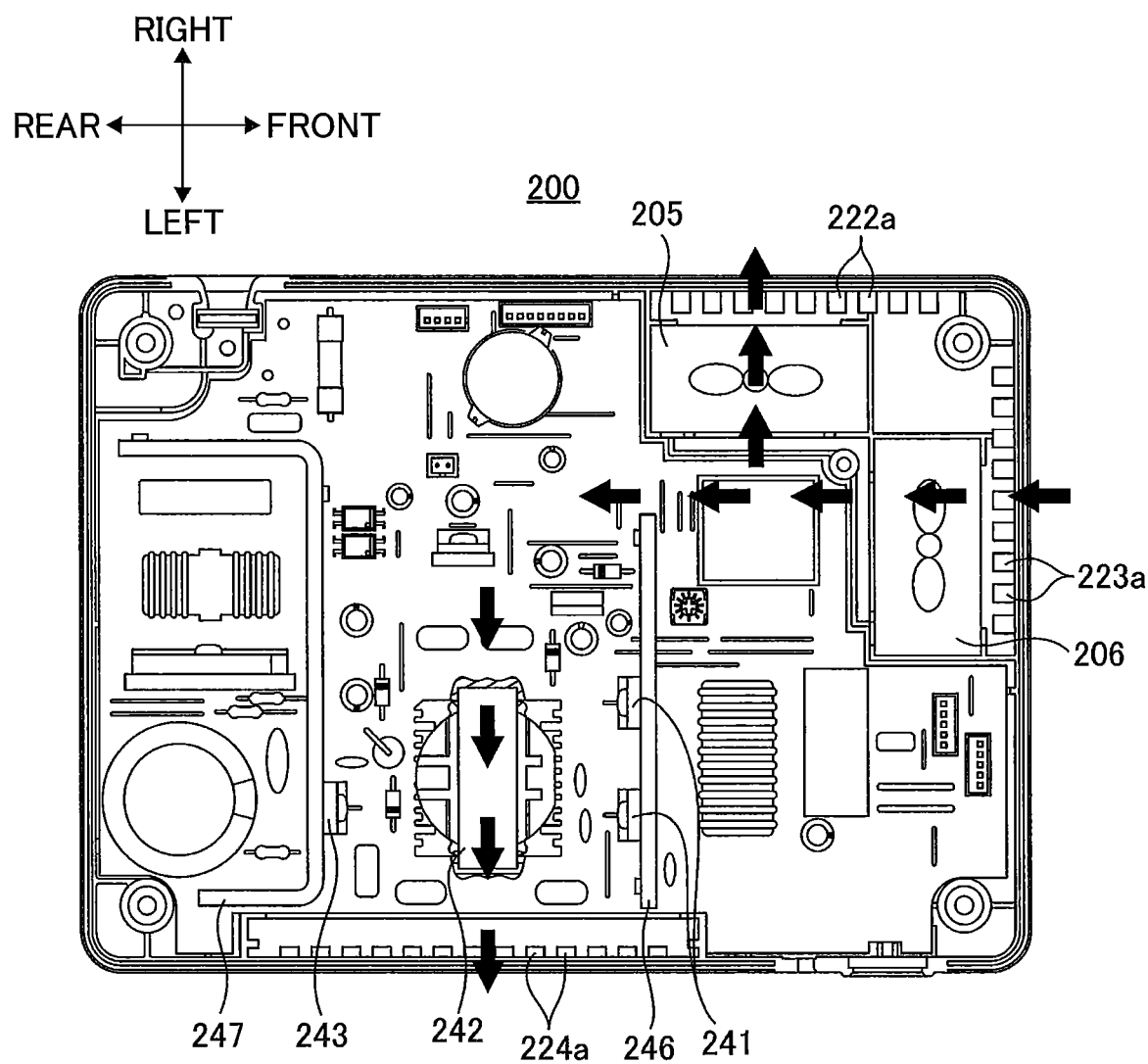
FIG. 32 View explaining a second cooling airflow generated in the charging apparatus when driving only the second fan.

The process then proceeds to S113. In S113, the process turns off the first fan 205 and stops it, and turns on the second fan 206 and drives it, for five seconds. As illustrated in FIG. 32, when the first fan 205 is turned off and the second fan 206 is driven, the air introduced from the second ventilating opening 223a in the case 202 flows, as a second cooling airflow, from the second fan 206 toward the first ventilating opening 222a and the outlet 224a. The second cooling airflow toward the first ventilating opening 222a is discharged out of the case 202 from the first ventilating opening 222a, and blows off the dust which is stuck on the first ventilating opening 222a, out of the case 202.

Although the time period in S112 and S113 is five seconds in the present embodiment, it is not limited to five seconds, and may be a time having an appropriate length.

Figure 33:
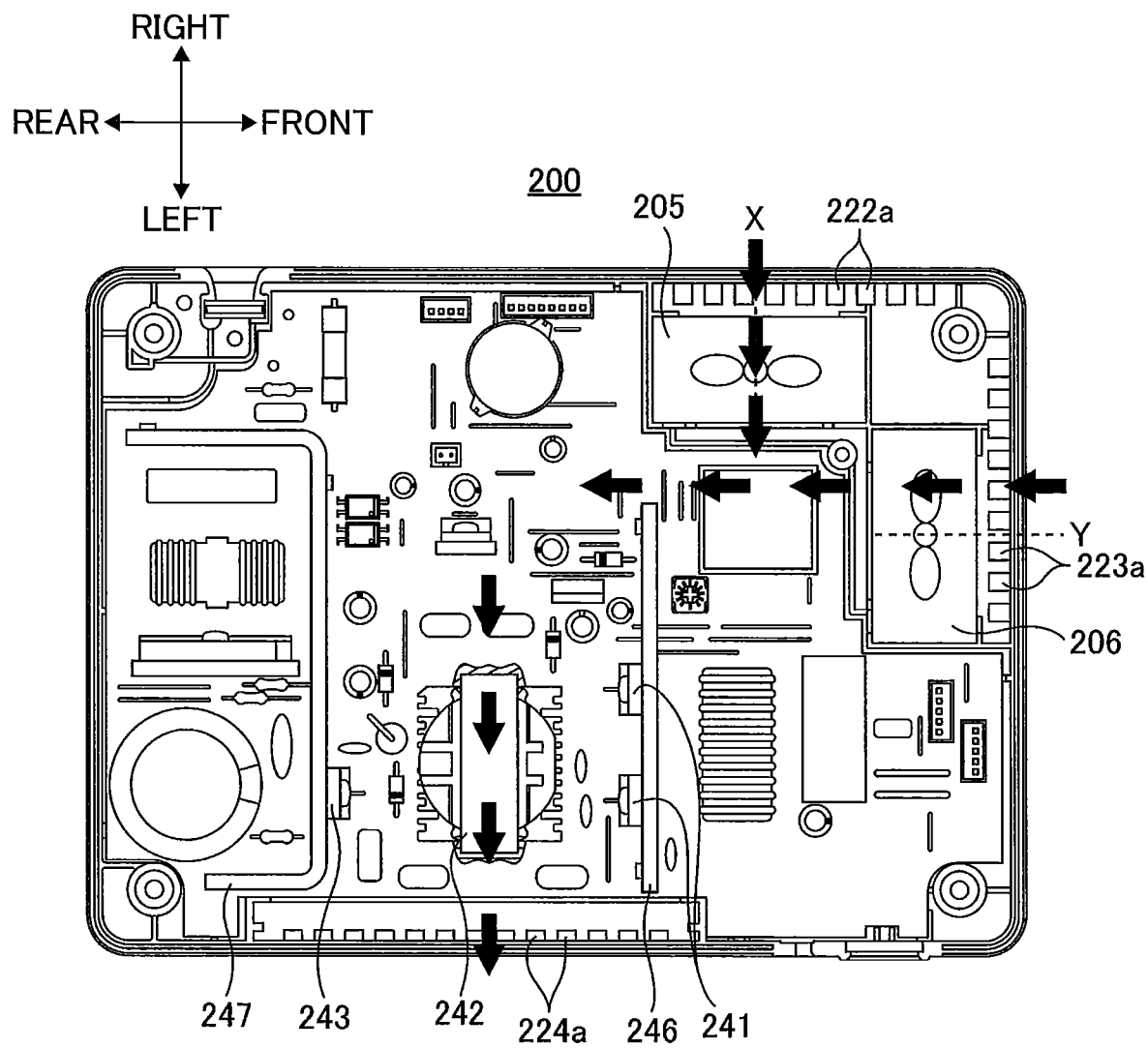
FIG. 33 Plan view illustrating the first and second cooling airflow generated in the case when the charging apparatus shown in FIG. 29 charges the battery pack.

Next, the process proceeds to S114. The process starts the charging of the battery pack 3 in S114, and turns on both the first fan 205 and the second fan 206 in S115. Since the first fan 205 and the second fan 206 generate the first cooling airflow and the second cooling airflow as illustrated in FIG. 33, the air is introduced into the case 202 through the first and second ventilating opening 222a and 223a, and thus an air passage toward the outlet 224a is formed. Also, another air passage is formed from the first and second ventilating opening 222a and 223a toward the opening 271.

When the charging of the battery pack 3 is completed in S116, the charge control portion 45 determines, in S117, whether the temperature of the battery pack 3 is 40 degrees or more. If the temperature of the battery pack 3 is 40 degrees or more (S117:Yes), then the process keeps the driving of the first fan 205 and the second fan 206 (S118) to keep the cooling of the battery pack 3.

If the temperature of the battery pack 3 is less than 40 degrees (S117:No), then the process determines whether the temperature of the charge circuit portion 204 is 40 degrees or more (S119). If the temperature of the charge circuit portion 204 is 40 degrees or more (S119:Yes), then the process keeps the driving of the first fan 205 and the second fan 206 (S120) to keep the cooling of the charge circuit portion 204. If the temperature of the charge circuit portion 204 is less than 40 degrees (S119:No), the process stops the driving of the first fan 205 and the second fan 206 (S121).

On the other hand, if the battery pack 3 is not attached (S111:No), then the process turns on the first fan 205 and drives it, and keeps the off-state of the second fan 206, for five seconds in S122. As illustrated in FIG. 31, when the first fan 205 is driven and the second fan 206 is turned off, the air introduced in from the first ventilating opening 222a in the case 202 flows, as the first cooling airflow, from the first fan 205 toward the second ventilating opening 223a and the outlet 224a. The first cooling airflow toward the second ventilating opening 223a is discharged out of the case 202 from the second ventilating opening 223a, and blows off the dust which is stuck on the second ventilating opening 223a, out of the case 202.

The process then proceeds to S123. In S123, the process turns off the first fan 205 and stops it, and turns on the second fan 206 and drives it, for five seconds. As illustrated in FIG. 32, when the first fan 205 is turned off and the second fan 206 is driven, the air introduced from the second ventilating opening 223a in the case 202 flows, as the second cooling airflow, from the second fan 206 toward the first ventilating opening 222a and the outlet 224a. The second cooling airflow toward the first ventilating opening 222a is discharged out of the case 202 from the first ventilating opening 222a, and blows off the dust which is stuck on the first ventilating opening 222a, out of the case 202.

Although the time period in S122 and S123 is five seconds in the present embodiment, it is not limited to five seconds, and may be a time period having an appropriate length.

The process then proceeds to S124, and stops the first and second fans 205 and 206. The process then proceeds to S125, and the charging apparatus 200 waits in S125 until the battery pack 3 is attached.

In the charging apparatus 200 of the second embodiment, since the first ventilating opening 222a and the second ventilating opening 223a of the case 202, which are used as inlets during the charging of the battery pack 3, function as outlets in S113 and S112, which discharge the air out of the case 202, the dust which is stuck to the first ventilating opening 222a and the second ventilating opening 223a can be removed from the first ventilating opening 222a and the second ventilating opening 223a, by discharging the air.

The heat-producing elements such as the diode 241, the transformer 242, and the FET 243 are disposed in the vicinity of the outlet 224a. Since the first and second cooling airflows are converged at the outlet 224a so as to be discharged out of the case 202, the diode 241, the transformer 242, and the FET 243 are cooled by the relatively high volume of air, and thus can be efficiently cooled.

In addition, since the first fan 205 and the second fan 206 are disposed in the case 202 such that the flowing direction of the airflow generated by the first fan 205 and the flowing direction of the airflow generated by the second fan 206 cross each other, an area of the case 202 which is cooled by the first cooling airflow and the second cooling airflow can be larger. Thus, not only the battery pack 3 under the charging but also various electronic components, such as the heat-producing elements of the case 202 including the diode 241, the transformer 242, and the FET 243, can be appropriately cooled and prevented from generating heat.

Figure 34:
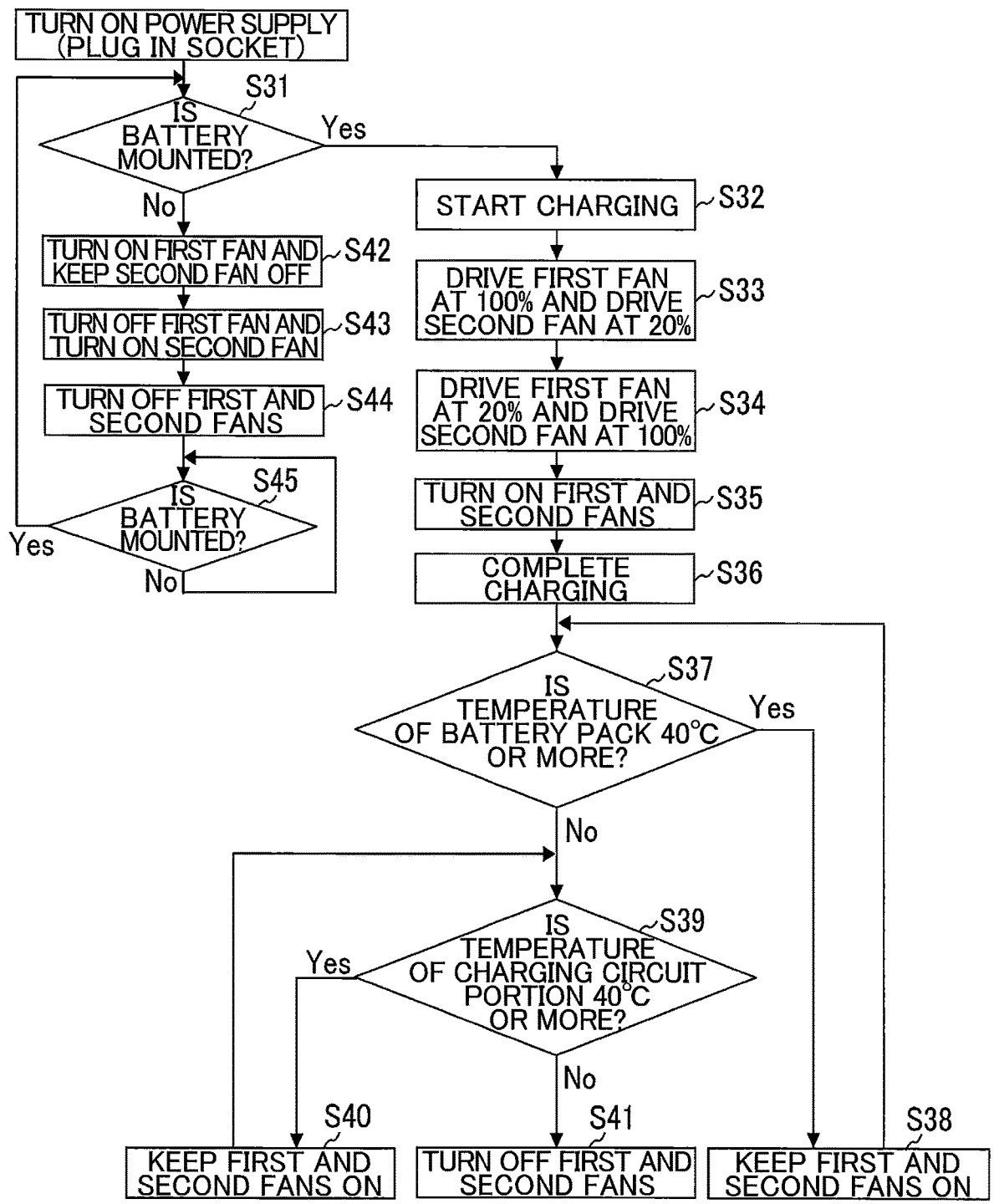
FIG. 34 Flowchart showing a second charging operation of the charging apparatus according to a third embodiment of the present invention.

Next, a second operation of the charging apparatus 200 will be described with reference to FIG. 34.

Figure 35:
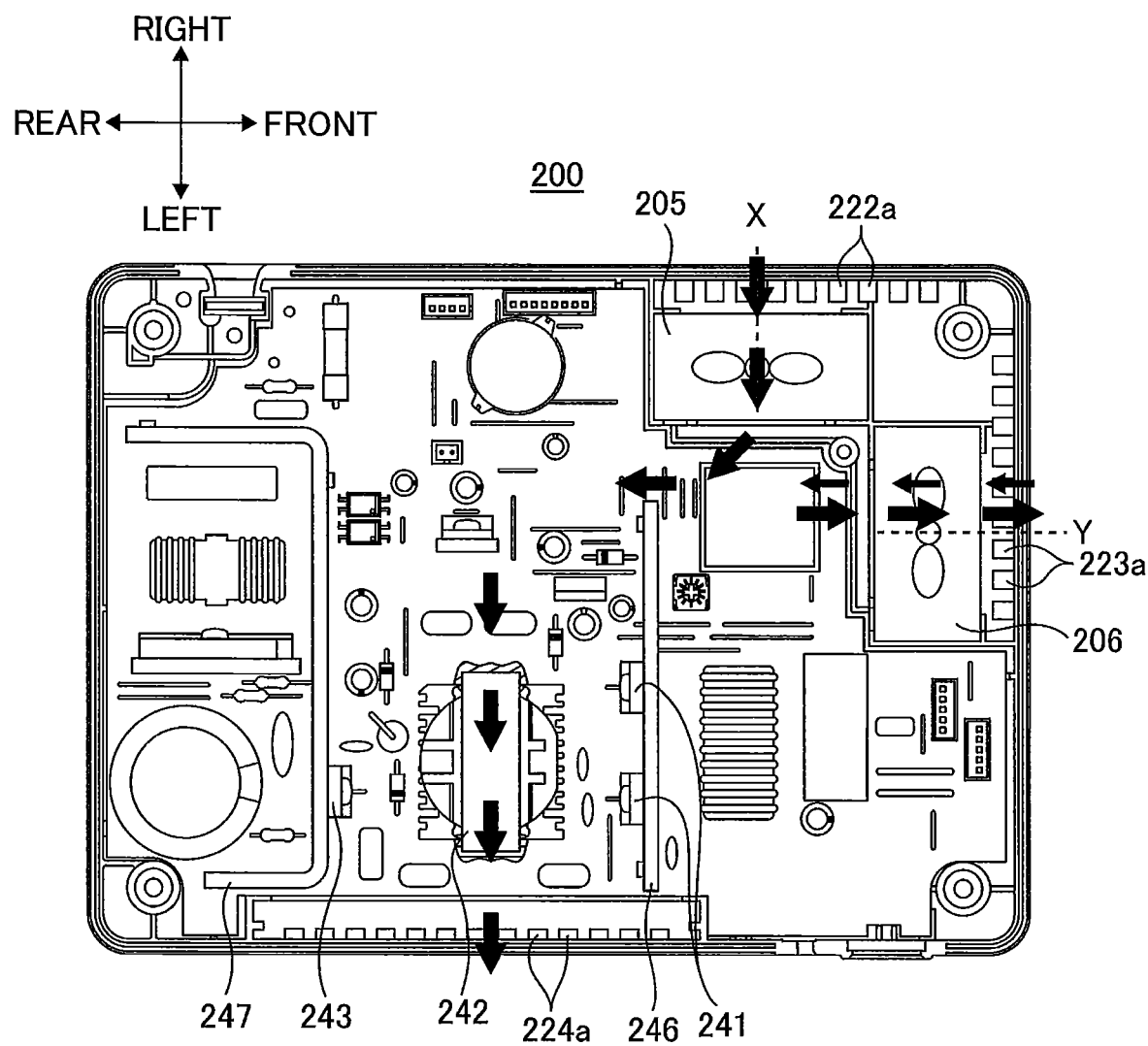
FIG. 35 View explaining a cooling airflow flowing in the case of the charging apparatus shown in FIG. 29 when the number of rotations of the first fan is greater than the number of rotations of the second fan.

When the charging apparatus 200 is connected to, for example, a commercial power supply, the process determines, in S31, whether the battery pack 3 is attached to the battery attachment portion 7. If the battery pack 3 is attached (S31:Yes), then the charge control portion 45 proceeds to S32, and starts the charging of the battery pack 3. At the same time, in S33, the process turns on the first fan 205 and starts the driving of the first fan 205 with the number of rotations of 100%, which is the same number of rotations used during the charging of the battery pack 3. In this time, the process also turns on the second fan 206, but drives the second fan 206 with the number of rotations of 20% for five seconds, with respect to the number of rotations of 100% used during the charging of the battery pack 3. During this time, as illustrated in FIG. 35, the air is introduced from the second ventilating opening 223a in the case 202 by driving the second fan 206, while the first cooling airflow generated by the first fan 205 is partly discharged out of the case 202 through the second ventilating opening 223a, because the number of rotations of the first fan 205 is larger than the number of rotations of the second fan 206. As a result, part of the first cooling airflow blows off the dust which is stuck to the second ventilating opening 223a, out of the case 202.

Figure 36:
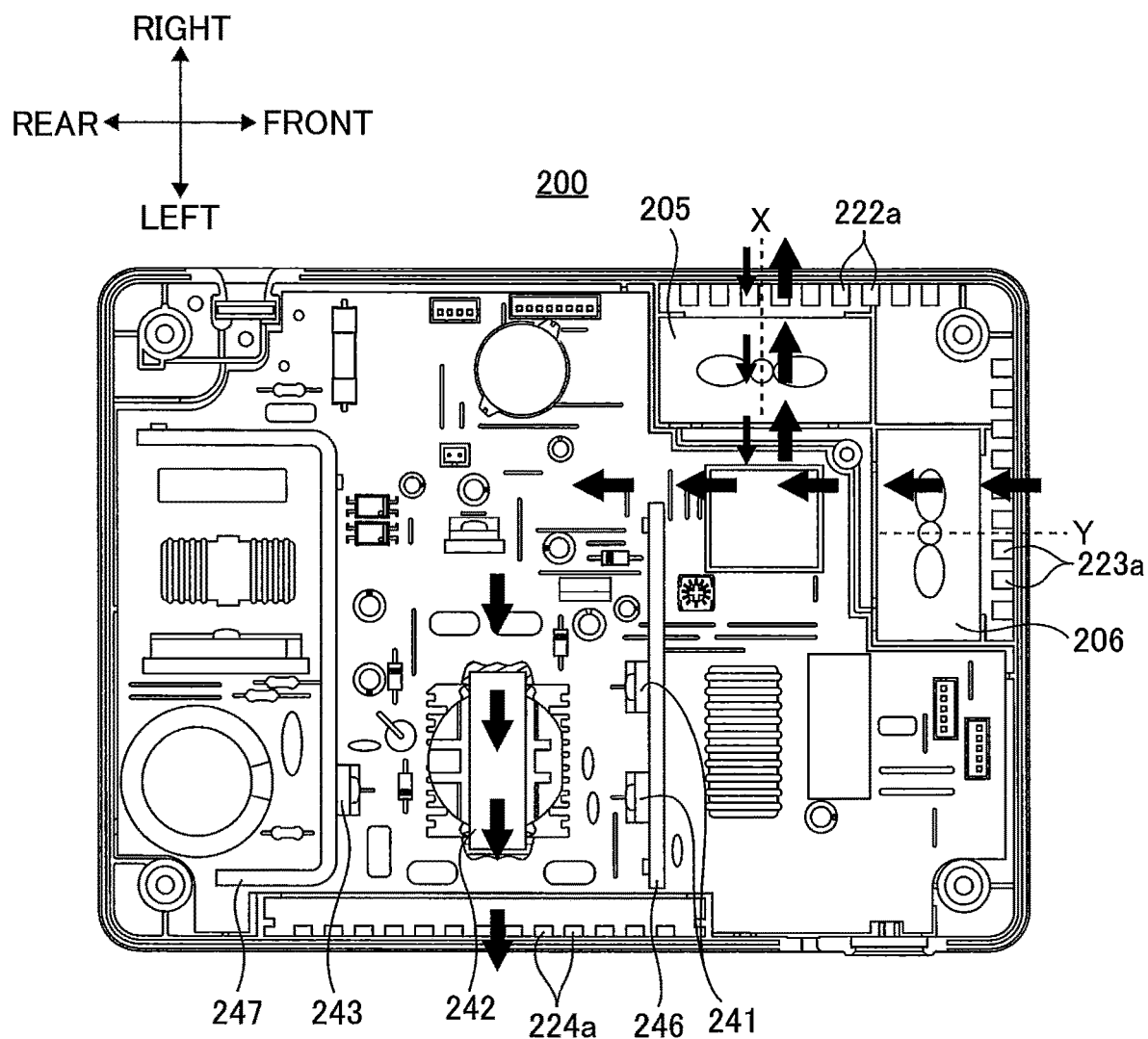
FIG. 36 View explaining a cooling airflow generated in the case of the charging apparatus shown in FIG. 29 when the number of rotations of the second fan is greater than the number of rotations of the first fan.

The process then proceeds to S34, and starts the driving of the second fan 206 with the number of rotations of 100%, which is the same number of rotations used during the charging of the battery pack 3. In this time, the process drives the first fan 205 with the number of rotations of 20% for five seconds, with respect to the number of rotations of 100% used during the charging of the battery pack 3. During this time, as illustrated in FIG. 36, the air is introduced from the first ventilating opening 222a in the case 202 by driving the first fan 205, while the second cooling airflow generated by the second fan 206 is partly discharged out of the case 202 through the first ventilating opening 222a, because the number of rotations of the second fan 206 is larger than the number of rotations of the first fan 205. As a result, part of the second cooling airflow blows off the dust which is stuck to the first ventilating opening 222a, out of the case 202.

Although the time period in S33 and S34 is five seconds in the present embodiment, it is not limited to five seconds, and may be a time period having an appropriate length. In addition, although the number of rotations of the second fan 206 in S33 and the number of rotations of the first fan 205 in S34 are 20%, they are not limited to 20%. Any appropriate percentage may be selected so that the cooling airflow can be discharged from the second ventilating opening 223a or the first ventilating opening 222a.

The process then proceeds to S35, and drives both the first fan 205 and the second fan 206 with the number of rotations of 100% to generate the first and second cooling airflows. The first and second cooling airflows cool not only the battery pack 3 under the charging, but also the heat-producing elements such as the diode 241, the transformer 242, and the FET 243 of the case 202, and thus protect the heat-producing elements from heat.

When the charging of the battery pack 3 is completed in S36, the charge control portion 45 determines, in S37, whether the temperature of the battery pack 3 is 40 degrees or more. If the temperature of the battery pack 3 is 40 degrees or more (S37:Yes), then the process keeps the driving of the first fan 205 and the second fan 206 (S38) to keep the cooling of the battery pack 3.

If the temperature of the battery pack 3 is less than 40 degrees (S37:No), then the process determines whether the temperature of the charge circuit portion 204 is 40 degrees or more (S39). If the temperature of the charge circuit portion 204 is 40 degrees or more (S39:Yes), then the process keeps the driving of the first fan 205 and the second fan 206 (S40) to keep the cooling of the charge circuit portion 204. If the temperature of the charge circuit portion 204 is less than 40 degrees (S39:No), the process stops the driving of the first fan 205 and the second fan 206 (S41).

On the other hand, if the battery pack 3 is not attached (S31:No), then the process turns on the first fan 205 and drives it, and keeps the off-state of the second fan 206, for five seconds in S42. When the first fan 205 is driven and the second fan 206 is turned off, the air introduced from the first ventilating opening 222a in the case 202 flows, as the first cooling airflow, from the first fan 205 toward the second ventilating opening 223a and the outlet 224a. The first cooling airflow toward the second ventilating opening 223a is discharged out of the case 202 from the second ventilating opening 223a, and blows off the dust which is stuck on the second ventilating opening 223a, out of the case 202.

The process then proceeds to S43. In S43, the process turns off the first fan 205 and stops it, and turns on the second fan 206 and drives it, for five seconds. When the first fan 205 is turned off and the second fan 206 is driven, the air introduced from the second ventilating opening 223a in the case 202 flows, as the second cooling airflow, from the second fan 206 toward the first ventilating opening 222a and the outlet 224a. The second cooling airflow toward the first ventilating opening 222a is discharged out of the case 202 from the first ventilating opening 222a, and blows off the dust which is stuck on the first ventilating opening 222a, out of the case 202.

The process then proceeds to S44, and stops the first and second fans 205 and 206. The process then proceeds to S45, and the charging apparatus 200 waits in S45 until the battery pack 3 is attached. When the attachment of the battery pack 3 is detected in S45, the process returns to S31.

In the second operation of the charging apparatus 200 of the second embodiment, at the same time when the charging of the battery pack 3 is started, the number of rotations of one of the first fan 205 and the second fan 206 is made larger than the number of rotations of the other. As a result, a cooling airflow generated by a fan having the larger number of rotations is discharged from a ventilating opening corresponding to a fan having the smaller number of rotations, and thereby the cooling airflow blows off the dust which is stuck to a ventilating opening corresponding to the fan having the smaller number of rotations, out of the case 202. Then, the numbers of rotations are exchanged between the first fan 205 and the second fan 206, and thereby the dust which is stuck to the other ventilating opening is blown off out of the case 202. Thus, the clogging of the first and second ventilating openings which occurs during the charging of the battery pack 3 can be eliminated.

The heat-producing elements such as the diode 241, the transformer 242, and the FET 243 are disposed in the vicinity of the outlet 224a. Since the first and second cooling airflows are converged at the outlet 224a so as to be discharged out of the case 202, the diode 241, the transformer 242, and the FET 243 are cooled by the relatively high volume of air, and thus can be efficiently cooled.

In addition, since the first fan 205 and the second fan 206 are disposed in the case 202 such that the flowing direction of the airflow generated by the first fan 205 and the flowing direction of the airflow generated by the second fan 206 cross each other, an area of the case 202 which is cooled by the first and second cooling airflows can be larger, compared to an arrangement in which the flowing direction of the airflow generated by the first fan 205 and the flowing direction of the airflow generated by the second fan 206 are parallel to each other. Thus, not only the battery pack 3 under the charging but also various electronic components, such as the heat-producing elements of the case 202 including the diode 241, the transformer 242, and the FET 243, can be appropriately cooled and prevented from generating heat.

In the present embodiment, the first ventilating opening 222a and the second ventilating opening 223a are separated from each other by the corner portion 226. In another embodiment, however, the first ventilating opening 222a and the second ventilating opening 223a are contiguous to each other along the side faces 222 and 223. Similarly, the first ventilating opening 222a and the second ventilating opening 223a are separated from each other by the corner portion 226. In another embodiment, however, the first ventilating opening 222a and the second ventilating opening 223a are contiguous to each other along the side faces 222 and 223.

The charging apparatus of the present invention may be variously modified within a spirit of the invention recited in the claim, without being limited to the above-described embodiments.

Figure 37:
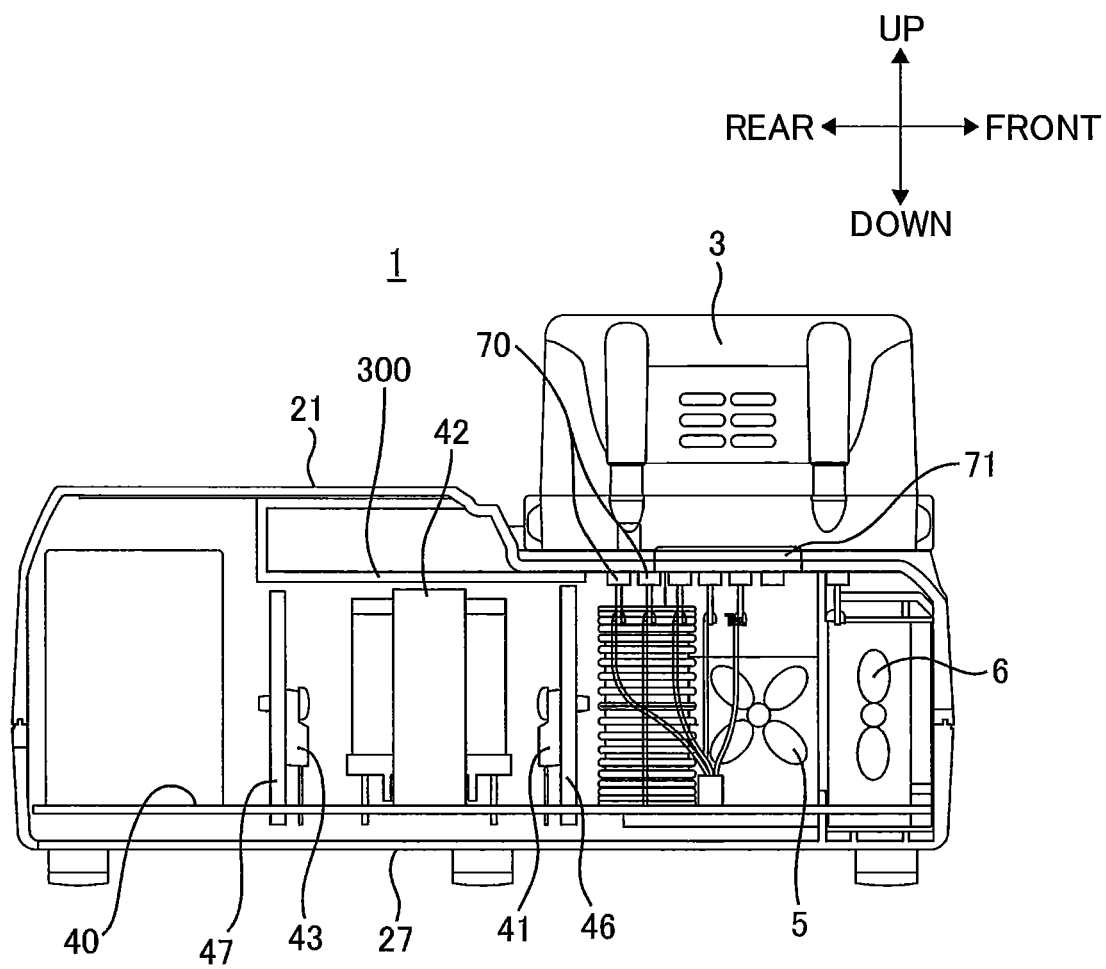
FIG. 37 Side sectional view showing the interior of the charging apparatus according to a fourth embodiment of the present invention.
Figure 38:
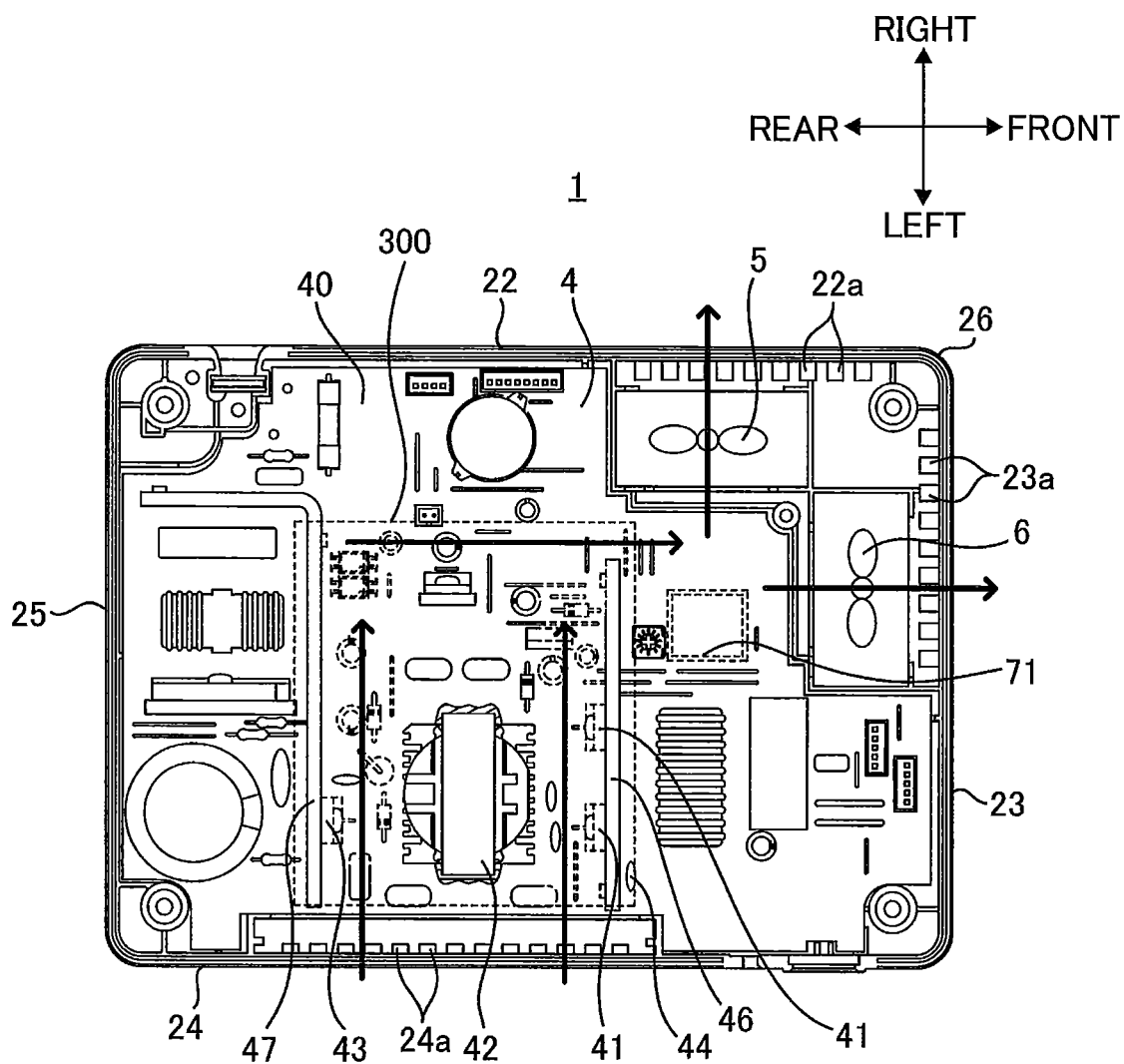
FIG. 38 Plan view of the charging apparatus shown in FIG. 37.

For example, the air passage of the cooling airflow may be formed as illustrated in FIGS. 37 and 38. In the charging apparatus 1 of a fourth embodiment, the air passage of the cooling airflow is formed by using the radiation members 46 and 47, and a plate 300 which is used in place of the radiation plate 80 of the first embodiment and which is integrally formed in the case 2. Since other configurations are the same as those of the first embodiment, the detailed description thereof is omitted.

The plate 300 defines an air passage of the air which is taken in from the inlet 24a and which serves as a cooling airflow, together with the radiation members 46 and 47; and guides the air toward the outlets 22a and 23a.

As illustrated in FIG. 37, the plate 300 is formed on an inner surface of the case 2 of the charging apparatus 1, on the top face side of the case 2, integrally with or separately from the case 2. In a case where the plate 300 is formed separately from the case 2, the plate 300 is fixed on the inner surface of the case 2 with, for example, screws (not illustrated). In a state where the charging apparatus 1 is assembled, the plate 300 is positioned over the heat-producing elements, such as the diode 41, the transformer 42, and the FET 43, so as to cover the heat-producing elements, that is, so as to cover the air passage formed by the radiation members 46 and 47; and has a size and a shape which are suitable for longitudinal portions of the radiation members 46 and 47. The plate 300 is disposed between the top face 21 of the case 2 and the components of the diode 41, the transformer 42, and the FET 43.

In the first embodiment, the space over the transformer 42 is opened. But in the present embodiment, the transformer 42 is covered by the plate 300. With this configuration, the cooling efficiency for the transformer 42 can be increased.

As illustrated in FIG. 38, when the fans 5 and 6 are driven, the cooling air passage is formed from the inlet 24a, via the air passage formed by the radiation members 46 and 47 and the plate 300, to the outlets 22a and 23a. The first cooling airflow and the second cooling airflow pass through the cooling air passage, and cool the heat-producing elements of the diode 41, the transformer 42, and the FET 43. Since the space over the heat-producing elements is covered by the plate 300, the cooling airflow passes through a surrounding space of the heat-producing elements with reliability, efficiently cooling the heat-producing elements and suppressing the temperature rise of the whole charging apparatus 1.

In the above-described embodiments, a plurality of (two) fans are provided to cool the battery pack and the heat-producing elements. However, the number of fans may be one, or three or more as long as a sufficient volume of air is produced to cool a battery pack having a nominal capacity of 5 Ah or more and the heat-producing elements when the battery pack is charged with a charging current of 2 C or more, or 10 A or more.

Figure 39:
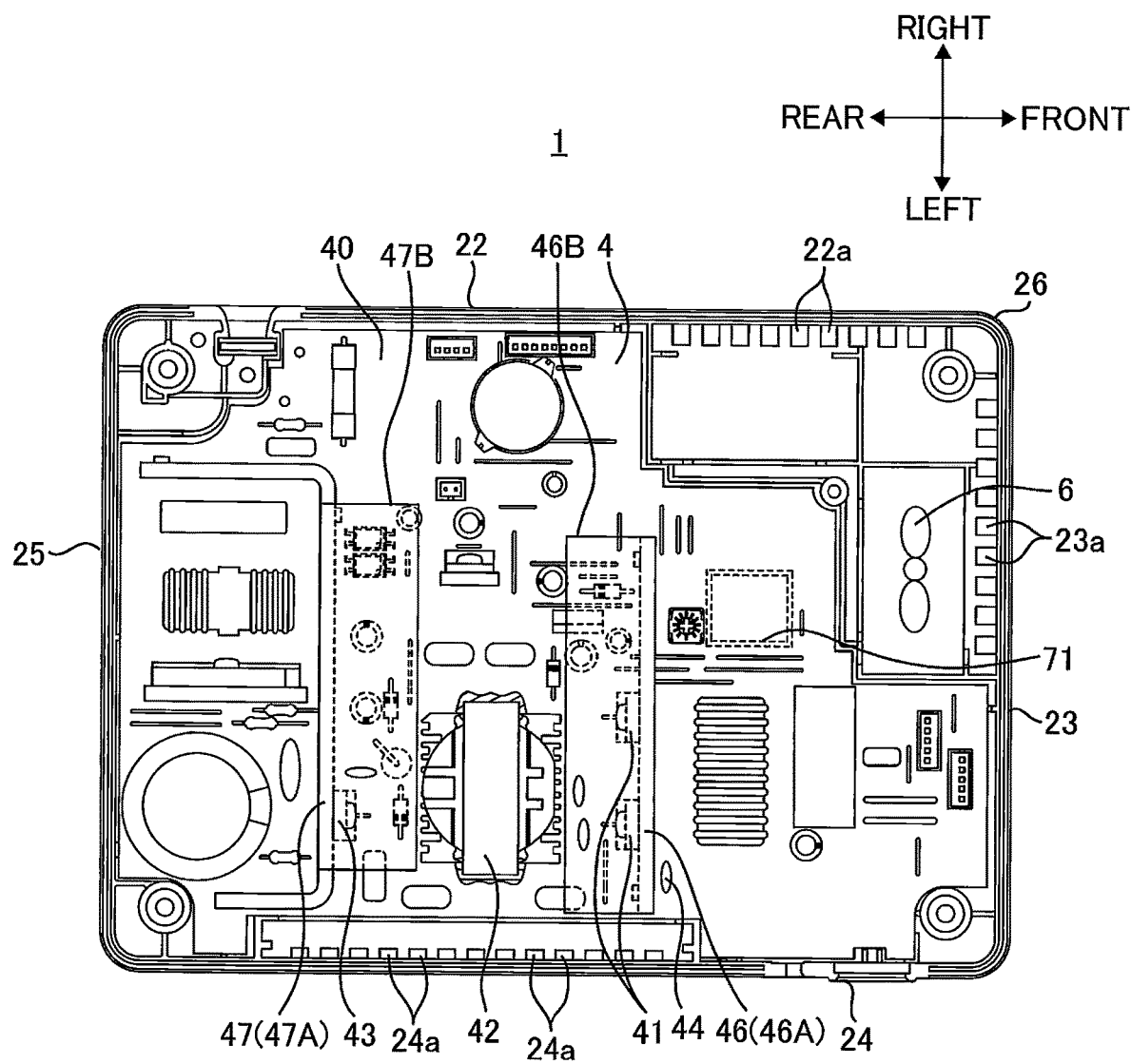
FIG. 39 Plan view of the charging apparatus according to a fifth embodiment of the present invention.

In a fifth embodiment, a single fan 6 is used as illustrated in FIG. 39. The fan may be placed in any position, such as a position of the fan 5 of FIG. 4, or positions of the fans 105 and 106 of FIGS. 27 and 28.

In a case where the battery pack is charged with a charging current of 10 A or more, the battery pack can be charged, with the heat-producing elements being suppressed from producing heat, by causing the single fan 6 to generate an airflow having a volume of air of 13.0 m^3/hr (13 cubic meters per hour) or more in the case 2, preferably, 13.5 m^3/hr or more. In this case, the wind pressure is preferably 0.0015 Pa or more. In another case, a plurality of fans may be provided as illustrated in FIG. 4, and generate an airflow having a volume of 13.0 m^3/hr or more in the case 2.

Thus, when the battery pack is charged with a charging current of 10 A or more, a single fan may be used as long as an airflow having a volume of 13 m^3/hr or more can be generated in the case 2.

The diode 41, the transformer 42, and the FET 43 are one example of the heat-producing elements of the present invention. The radiation members 46 and 47 are one example of air passage defining members of the present invention. The first radiation portions 46A and 47A are one example of first defining portions of the present invention. The second radiation portions 46B and 47B are one example of second defining portions of the present invention. The radiation plates 80 and 800 are one example of a plate-like member of an air passage defining member of the present invention. The ribs 81A, 82A, 83A, 84A, and 85A are one example of guide piece portions of the air passage defining members of the present invention.

REFERENCE SINGS LIST 1, 100, 200 . . . charging apparatus, 2, 102, 202 . . . case, 3, 33 . . . battery pack, 3a . . . battery cell, 3F . . . first breaking element, 4, 104, 204 . . . charging circuit portion, 5, 105, 205 . . . first fan, 6, 106, 206 . . . second fan, 7 . . . battery attachment portion, 22a, 122a . . . first outlet, 23a, 123a . . . second outlet, 222a . . . first vent, 223a . . . second vent, 33F . . . second breaking element, 41, 141, 241 . . . diode, 45 . . . charge control portion, 46, 47 . . . radiation member, 46A, 47A . . . first radiation portion, 46B, 47B . . . second radiation portion, 56 . . . current setting circuit, 57 . . . current control circuit, 70 . . . terminal

The invention claimed is:

1. A charging apparatus comprising;
a case having a bottom portion, an upper portion opposite to the bottom portion, and a side portion coupling the bottom portion and the upper portion;
a plurality of fans provided in the case, the plurality of fans being arranged along the side portion;
a charging circuit portion provided in the case and configured to charge a battery pack, the charging circuit having a plurality of heat-producing element elements that produce heat in connection with charging of the battery pack, the plurality of fans being configured to generate a cooling airflow for cooling the battery pack and the charging circuit portion; and
an air passage defining member defining a cooling air passage in the case, the cooling airflow passing through the cooling air passage, the air passage defining member comprising:
  a first defining portion extending in a first direction crossing the upper portion, the first direction being an upper-lower direction, and
  a second defining portion extending from the first defining portion in a second direction crossing the first direction, the second direction being a front-rear direction or a left-right direction, the second defining portion being positioned between the upper portion and at least one of the plurality of heat-producing elements in the first direction,
wherein the air passage defining member has a substantial L-shape of cross-section which crosses a traveling direction of the cooling airflow, and driving the fan causes the cooling airflow to be guided to the heat-producing elements, thereby cooling the heat-producing elements.

2. The charging apparatus according to claim 1, wherein the case comprises an inlet for introducing air into the case and an outlet for exhausting a cooling airflow outside the case, and
wherein the plurality of heat-producing elements include a transformer, the transformer being positioned in proximity to the inlet.

3. The charging apparatus according to claim 2,
wherein the transformer is positioned in the air passage defined by the air passage defining member.

4. The charging apparatus according to claim 1, wherein the air passage defining member is a radiation member attached to at least one of the heat-producing elements, and driving the fan causes the cooling airflow to flow along the radiation member.

5. A charging apparatus comprising:
a case comprising an inlet for introducing air into the case and an outlet for exhausting a cooling airflow to an outside of the case, the case having a bottom portion, and an upper portion opposed to the bottom portion, a battery pack being attachable to the case;
a fan configured to generate the cooling airflow in the case;
a charging circuit portion provided in the case and configured to charge the battery pack, the charging circuit portion having a plurality of heat-producing elements that produce heat in connection with charging of the battery pack; and
an air passage defining member defining a cooling air passage in the case, the cooling airflow passing through the cooling air passage, the air passage defining member comprising:
  a first defining portion extending in a first direction crossing the upper portion, the first direction being an upper-lower direction, and
  a second defining portion extending from the first defining portion in a second direction crossing the first direction, the second direction being a front-rear direction or a left-right direction, the second defining portion being positioned between the upper portion and at least one of the plurality of heat-producing elements in the first direction,
wherein the air passage defining member has a substantial L-shape of cross-section which crosses a traveling direction of the cooling airflow, and driving the fan causes the cooling airflow to be guided to the heat-producing elements, thereby cooling the heat-producing elements.

6. The charging apparatus according to claim 5, wherein the air passage defining member comprises a radiation member for dissipating heat of at least one of the plurality of heat-producing elements, the radiation member having the substantial L-shape of cross-section.

7. The charging apparatus according to claim 5, wherein the charging circuit portion comprises a circuit board on which the plurality of heat-producing elements are mounted,
the first defining portion stands from one of the circuit board and the upper portion toward the other of the circuit board and the upper portion, and
the cooling air passage is defined by the circuit board and the passage defining member.

8. The charging apparatus according to claim 5, wherein air passage defining member further comprises a plate-like portion extending in a space between the upper portion and at least one of the plurality of heat-producing elements, the plate-like member comprising:
  an opening formed on a position to a corresponding one of the plurality of heat-producing elements, the opening having a shape corresponding to an outer shape of the corresponding one of the plurality of heat-producing elements; and
  a guide piece portion extending from the vicinity of a periphery of the opening in a direction opposite to the upper portion to define a part of the cooling air passage with the corresponding one of the plurality of heat-producing elements,
wherein the cooling air passage is provided to communicate from the inlet to the outlet through a space between the corresponding one of the plurality of heat-producing elements and the guide piece portion and the opening.

9. The charging apparatus according to claim 5, wherein the plurality of heat-producing elements comprise at least one of a diode, a field-effect transistor, a transformer, and a coil, the heat-producing element being positioned in the vicinity of the inlet or the outlet.

10. The charging apparatus according to claim 5,
wherein the battery pack is able to be charged with a charging current which is larger than or equal to 10 A, and an air volume of the fan or an air volume generated by the fan in the case is larger than or equal to 13 m³/hr.

11. The charging apparatus according to claim 5, wherein the case has a side portion coupling the bottom portion and the upper portion,
wherein the side portion includes a first wall formed with the inlet, and a second wall formed with the outlet and extending from the first wall and intersecting with the first wall.

12. The charging apparatus according to claim 11, wherein the side portion further includes a third wall formed with the outlet and extending from the second wall and facing the first wall.

13. The charging apparatus according to claim 11, wherein the cooling airflow generated in the case flows in a fourth direction intersecting with a third direction after flowing in the third direction, so that the cooling airflow is exhausted outside of the case through the outlet.

14. The charging apparatus according to claim 5, wherein
the fan includes a plurality of fans, the plurality of fans being arranged along the side portion; and
the plurality of fans being configured to generate a cooling airflow for cooling the battery pack and the charging circuit portion.

15. The charging apparatus according to claim 14, wherein the case has a substantially cuboidal shape,
wherein the plurality of fans comprise a first fan and a second fan, the first fan and the second fan being positioned in proximity to a portion of the side portion,
wherein the first fan and the second fan are positioned in any one of the following manners:
(1) in which the first fan is positioned along a first side portion, and the second fan is positioned along a second side portion, the second side portion being connected to the first side portion through a corner portion;
(2) in which the first fan and the second fan are positioned along a same side portion, and
(3) in which the first fan is positioned along the first side portion, and the second fan is positioned along a third side portion opposed to the first portion.

16. The charging apparatus according to claim 15, wherein the case has an inlet through which air is introduced into the case, and an outlet through which the air is exhausted outside the case,
the first fan and the second fan are positioned in proximity to the outlet, and
the heat-producing element is positioned in proximity to the inlet.

17. The charging apparatus according to claim 15, wherein the case comprises an opening allowing air to be passed therethrough to cool the battery pack during a charging operation, and
the first fan and the second fan are positioned in proximity to the opening.

18. The charging apparatus according to claim 14, wherein the plurality of fans comprise a first fan and a second fan,
the case comprises a vent allowing air to pass therethrough, and an outlet through which the air is exhausted outside the case, and
the vent comprises a first vent to which the first fan is positioned in proximity and a second vent to which the second fan is positioned in proximity,
wherein by setting a number of rotations of the first fan larger than a number of rotations of the second fan, a first ventilation is performed in which a part of air introduced through the first vent is exhausted outside the case through the second vent, and
wherein the first fan and the second fan are configured to introduce air through the first vent and the second vent into the case during a charging operation by the charging circuit portion.

* * * * *